US 9,099,347 B2

(12) United States Patent
Yun et al.

(10) Patent No.: US 9,099,347 B2
(45) Date of Patent: Aug. 4, 2015

(54) THREE-DIMENSIONAL SEMICONDUCTOR MEMORY DEVICES AND METHOD OF FABRICATING THE SAME

(75) Inventors: Jang-Gn Yun, Hwaseong-si (KR);
Kwang Soo Seol, Yongin-si (KR);
Youngwoo Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 314 days.

(21) Appl. No.: 13/415,388

(22) Filed: Mar. 8, 2012

(65) Prior Publication Data

US 2012/0280299 A1    Nov. 8, 2012

(30) Foreign Application Priority Data

May 4, 2011    (KR) ........................ 10-2011-0042706

(51) Int. Cl.
*H01L 29/76* (2006.01)
*H01L 27/115* (2006.01)

(52) U.S. Cl.
CPC ...... *H01L 27/11582* (2013.01); *H01L 27/1157* (2013.01); *H01L 27/11573* (2013.01)

(58) Field of Classification Search
CPC ............................ H01L 27/115; H01L 29/685
USPC ............................................ 257/314, E29.17
See application file for complete search history.

(56) References Cited

U.S. PATENT DOCUMENTS

| | | | |
|---|---|---|---|
| 6,870,216 B2 | 3/2005 | Hsiao et al. | |
| 6,933,556 B2 | 8/2005 | Endoh et al. | |
| 7,382,018 B2 | 6/2008 | Kim et al. | |
| 7,539,056 B2 | 5/2009 | Katsumata et al. | |
| 8,445,954 B2 * | 5/2013 | Jang et al. | ..................... 257/329 |
| 8,541,832 B2 * | 9/2013 | Kim et al. | ..................... 257/324 |
| 2007/0158736 A1 | 7/2007 | Arai et al. | |
| 2007/0252201 A1 | 11/2007 | Kito et al. | |
| 2008/0067583 A1 | 3/2008 | Kidoh et al. | |
| 2009/0020744 A1 * | 1/2009 | Mizukami et al. | ................ 257/4 |
| 2009/0097309 A1 | 4/2009 | Mizukami et al. | |
| 2009/0242968 A1 | 10/2009 | Maeda et al. | |

(Continued)

FOREIGN PATENT DOCUMENTS

| | | |
|---|---|---|
| CN | 101409291 A | 4/2009 |
| JP | 2006-338602 | 12/1994 |

(Continued)

OTHER PUBLICATIONS

Fukuzumi et al., "Optimal Integration and Characteristics of Vertical Array Devices for Ultra-High Density, Bit-Cost Scalable Flash Memory," 2007 IEEE, pp. 449-452.

(Continued)

*Primary Examiner* — Fernando L Toledo
*Assistant Examiner* — Neil Prasad
(74) *Attorney, Agent, or Firm* — Myers Bigel Sibley & Sajovec, P.A.

(57) ABSTRACT

Provided are three-dimensional semiconductor memory devices and methods of fabricating the same. The device may include an electrode structure extending in a first direction and including electrodes and insulating patterns which are alternately and repeatedly stacked on a substrate, and vertical active patterns penetrating the electrode structure. At least an uppermost electrode of the electrodes is divided into a plurality of physically isolated segments arranged in the first direction. The segments of the uppermost electrode are electrically connected to each other.

15 Claims, 45 Drawing Sheets

(56) References Cited

U.S. PATENT DOCUMENTS

| | | | |
|---|---|---|---|
| 2009/0268524 | A1 | 10/2009 | Maejima |
| 2010/0109065 | A1* | 5/2010 | Oh et al. ............... 257/314 |
| 2010/0195395 | A1 | 8/2010 | Jeong et al. |
| 2011/0085377 | A1 | 4/2011 | Mizukami et al. |
| 2011/0156132 | A1* | 6/2011 | Kiyotoshi ............... 257/326 |
| 2011/0316069 | A1* | 12/2011 | Tanaka et al. ........... 257/324 |

FOREIGN PATENT DOCUMENTS

| | | |
|---|---|---|
| JP | 10-093038 | 4/1998 |
| JP | 2008-072051 | 3/2008 |
| JP | 2008-192708 | 8/2008 |
| JP | 2009-016400 | 1/2009 |
| KR | 1020060089547 A | 8/2006 |
| KR | 100707217 B1 | 4/2007 |
| KR | 1020070113535 A | 11/2007 |
| KR | 1020080070583 A | 7/2008 |
| KR | 1020090047614 A | 5/2009 |

OTHER PUBLICATIONS

Kim et al., "Future memory technology: challenges and opportunities," Symposium on VLSI-TSA Tech, 2008 IEEE, pp. 5-9.

Kim et al., "Novel Vertical-Stacked-Array-Transistor (VSAT) for ultra-high-density and cost-effective NAND Flash memory devices and SSD (Solid State Drive)," 2009 Symposium on VLSI Technology Digest of Technical Papers, pp. 186-187.

Tanaka et al., "Bit Cost Scalable Technology with Punch and Plug Process for Ultra High Density Flash Memory," 2007 Symposium on VLSI Technology Digest of Technical Papers, pp. 14-15.

Program from the 6$^{th}$ Semiconductor Memory Symposium, Feb. 25, 2008, 11:10-12:00pm, "Multi-Cell NAND-Based SSD Technology and its Trend," Toshiba Semiconductor Company, Memory Business Department, Assistant to Department Manager Shinji Saito, 8 pages.

Koga et al., "Influences of Buried-Oxide Interface on Inversion-Layer Mobility in Ultra-Thin SOI MOSFETs," IEEE Transactions on Electron Devices, vol. 49, No. 6, Jun. 2002, pp. 1042-1048.

\* cited by examiner

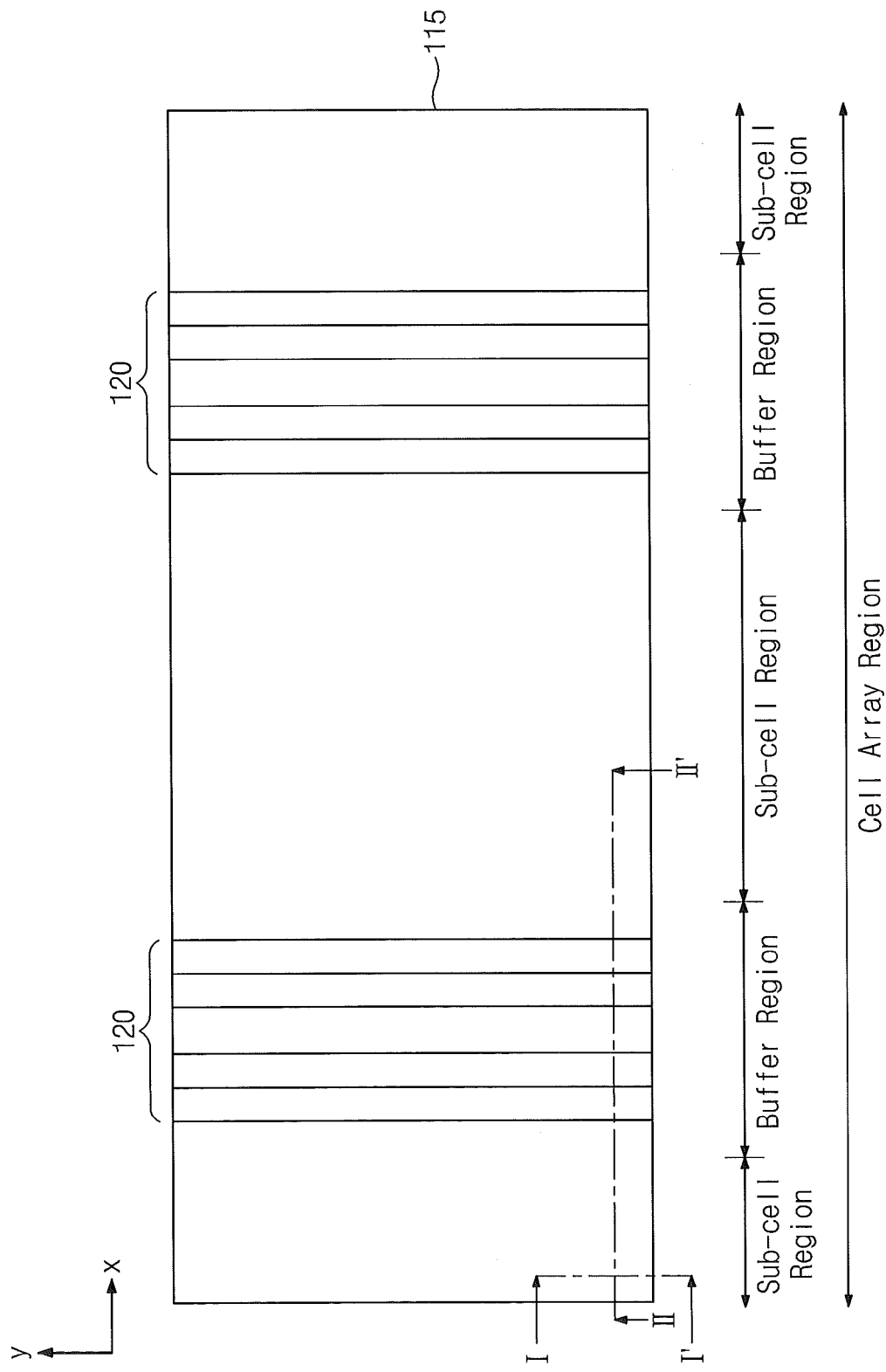

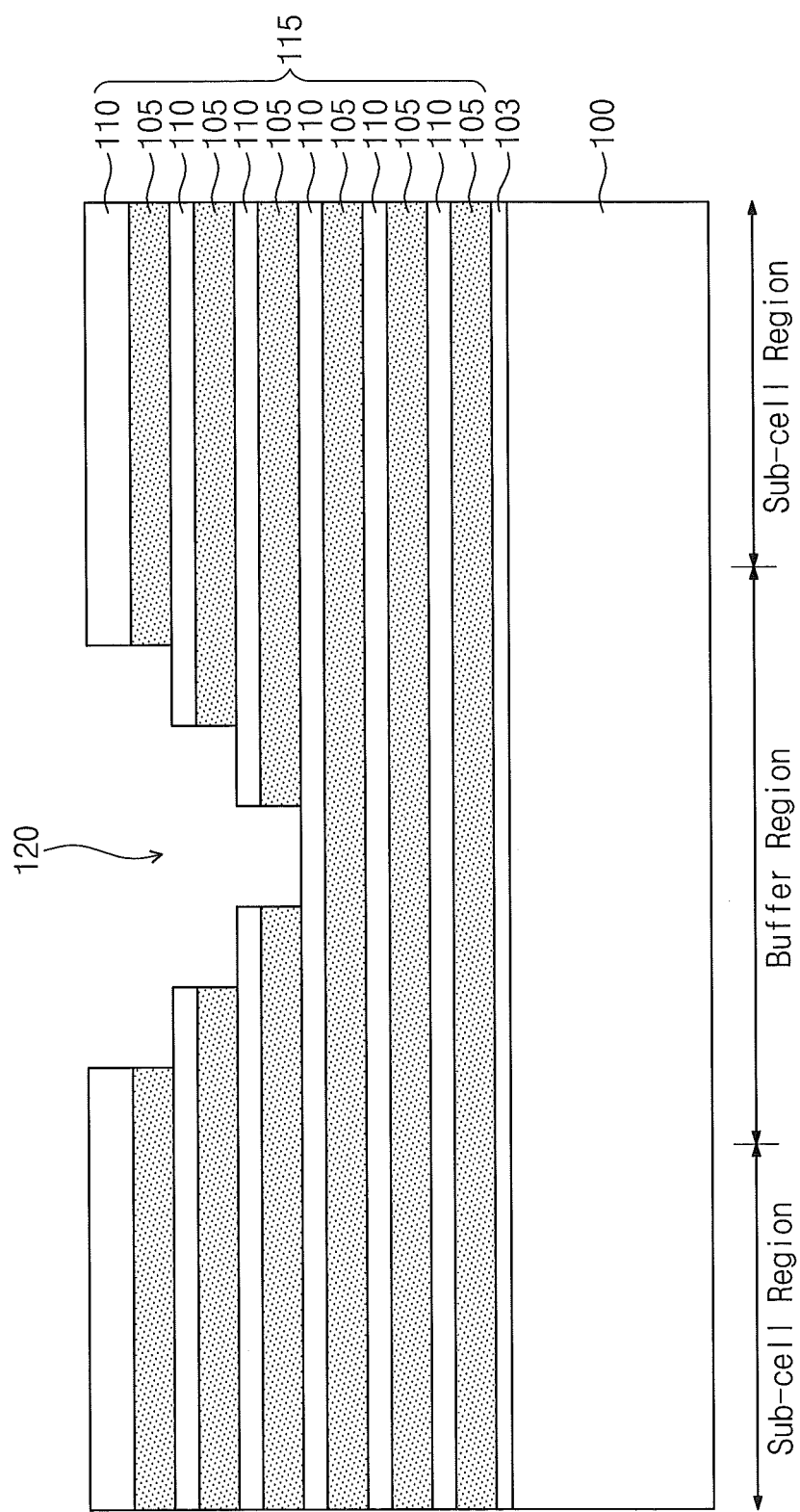

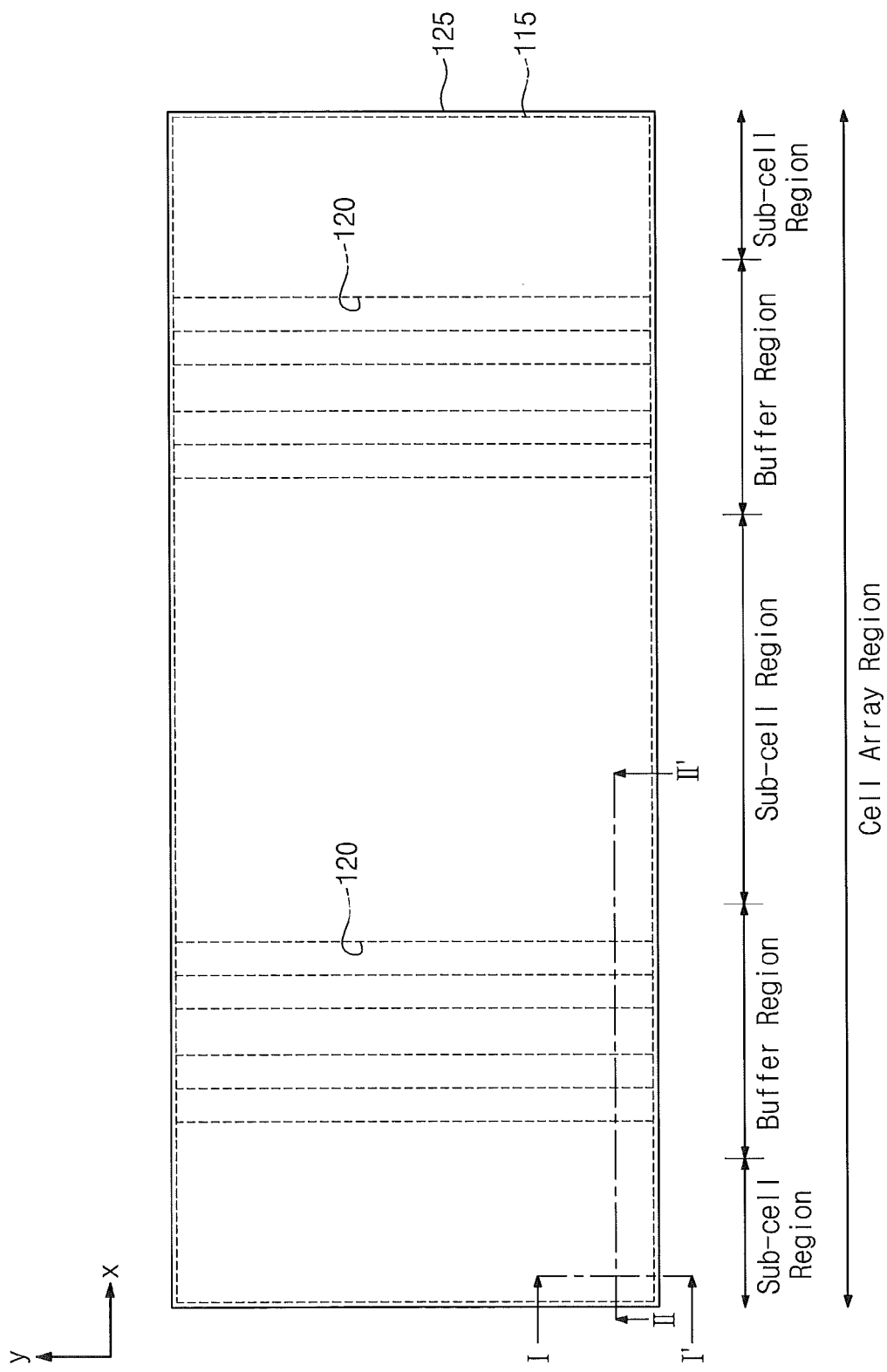

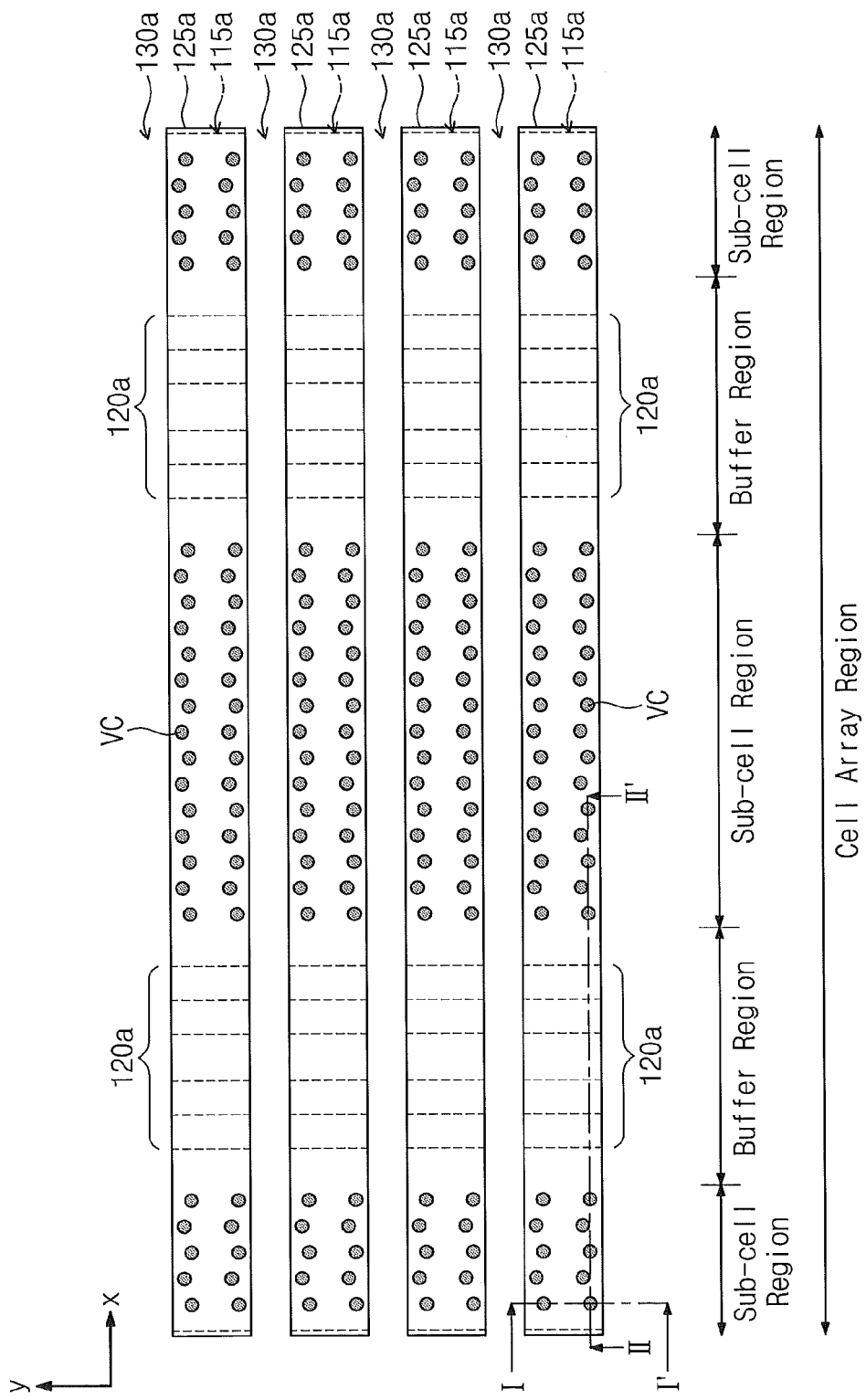

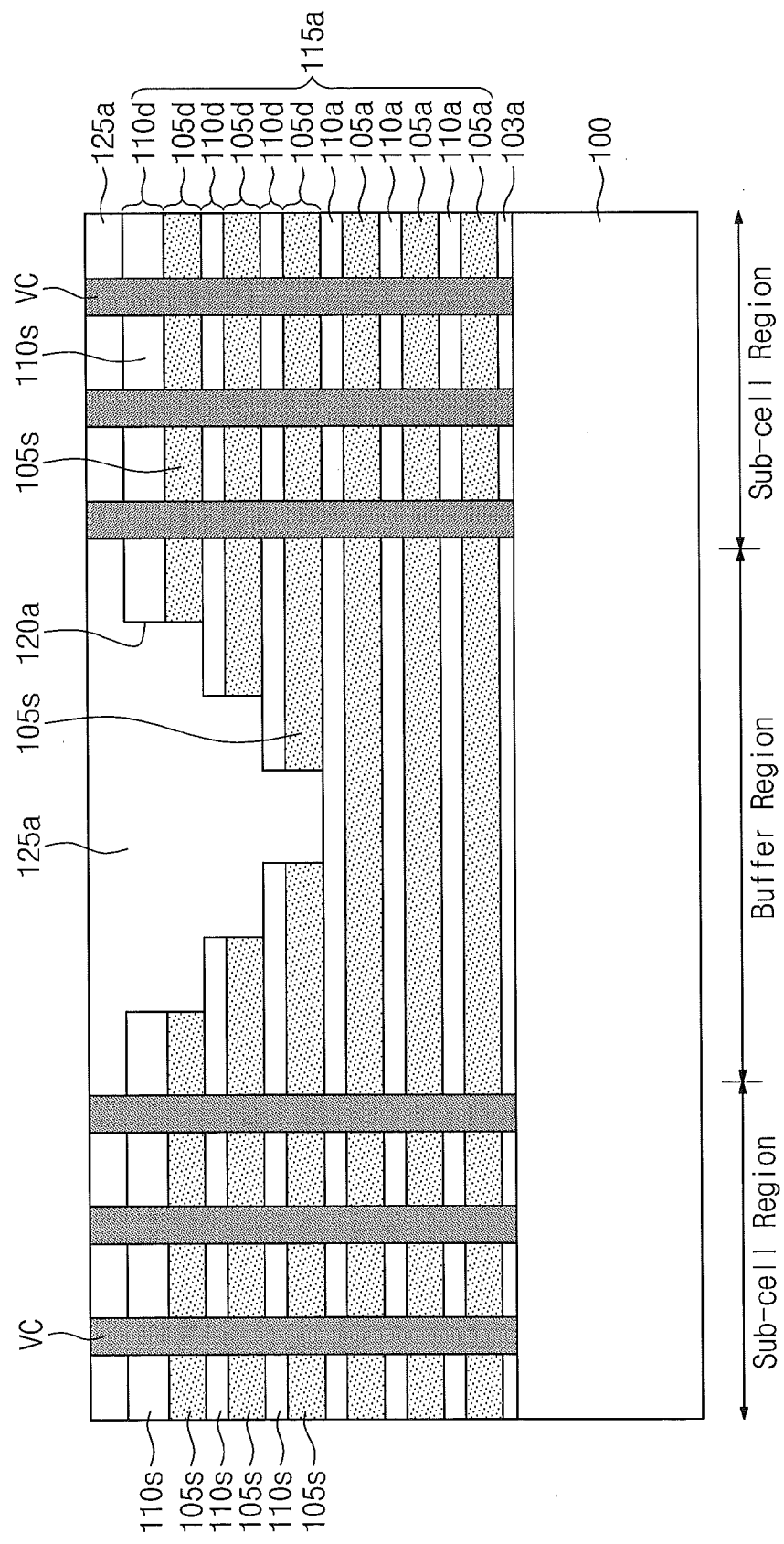

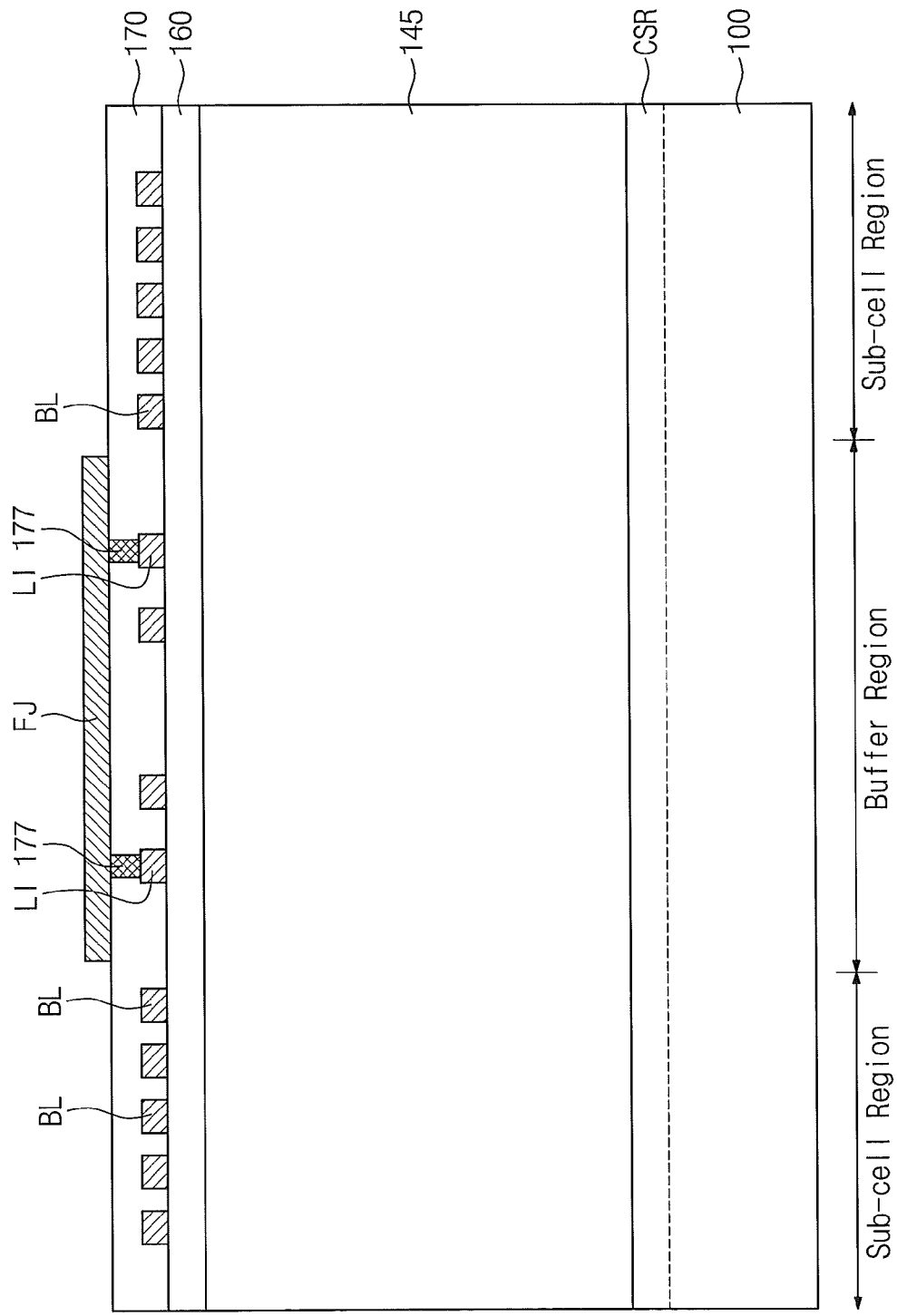

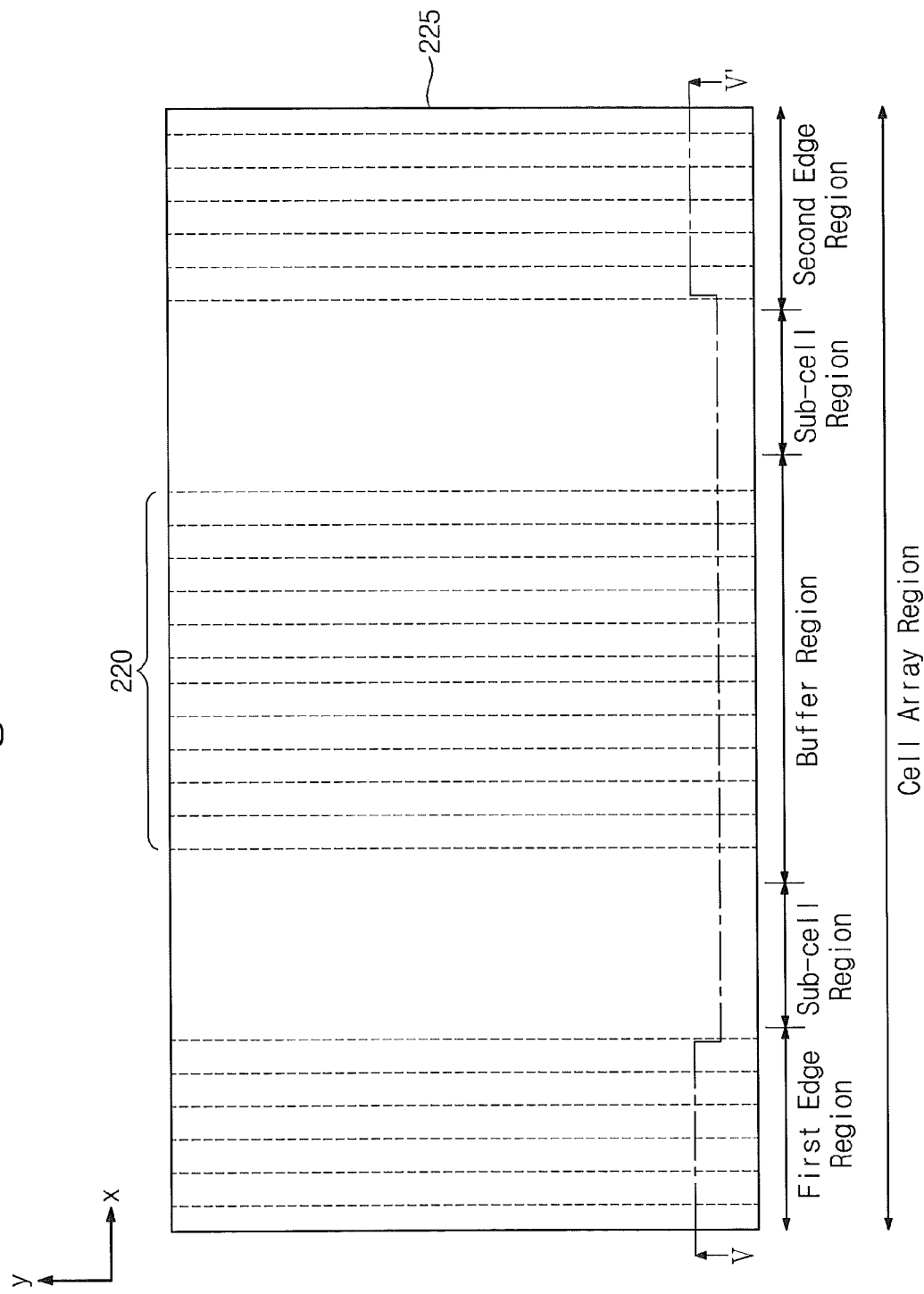

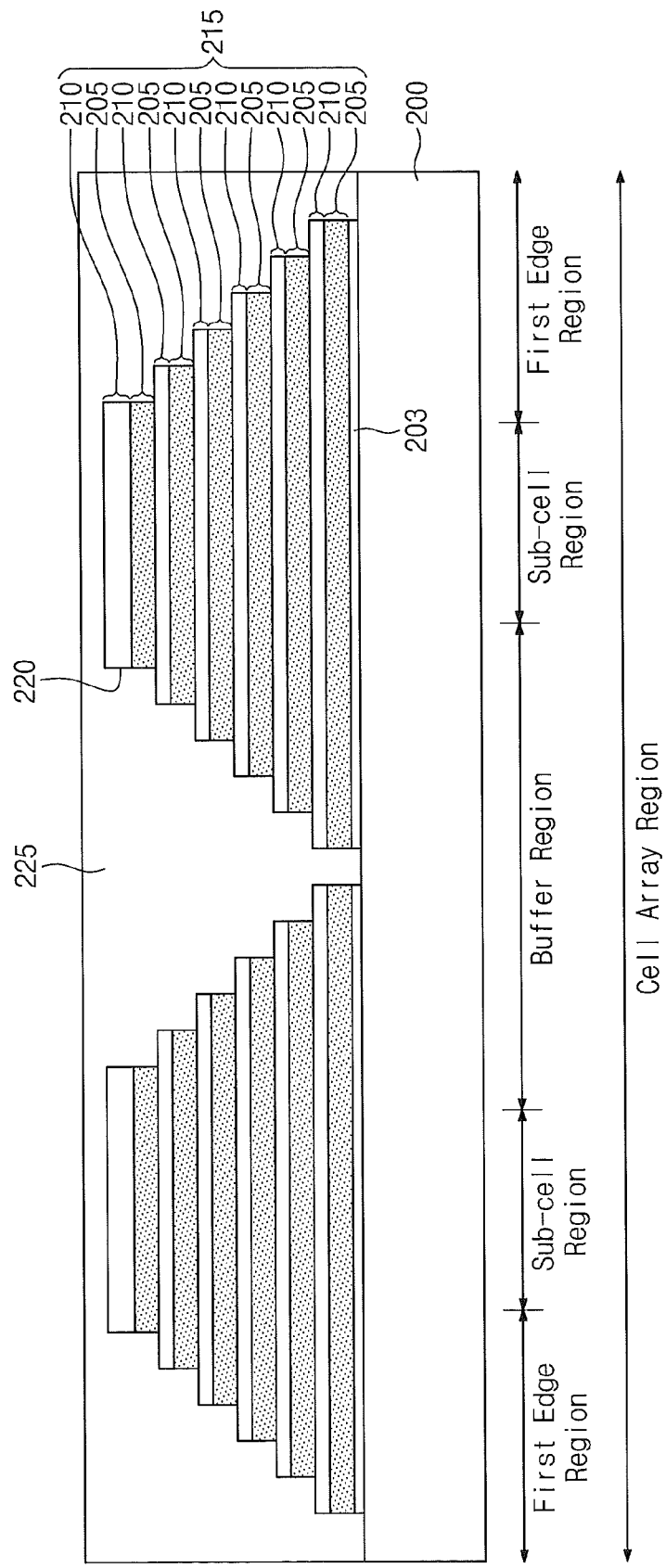

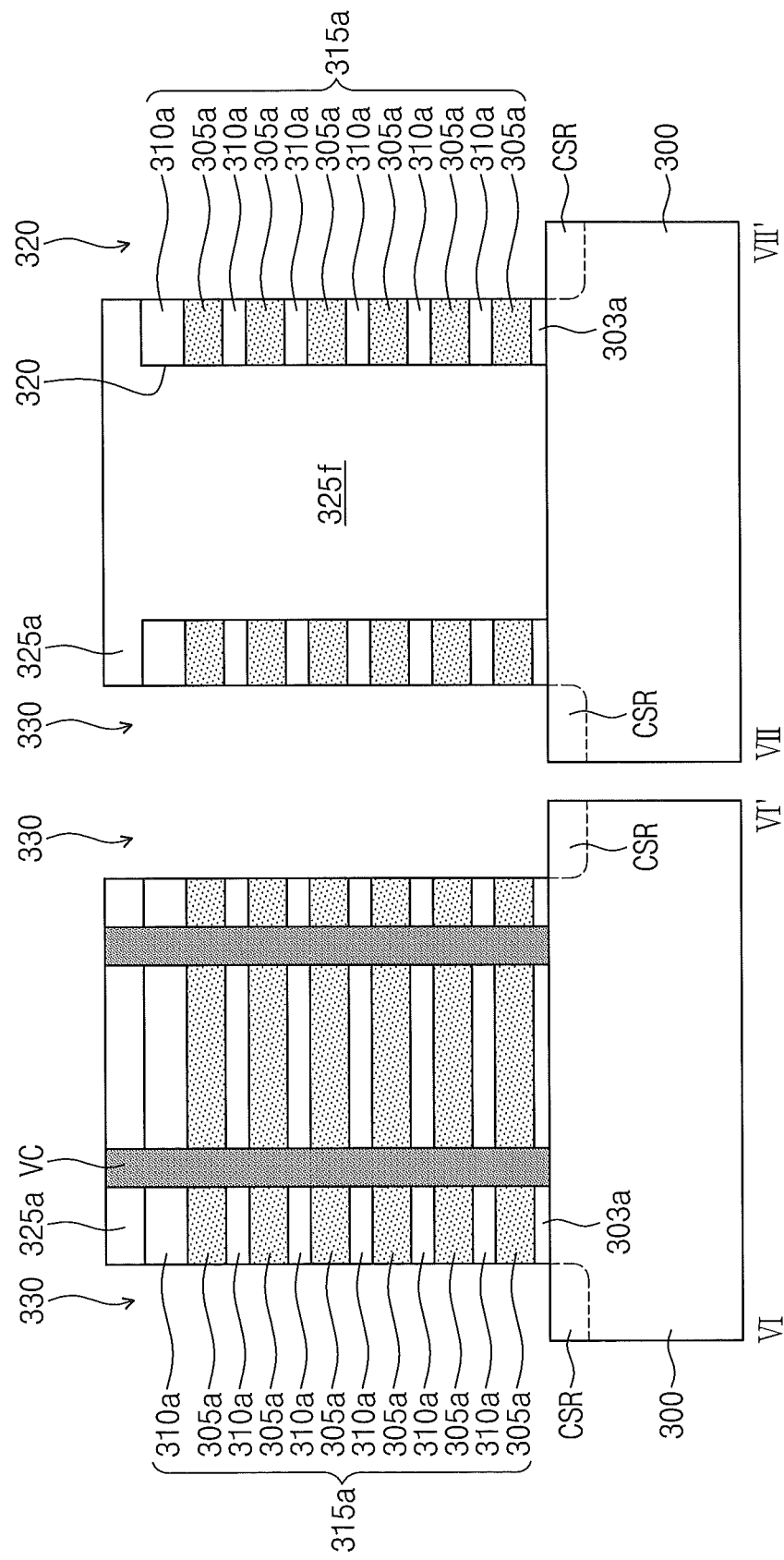

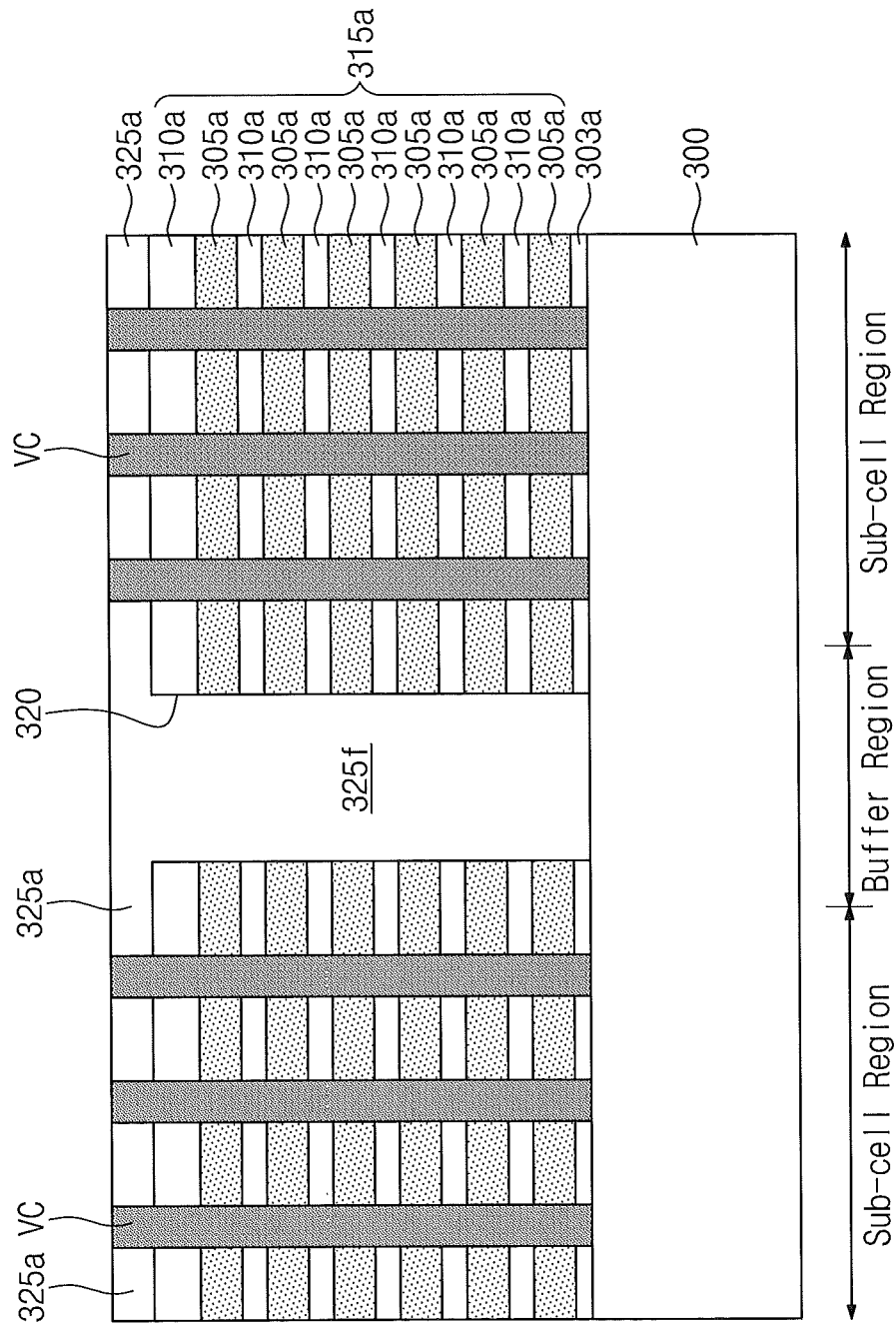

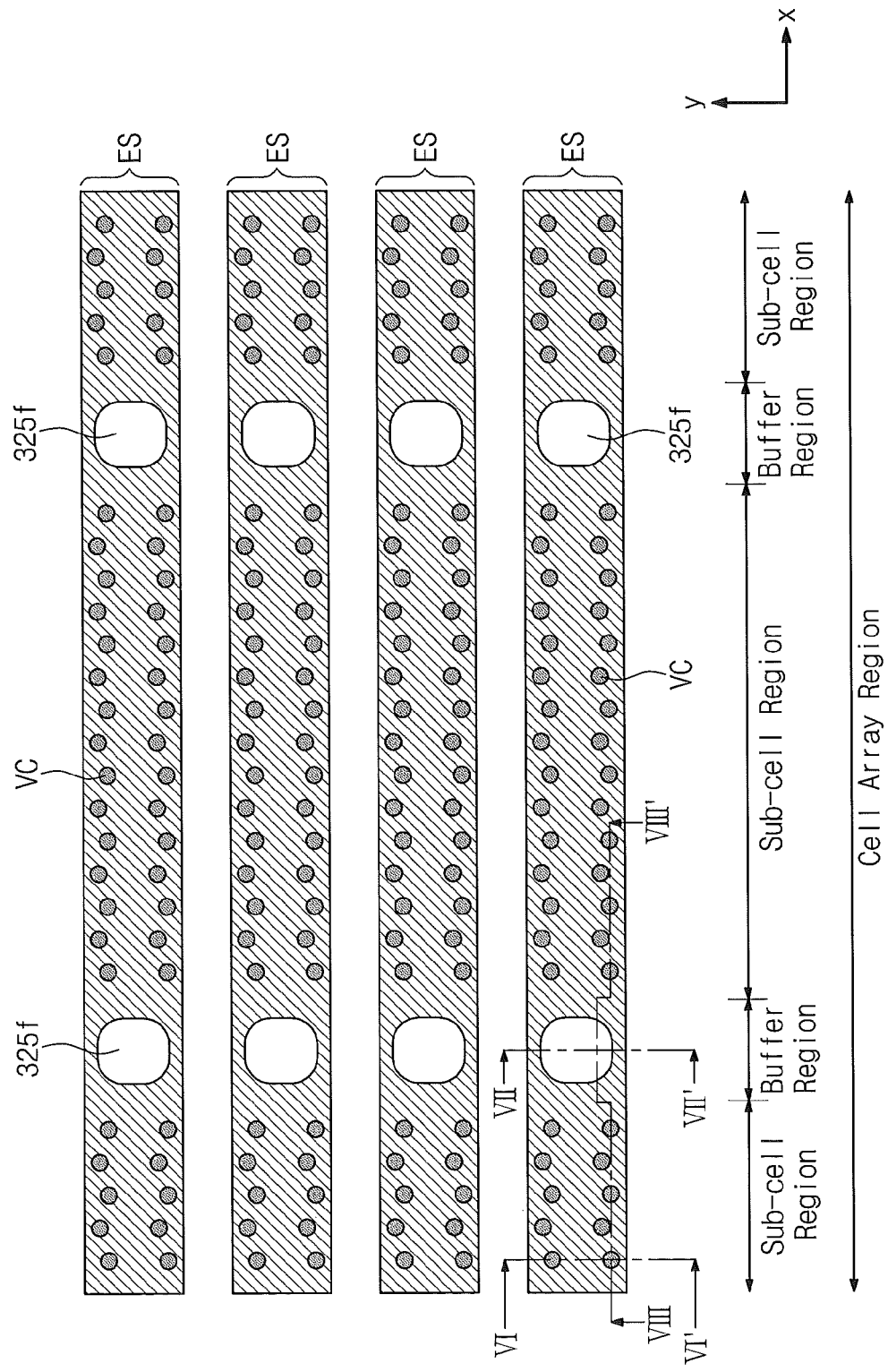

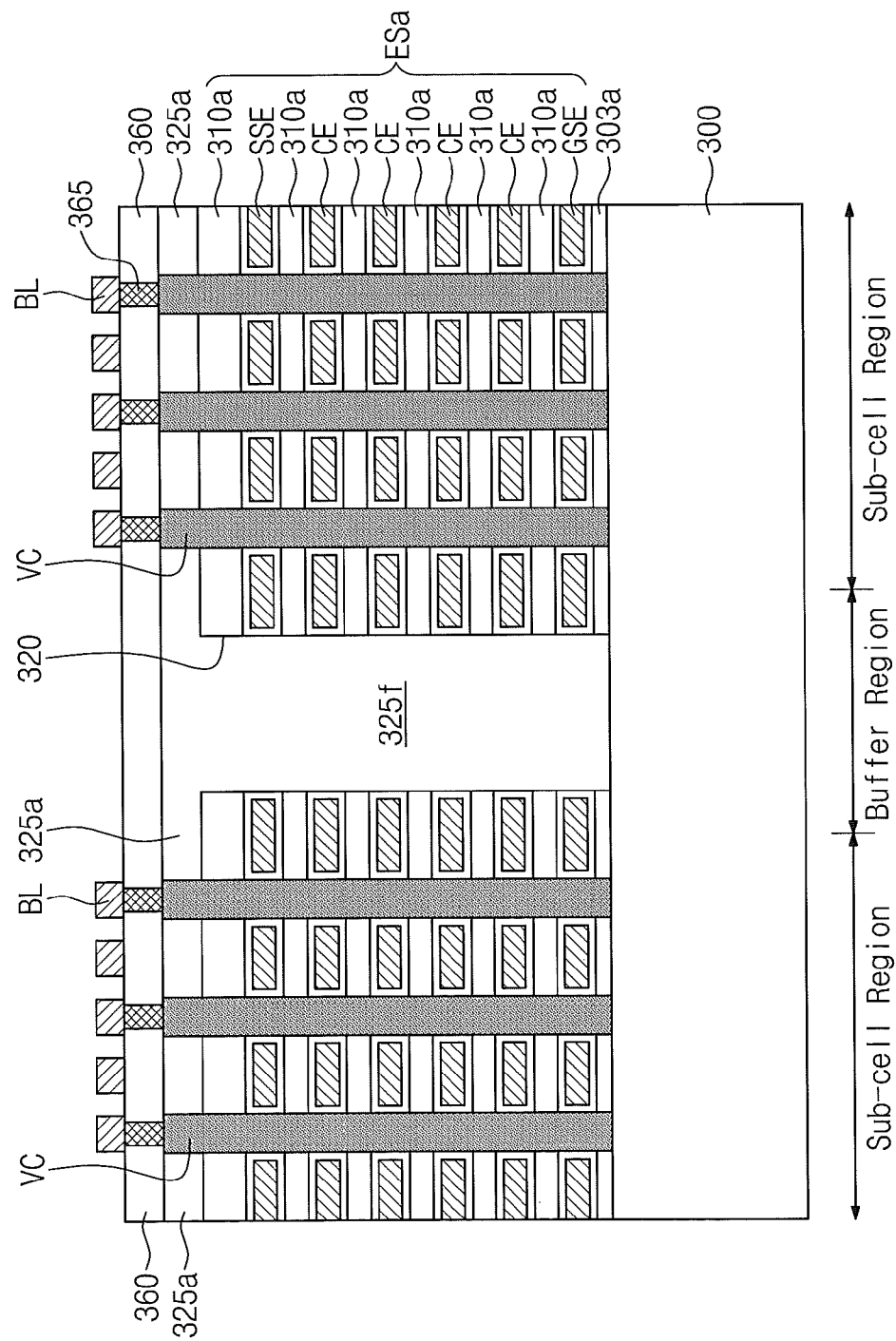

THREE-DIMENSIONAL SEMICONDUCTOR MEMORY DEVICES AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2011-0042706, filed on May 4, 2011, the entirety of which is incorporated by reference herein.

BACKGROUND

The present inventive concept relates to semiconductor devices and methods of fabricating the same and, more particularly, to three-dimensional semiconductor memory devices and methods of fabricating the same.

Semiconductor devices are very attractive in an electronic industry because of the small size, functionality and/or low fabrication cost thereof. The integration density of semiconductor memory devices in particular has increased with the development of the electronic industry. The integration density of semiconductor memory devices may directly affect the cost thereof. That is, as the integration density of the semiconductor memory devices is increased, the cost of the semiconductor memory devices may be reduced. Thus, there is an increasing demand for semiconductor memory devices with increased integration density.

Generally, the integration density of the semiconductor memory devices is directly related to the planar area occupied by a unit memory cell. Accordingly, the integration density of semiconductor memory devices may be influenced by the process technology used for forming fine patterns. However, there may be limitations in improving the process technology for forming the fines patterns due to high cost equipments and/or difficulty of the process technology.

Recently, three-dimensional semiconductor memory devices have been proposed as a way of increasing integration density using existing patterning technology. However, in fabrication of the three-dimensional semiconductor memory devices, various problems may be encountered due to structural configurations thereof. For example, the reliability of the three-dimensional semiconductor memory devices may be degraded.

SUMMARY

Embodiments of the inventive concept may provide three dimensional semiconductor memory devices with improved reliability and methods of fabricating the same.

Embodiments of the inventive concept may also provide three dimensional semiconductor memory devices with high integration and methods of fabricating the same.

According to example embodiments of the inventive concepts, a three-dimensional semiconductor memory device may include: an electrode structure extending in a first direction and including electrodes and insulating patterns which are alternately and repeatedly stacked on a substrate, at least an uppermost electrode of the electrodes being divided into a plurality of physically isolated segments arranged in the first direction; vertical active patterns that penetrate the electrode structure; and an electrode-dielectric layer disposed between each of the vertical active patterns and each of the electrodes. The segments of the uppermost electrode are electrically connected to each other.

In some embodiments, a lowermost electrode of the electrodes in the electrode structure may not be divided into segments.

In other embodiments, the substrate may include a plurality of sub-cell regions and a buffer region disposed between the sub-cell regions. In this case, the electrode structure may cross over the sub-cell regions and the buffer region. The segments of the uppermost electrode may be disposed in the sub-cell regions, respectively. The segments of the uppermost electrode may include extensions extending into the buffer region, respectively. A cutting region may be provided in the buffer region between the segments of the uppermost electrode.

In still other embodiments, the device may further include a capping dielectric pattern in the cutting region. The capping dielectric pattern may provide the physical isolation between the segments of the uppermost electrode.

In yet other embodiments, the uppermost electrode may be a string selection electrode. The electrodes may include cell electrodes which are stacked and are disposed under the string selection electrode. At least uppermost cell electrode of the cell electrodes may be divided into a plurality of segments arranged in the one direction. The cutting region may extend downwardly between the segments of the uppermost cell electrode.

In yet still other embodiments, the cutting region may include an inner sidewall having a stepped shape.

In further embodiments, the device may further include: a string join interconnection disposed in the buffer region and electrically connecting the segments of the string selection electrode to each other; and a floor-join interconnection disposed in the buffer region and electrically connecting the segments of the uppermost cell electrode to each other.

In still further embodiments, each of a plurality of cell electrodes may be divided into physically isolated segments arranged in the one direction. The floor-join interconnection include a plurality of floor-join interconnections. A number of the floor-join interconnections may correspond to the number of divided cell electrodes. The plurality of the floor-join interconnections may be disposed on the electrode structure and be respectively disposed different levels from each other with respect to a top surface of the substrate.

In even further embodiments, the electrode structure may be provided in a plural number to extend in parallel to each other. Each of a plurality of cell electrodes may be divided into segments arranged in the first direction. The floor-join interconnection may a plurality of floor-join interconnections that are disposed on the electrode structures, respectively. Each of the floor-join interconnections electrically may connect segments of one of the divided cell electrodes in the electrode structure under each of the floor interconnections to each other. The segments connected to one of the floor-join interconnections may be disposed at a different level from the segments connected to others of the floor-join interconnections.

In yet further embodiments, the substrate may further include a first edge region and a second edge region, and the sub-cell regions and the buffer region may be disposed between the first edge region and the second edge region. The cell electrodes being stacked in each of the electrode structures may include first electrode pads having a stepped structure and being disposed in the first edged region, and second electrode pads having a stepped structure and being disposed in the second edge region. The first electrode pads of the cell electrodes, which are respectively included in the plurality of the electrode structures and are disposed at the same level, may be electrically connected to each other. The second electrode pads of the cell electrodes, which are respectively included in the plurality of the electrode structures and are disposed at the same level, may be electrically connected to each other.

According to example embodiments of the inventive concepts, a method of fabricating a semiconductor device may include: providing a substrate including a plurality of sub-cell regions and a buffer region disposed between the sub-cell regions; forming a mold layer on the substrate, the mold layer including sacrificial layers and insulating layers which are alternately and repeatedly stacked; forming a cutting region penetrating at least an uppermost insulating layer and an uppermost sacrificial layer, and extending in a first direction; forming vertical active patterns penetrating the mold layer; patterning the mold layer to form mold patterns extending in a second direction different from the first direction; replacing sacrificial patterns in the mold patterns with electrodes; and forming an electrode-dielectric layer between each of the vertical active patterns and each of the electrodes.

In some embodiments, the method may further include before forming the mold patterns, forming a capping dielectric layer in the cutting region. In this case, forming the mold patterns may include patterning the capping dielectric layer and the mold layer.

In other embodiments, a lowermost bottom surface of the cutting region may be disposed at a higher level than a top surface of a lowermost sacrificial layer of the sacrificial layers.

In still other embodiments, the cutting region may penetrate a plurality of the sacrificial layers among the sacrificial layers being stacked in the mold layer, and the cutting region includes an inner sidewall having a stepped shape.

In yet other embodiments, the vertical active patterns may be formed after the cutting region is formed.

BRIEF DESCRIPTION OF THE DRAWINGS

The inventive concept will become more apparent in view of the attached drawings and accompanying detailed description.

FIGS. 1A through 6A are plan views illustrating a method of fabricating a three-dimensional semiconductor memory device according to some embodiments of the inventive concept;

FIGS. 1B through 6B are cross sectional views taken along lines I-I' of FIGS. 1A through 6A, respectively;

FIGS. 1C through 6C are cross sectional views taken along lines II-II' of FIGS. 1A through 6A, respectively;

FIG. 7D is a cross sectional view taken along a line III-III' of FIG. 7A;

FIGS. 11A through 13A are plan views illustrating a method of fabricating a three-dimensional semiconductor memory device according to other embodiments of the inventive concept;

FIGS. 11B through 13B are cross sectional views taken along lines V-V' of FIGS. 11A through 13A, respectively;

FIGS. 15A through 17A are plan views illustrating a method of fabricating a three-dimensional semiconductor memory device according to still other embodiments of the inventive concept;

FIGS. 15B through 17B are merged cross sectional views taken along lines VI-VI' and VII-VII' of FIGS. 15A through 17A, respectively;

FIGS. 15C through 17C are cross sectional views taken along lines VIII-VIII' of FIGS. 15A through 17A, respectively;

FIG. 18C is a cross sectional view taken along a line VIII-VIII' of FIG. 18A.

DETAILED DESCRIPTION OF THE EMBODIMENTS

Figure 1A:
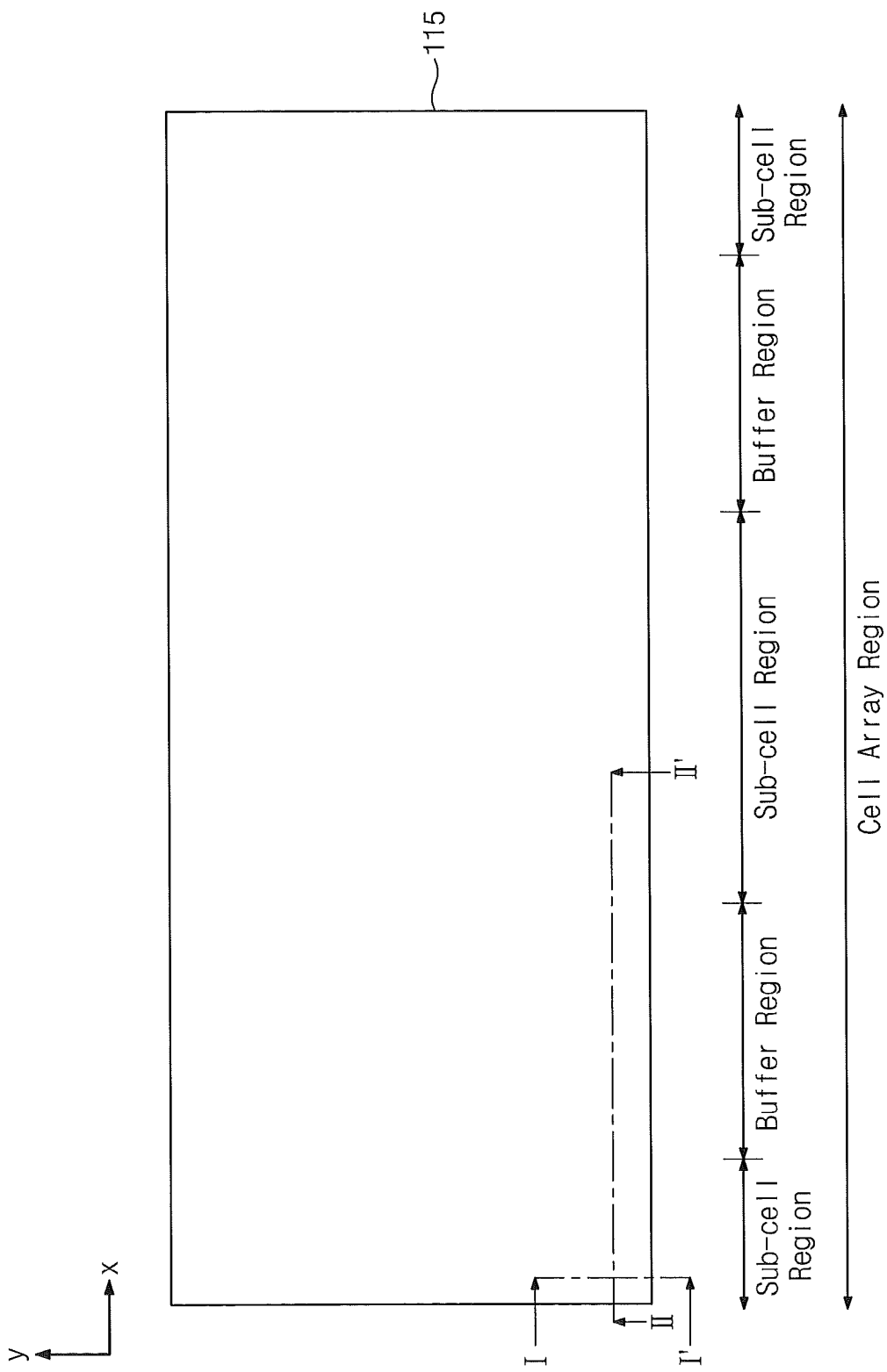

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

First Embodiment

FIGS. 1A through 6A are plan views illustrating a method of fabricating a three-dimensional semiconductor memory device according to some embodiments of the inventive concept. FIGS. 1B through 6B are cross sectional views taken along lines I-I' of FIGS. 1A through 6A, respectively. FIGS. 1C through 6C are cross sectional views taken along lines II-II' of FIGS. 1A through 6A, respectively. FIGS. 1B through 6B and 1C through 6C are enlarged views.

Figure 1B:
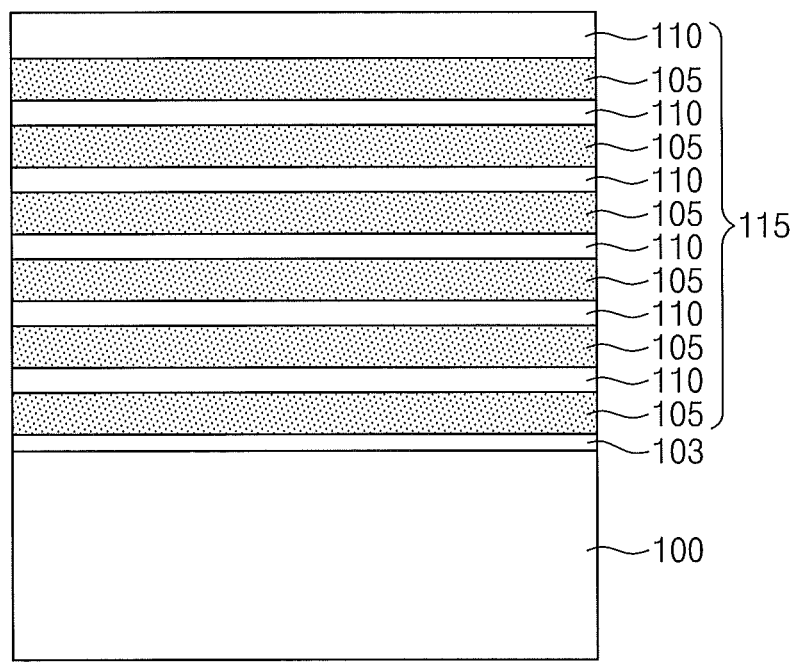
Figure 1C:
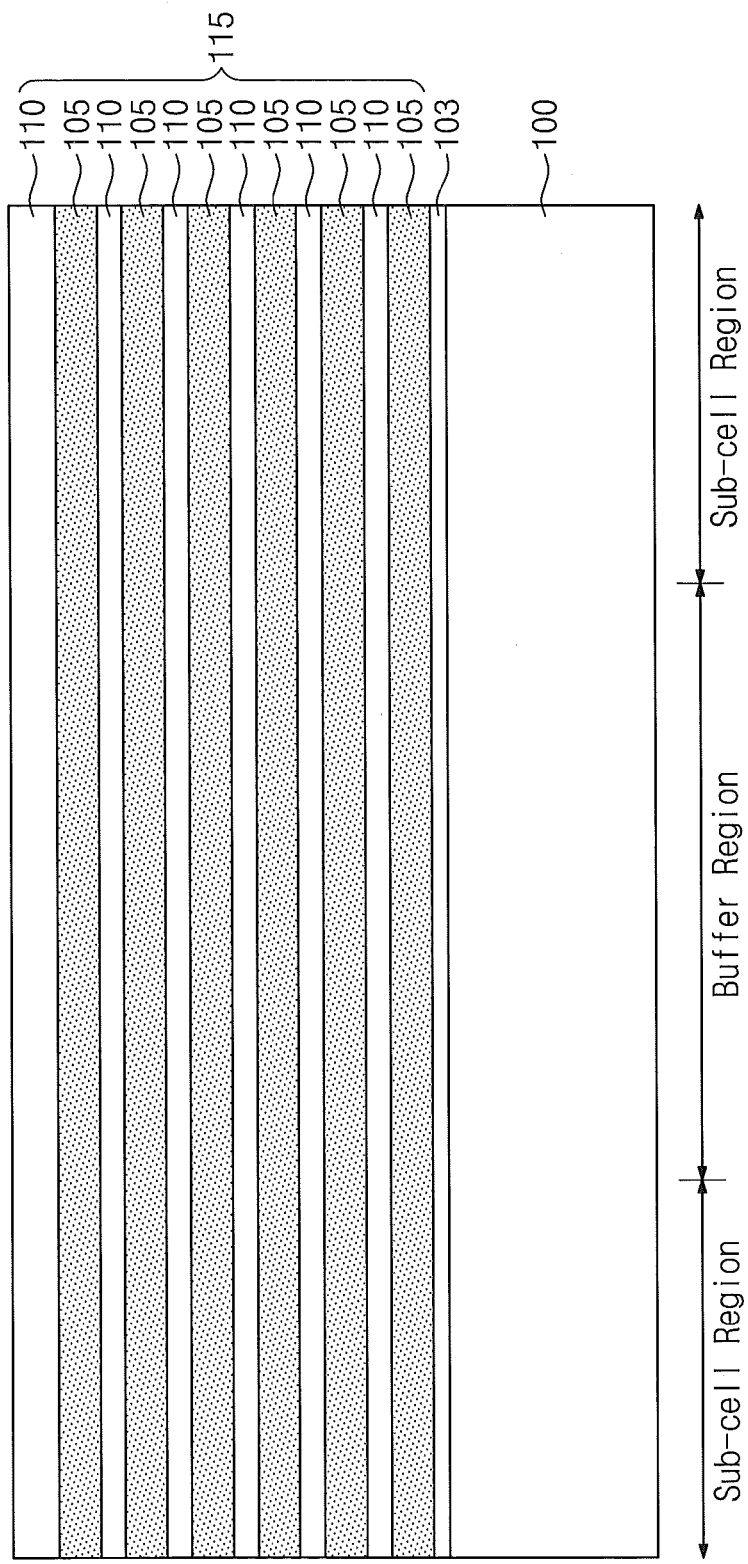

Referring to FIGS. 1A, 1B, and 1C, a semiconductor substrate (hereinafter, referred to as 'a substrate') 100 including a cell array region may be provided. The cell array region may include a plurality of sub-cell regions and a buffer region between the sub-cell regions being adjacent to each other. As illustrated in FIG. 1A, the sub-cell regions and the buffer region may extend in parallel in a first direction when viewed from a top view. The first direction may correspond to a y-axis direction of FIG. 1A.

In some embodiments, the cell array region may include three or more sub-cell regions and two or more buffer regions. In this case, as illustrated in FIG. 1A, the sub-cell regions and the buffer regions may be alternately and repeatedly arranged in a second direction perpendicular to the first direction when viewed from a top view. The second direction may correspond to a x-axis direction of FIG. 1A. However, the inventive concept is not limited thereto.

For example, the substrate 100 may be a silicon substrate, a germanium substrate, a silicon-germanium substrate, etc. The substrate 100 may be doped with dopants of a first conductivity type. For example, the substrate 100 may include a well region doped with dopants of the first conductivity type. The substrate 100 may further include a peripheral circuit region (not shown).

A mold layer 115 may be formed on the substrate 100. The mold layer 115 may include sacrificial layers 105 and insulating layers 110 which are alternately and repeatedly stacked. The sacrificial layers 105 may formed of a material having an etch selectivity with respect to the insulating layers 110. For example, the insulating layers 110 may be formed of oxide layers and the sacrificial layers 105 may formed of nitride layers. The mold layer 115 may be formed on the substrate 100 in the sub-cell regions and the buffer regions. The insulating layers 110 in the mold layer 115 may include an uppermost insulating layer 110, and the sacrificial layers 105 in the mold layer 115 may include an uppermost sacrificial layer 105.

Before the mold layer 115 is formed, a buffer dielectric layer 103 may be formed on the substrate 100. The buffer dielectric layer 103 may be formed of a dielectric layer having an etch selectivity with respect to the sacrificial layers 105. For example, the buffer dielectric layer 103 may be formed of an oxide layer.

Figure 2B:
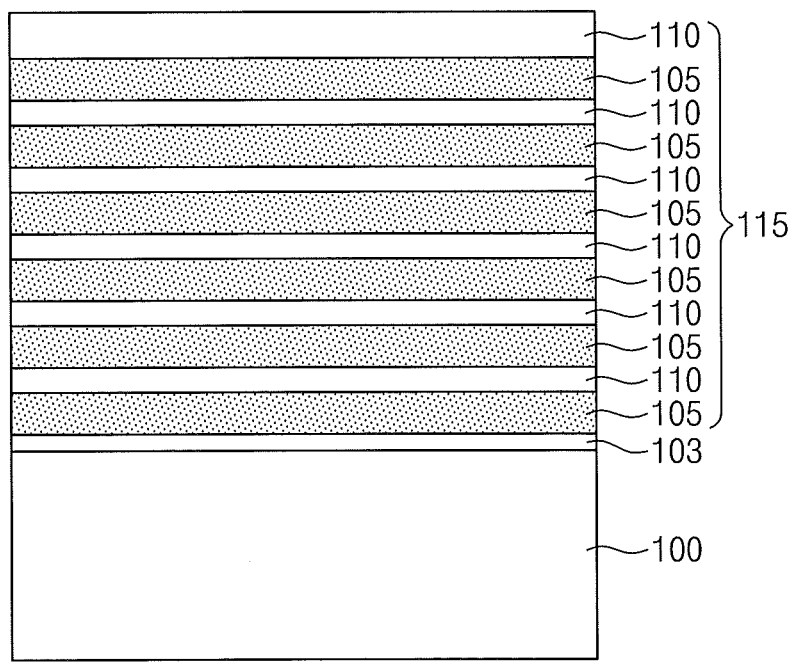

Referring to FIGS. 2A, 2B and 2C, the mold layer 115 in each of the buffer regions may be patterned to form a cutting region 120 extending in the first direction. As illustrated in FIG. 2C, the cutting region 120 may penetrate at least the uppermost sacrificial layer among the stacked sacrificial layers 105. Additionally, the cutting region 120 may extend downwardly through a plurality of the sacrificial layers 105. As illustrated in FIG. 2C, when the cutting region 120 penetrates a plurality of sacrificial layers 105 being stacked, an inner sidewall of the cutting region 120 may have a stepped shape.

A method of forming the cutting region 120 according to some embodiments will be described. A mask pattern having an opening may be formed on the mold layer 115. The opening may expose the uppermost insulating layer 110 in the buffer region. The opening may have a shape extending in the first direction. The uppermost insulating layer 110 and the uppermost sacrificial layer 105 may be etched using the mask pattern as an etch mask to form a concave region.

Subsequently, the mask pattern may be recessed to increase a width of the opening. Thus, a portion of the uppermost insulating layer 110, which is adjacent to the concave region, may be exposed. Next, the exposed uppermost insulating layer 110 and the uppermost sacrificial layer 105 may be etched using the recessed mask pattern as an etch mask. At this time, a next uppermost insulating layer 110 and a next uppermost sacrificial layer 105 under a bottom surface of the concave region may be etched. The recess process of the mask pattern, and the etching process using the recessed mask pattern as an etch mask may be repeatedly performed at least two times. Thus, the cutting region 120 having an inner sidewall having a stepped shape may be formed.

In some embodiments, as illustrated in FIG. 2C, a lowermost bottom surface of the cutting region 120 may be disposed at a level higher than a top surface of a lowermost sacrificial layer among the stacked sacrificial layers 105. Accordingly, at least the lowermost sacrificial layer may not be divided by the cutting region 120. For example, some of the stacked sacrificial layers 105 in the mold layer 115 may be divided by the cutting region 120, and others of the stacked sacrificial layers 105 may not be divided by the cutting region 120. However, the inventive concept is not limited thereto.

Figure 3B:
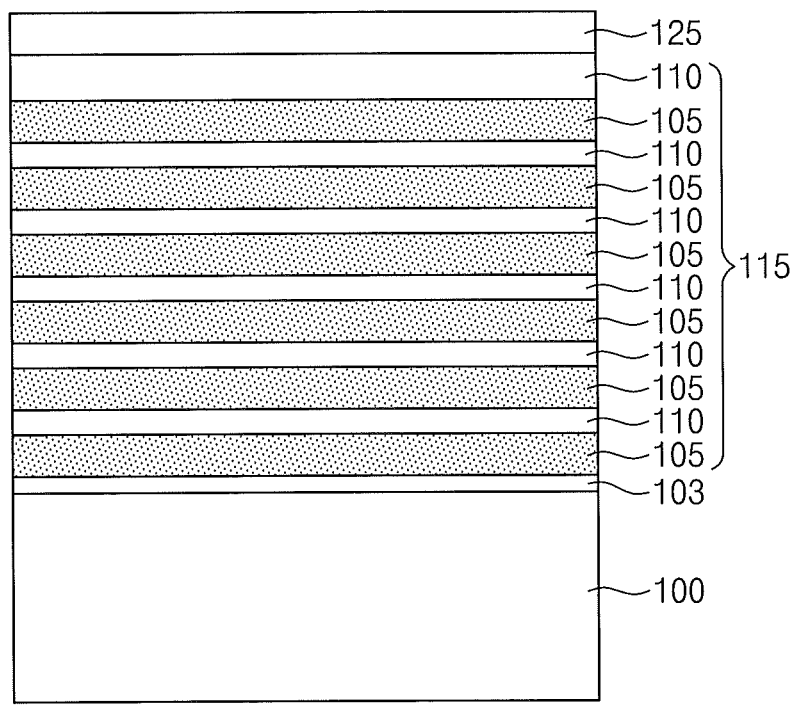
Figure 3C:
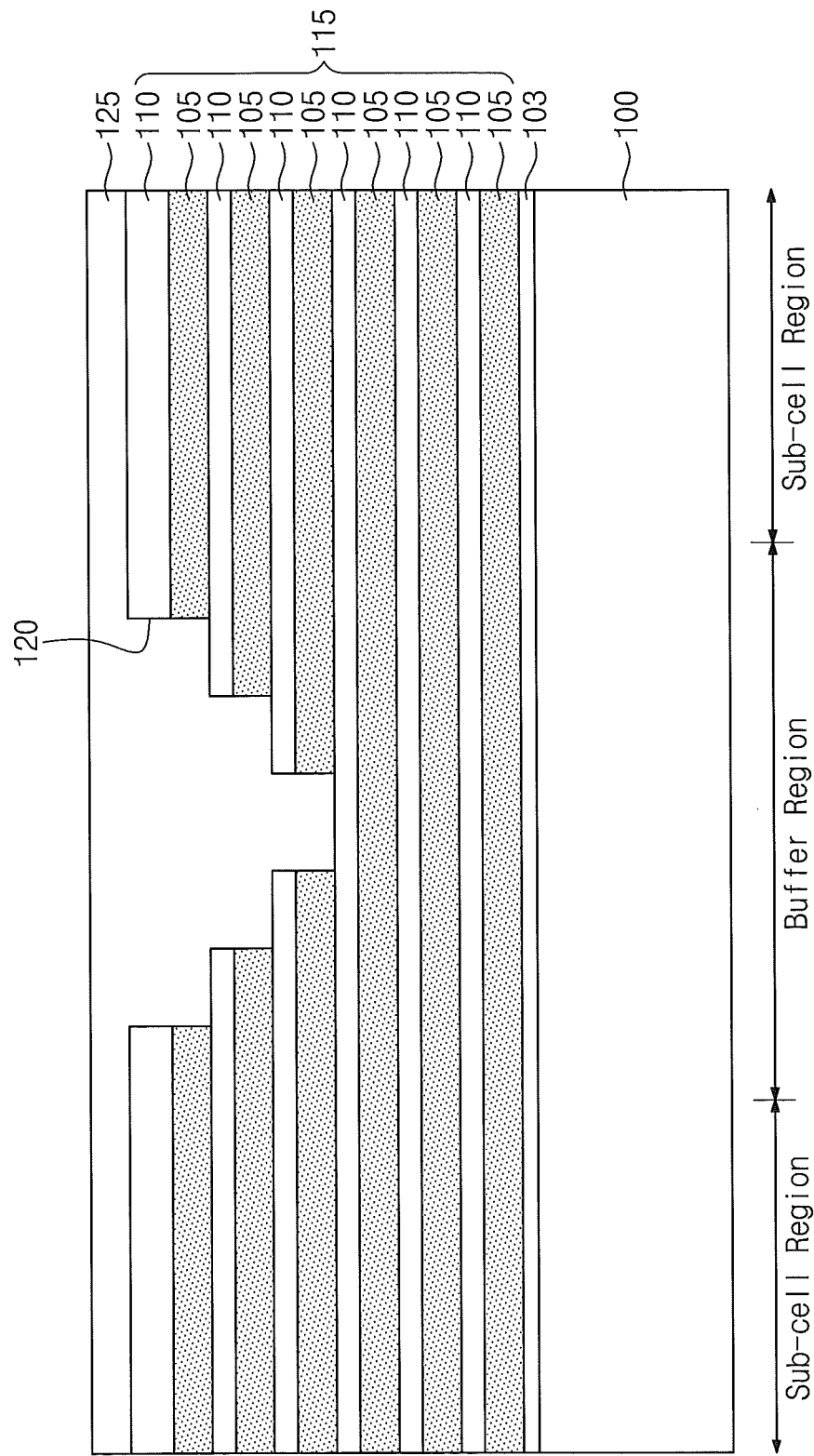

Referring to FIGS. 3A, 3B, and 3C, a capping dielectric layer 125 filling the cutting region 120 may be formed on the substrate 100. The capping dielectric layer 125 may include a dielectric material having an etch selectivity with respect to the sacrificial layers 105. For example, the capping dielectric layer 125 may be formed of an oxide layer. In some embodiments, the capping dielectric layer 125 may fill the cutting region 120 and may also be disposed on the uppermost insulating layer 110 in the sub-cell region.

Alternatively, the capping dielectric layer 125 may be planarized until the uppermost insulating layer 110 is exposed. In this case, the planarized capping dielectric layer 125 may be confinedly disposed in the cutting region 120. Hereinafter, the embodiment including the capping dielectric layer 125, which fills the cutting region 120 and is disposed on the uppermost insulating layer 110 in the sub-cell region, will be described.

Figure 4B:
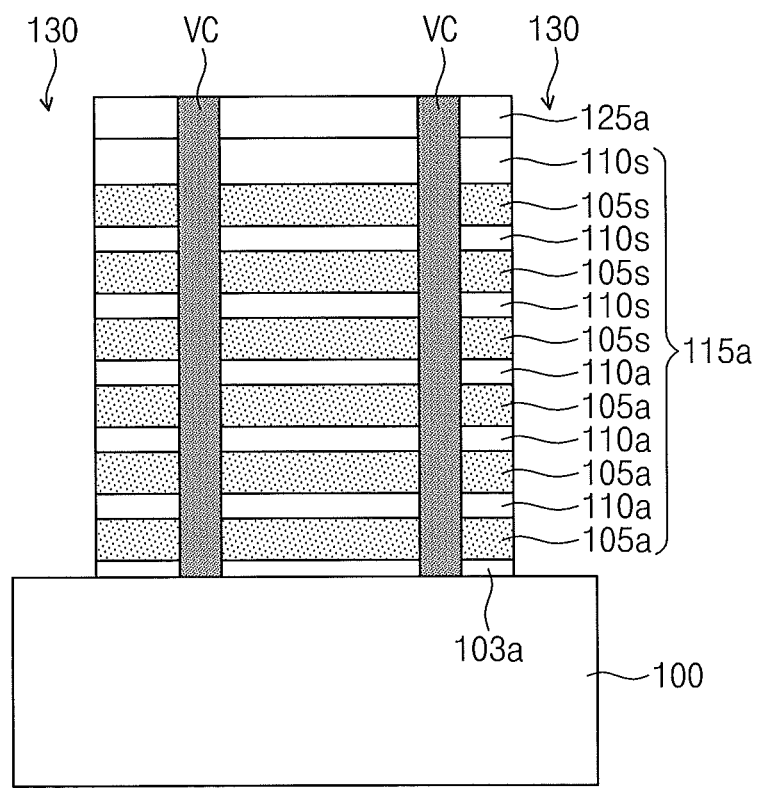

Referring to FIGS. 4A, 4B, and 4C, vertical active patterns VC may be formed to successively penetrate the capping dielectric layer 125 and the mold layer 115. After the cutting region 120 is formed, the vertical active patterns VC may be formed. A hole penetrating the capping dielectric layer 125 and mold layer 115 may be formed, and the vertical active pattern VC may be formed in the hole. The vertical active patterns VC may be connected to the well region in the substrate 100. The vertical active patterns VC may include the same semiconductor material as a semiconductor material constituting the substrate 100. For example, when the substrate 100 is the silicon substrate, the vertical active patterns VC may be formed of silicon. Each of the vertical active patterns VC may be a single-crystalline region or a polycrystalline region. The vertical active patterns. VC may be doped with dopants of the first conductivity type. Alternatively, the vertical active patterns VC may be undoped.

As illustrated in FIGS. 4B and 4C, each of the vertical active patterns VC may have the shape of a pillar relative to the substrate. However, the inventive concept is not limited thereto. The vertical active pattern VC may have another shape.

The capping dielectric layer 125, mold layer 115 and a buffer dielectric layer 103 may be successively patterned to form trenches 130 extending in the second direction. The trenches 130 may cross the cutting region 120. Since the trenches 130 are formed, a buffer dielectric pattern 103a, a mold pattern 115a and a capping dielectric pattern 125a being sequentially stacked may be formed between the trenches 130 being adjacent to each other. The mold pattern 115a may extend in the second direction. A plurality of the mold patterns 115a may extend in parallel on the substrate 100. The mold patterns 115a may cross the sub-cell regions and the buffer regions.

As illustrated in FIG. 4C, each of the mold patterns 115a may include sacrificial patterns 105a and 105d and insulating patterns 110a and 110d which are alternately and repeatedly stacked. Additionally, the each of the mold patterns 115a may include a cutting region 120a which is divided by the trenches 130 and is disposed in each of the buffer regions.

Referring to FIGS. 4A, 4B, and 4C, at least uppermost sacrificial pattern of the stacked sacrificial patterns 105a and 105d in each of the mold patterns 115a may be a divided sacrificial pattern 105d. The divided sacrificial pattern 105d may include a plurality of sacrificial segments 105s which are arranged in the second direction and are separated from each other. The sacrificial segments 105s of the divided sacrificial pattern 105d may be divided from each other by the cutting regions 120a in each of the mold patterns 115a. That is, the cutting region 120a may be disposed between the sacrificial segments 105s adjacent to each other in the divided sacrificial pattern 105d. The sacrificial segments 105s of the divided sacrificial pattern 105d may be disposed at the same height from a top surface of the substrate 100. Additionally, the sacrificial segments 105s of the divided sacrificial pattern 105d may be disposed in the sub-cell regions, respectively. In some embodiments, each of the sacrificial segments 105s of the divided sacrificial pattern 105d may have an extension laterally extending into the buffer region.

In some embodiments, each of the mold patterns 115a may include a plurality of divided sacrificial patterns 105d being stacked. Thus, stacked sacrificial segments 105s may be disposed in each of the sub-cell regions. The cutting region 120a may have a stepped inner sidewall. Thus, the extensions of the stacked sacrificial segments 105s, which are disposed in the buffer region, may have a stepped structure.

Each of the mold patterns 115a may include a divided insulating pattern 110d disposed directly on the divided sacrificial pattern 105d. The divided insulating pattern 110d may be divided into a plurality of insulating segments 110s which are arranged in the second direction. The insulating segments 110s of the divided insulating pattern 110d may be self-aligned with the sacrificial segments 105s of the divided sacrificial pattern 105d directly under the divided insulating pattern 110d.

In some embodiments, each of the mold patterns 115a may include at least one undivided sacrificial pattern 105a. The undivided sacrificial pattern 105a is not divided into segments. In other words, the undivided sacrificial pattern 105a may be continuously disposed in the sub-cell regions and the buffer regions without cutting. At least lowermost sacrificial pattern among the stacked sacrificial patterns 105a and 105d in each of the mold patterns 115a may be an undivided sacrificial pattern 105a. The sacrificial patterns 105a under the lowermost bottom surface of the cutting region 120a in each of the mold patterns 115a may be undivided sacrificial patterns 105a. Each of the mold patterns 115a may include an undivided insulating pattern 110a disposed directly on the undivided sacrificial pattern 105a.

The capping dielectric pattern 125a may fill the cutting region 120a. In some embodiments, the capping dielectric pattern 125a may extend onto a top surface of the mold pattern 115a in the sub-cell regions.

Both sidewalls of sacrificial patterns 105a and 105d in each of the mold patterns 115a may be exposed by the trenches 130.

In some embodiments, after the vertical active patterns VC are formed, the trenches 130 and the mold patterns 115a may be formed. However, the inventive concept is not limited thereto. In other embodiments, after the trenches 130 and the mold patterns 115a are formed, the vertical active patterns VC may be formed.

The vertical active patterns VC may penetrate the mold patterns 115a in the sub-cell regions. In some embodiments, the vertical active patterns VC penetrating each of the mold patterns 115a may be classified into a plurality of string groups. The vertical active patterns VC in each of the string groups may be connected to bit lines (BL in FIG. 7A) different from each other. In some embodiments, as illustrated in FIG. 4A, the vertical active patterns VC in each of the string groups may be arranged in zigzag along the second direction. For example, the vertical active patterns VC in a pair of the string groups may penetrate each of the mold patterns 115a. However, the inventive concept is not limited thereto. Alternatively, the vertical active patterns VC in one string group may penetrate each of the mold patterns 115a.

Figure 5A:
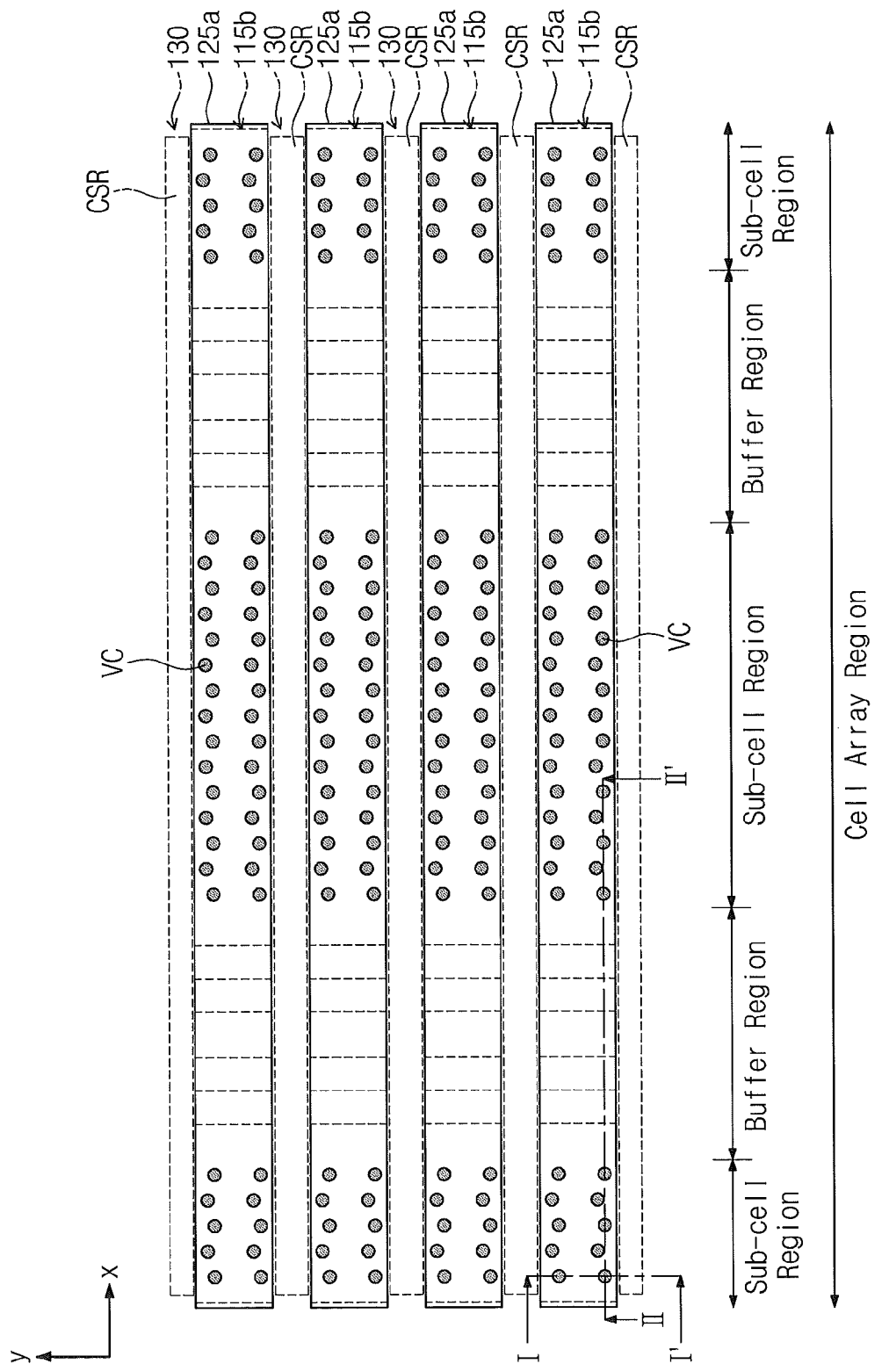
Figure 5B:
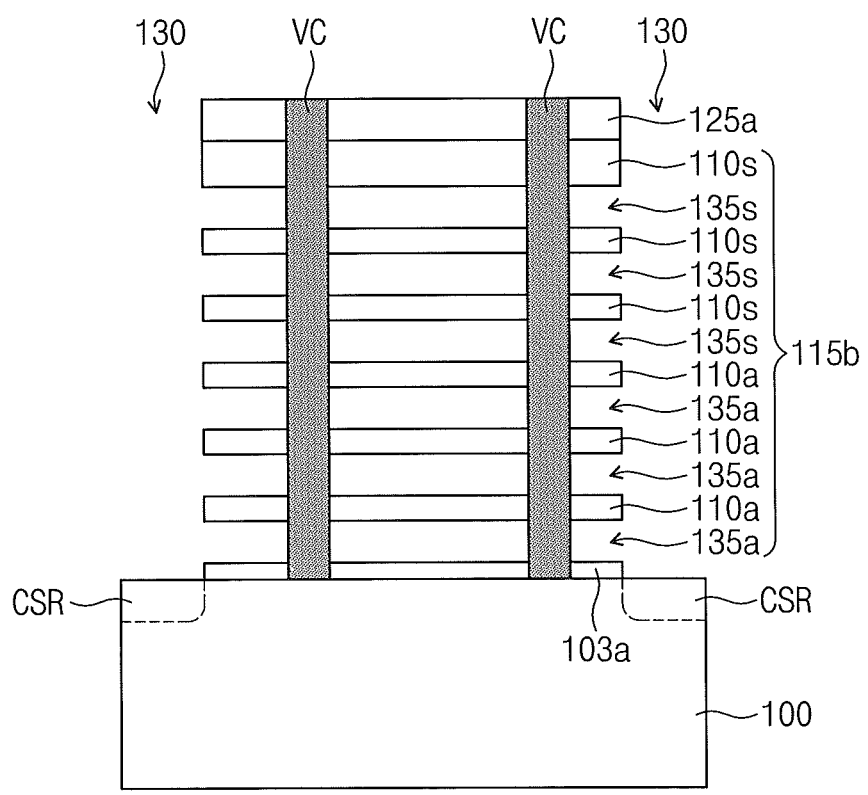
Figure 5C:
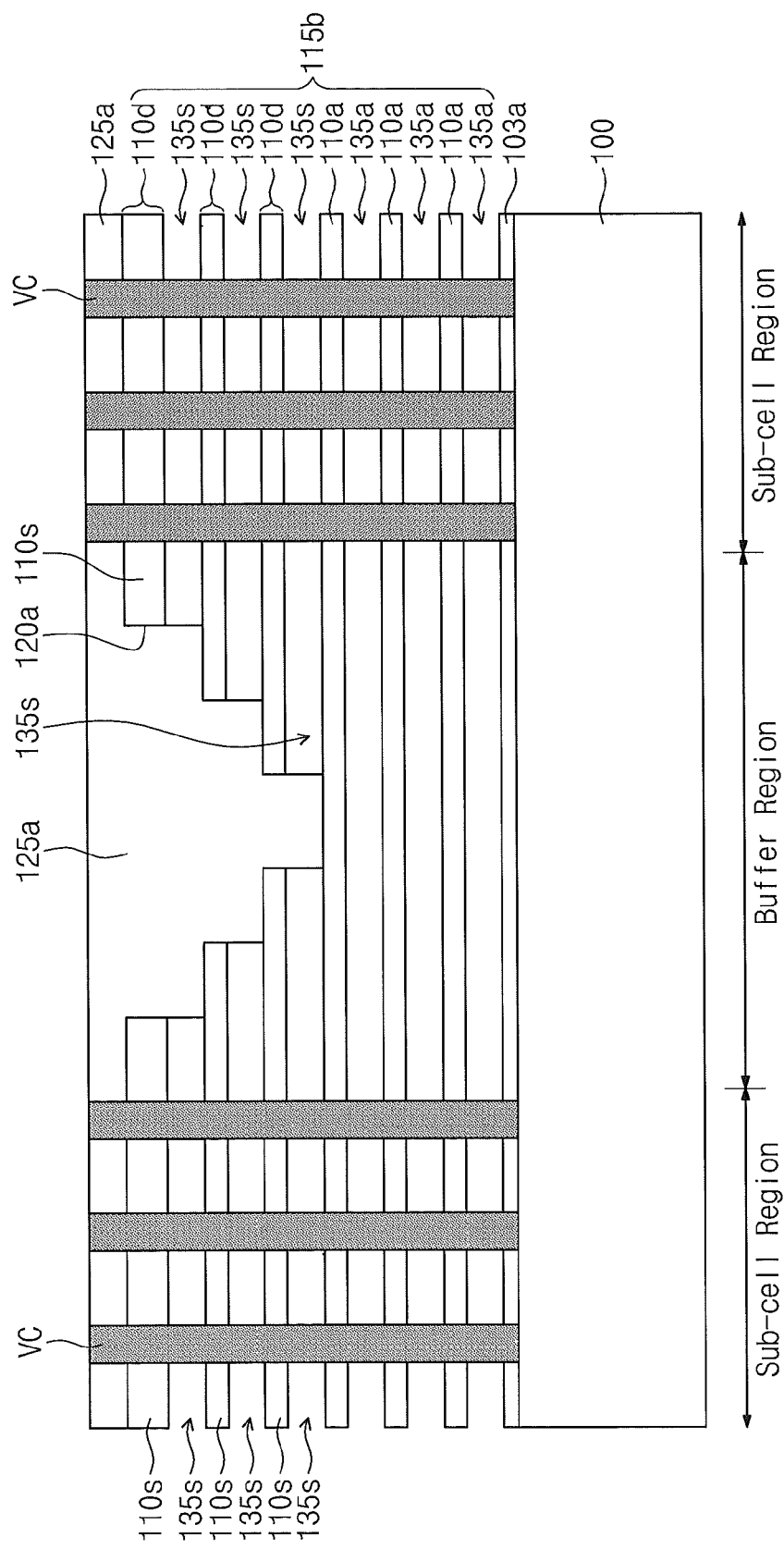

Referring to FIGS. 5A, 5B, and 5C, dopants of a second conductivity type may be provided into the substrate 100 under the trenches 130 to form common source regions CSR. The common source regions CSR may extend in the second direction.

The sacrificial patterns 105a and 105d exposed by the trenches 130 may be removed to form empty regions 135a and 135s. Thus, mold patterns 115b including the empty regions 135a and 135s may be formed. The undivided sacrificial patterns 105a may be removed to form first empty regions 135a, and the sacrificial segments 105s of the divided sacrificial patterns 105d may be removed to form second empty regions 135s. In some embodiments, the first and second empty regions 135a and 135s may expose sidewalls of the vertical active patterns VC.

Figure 6A:
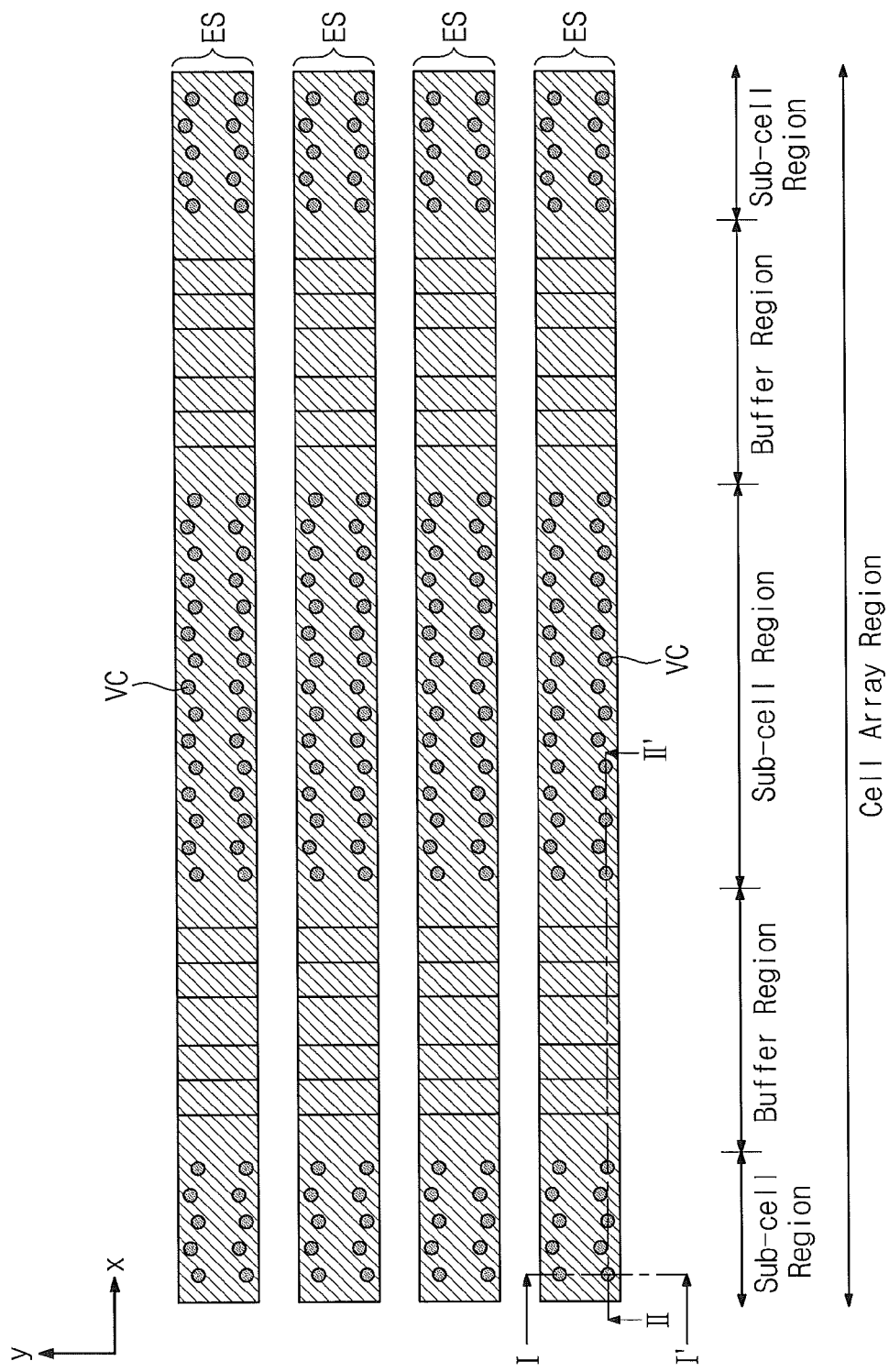
Figure 6B:
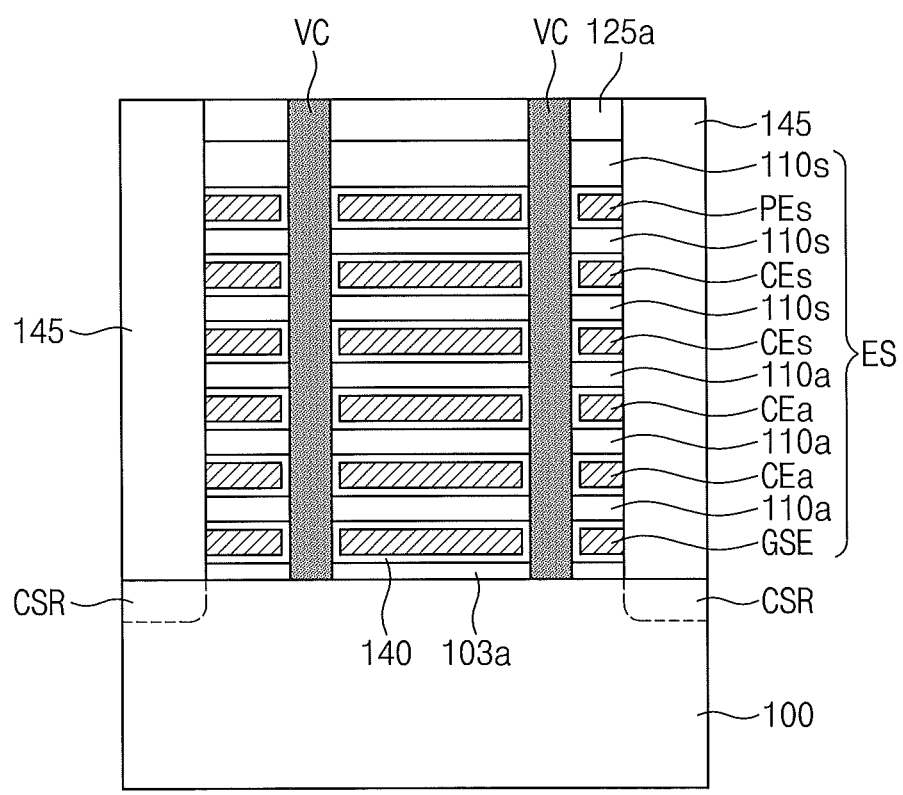
Figure 6C:
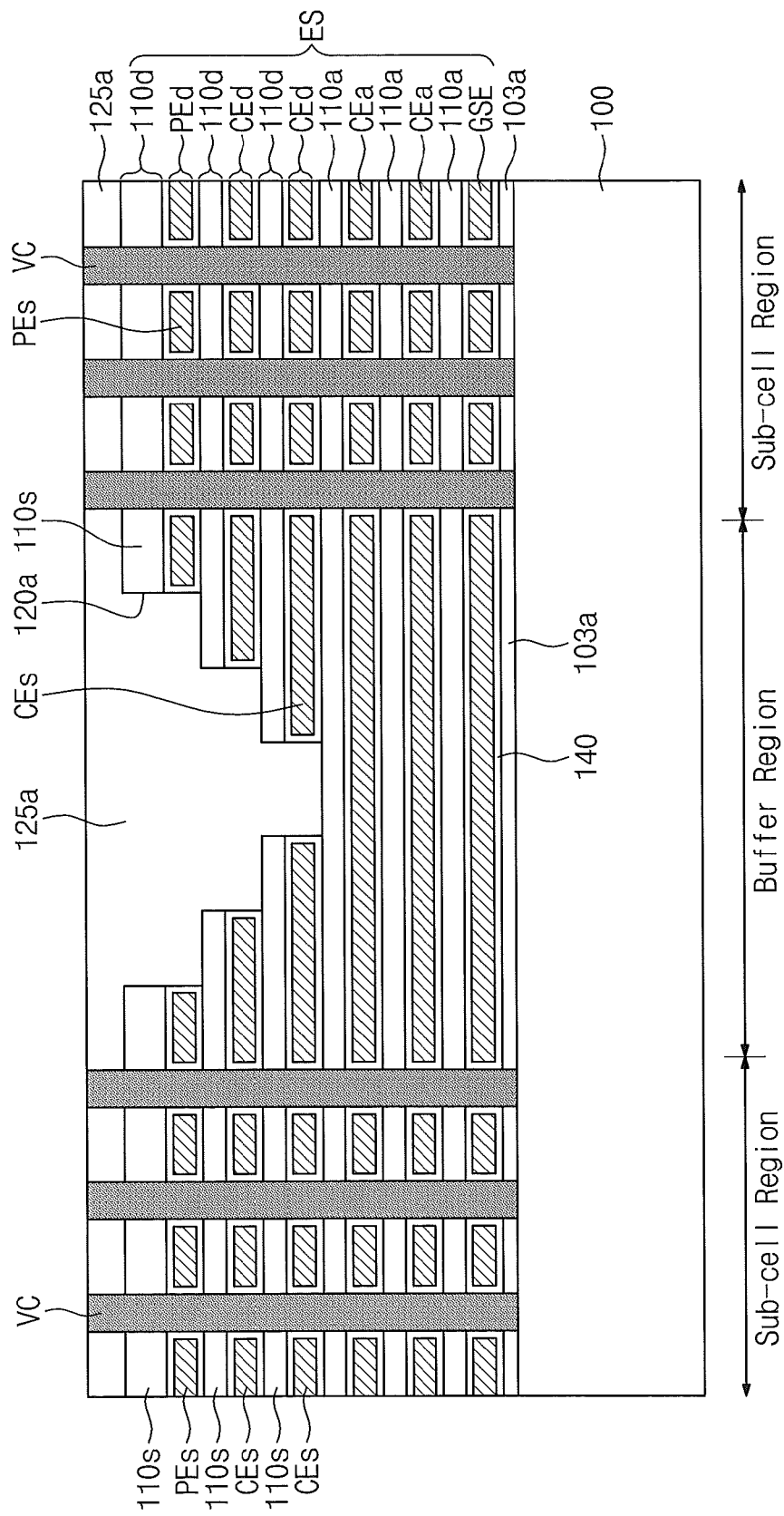

Referring to FIGS. 6A, 6B, and 6C, an electrode-dielectric layer 140 may be conformally formed on the substrate 100 including the first and second empty regions 135a and 135s. Thus, the electrode-dielectric layer 140 may be formed on inner surfaces of the first and second empty regions 135a and 135s in a substantially uniform thickness.

The electrode-dielectric layer 140 may include a tunnel dielectric layer, a charge storage layer, and a blocking dielectric layer. The tunnel dielectric layer may be adjacent to the sidewall of the vertical active region VC. The tunnel dielectric layer may include an oxide layer and/or an oxynitride layer. The charge storage layer may be disposed between the tunnel dielectric layer and the blocking dielectric layer. The charge storage layer may include a dielectric layer having traps that can store electric charge. For example, the charge storage layer may include a nitride layer and/or a metal oxide layer (e.g. a hafnium oxide layer, etc). The blocking dielectric layer may include a high-k dielectric layer (e.g. a metal oxide layer such as an aluminum oxide layer, and/or a hafnium oxide layer) having a dielectric constant higher than that of the tunnel dielectric layer. Additionally, the blocking dielectric layer may further include a barrier dielectric layer (e.g. an oxide layer) having an energy band gap greater than that of the high-k dielectric layer. The barrier dielectric layer may be disposed between the high-k dielectric layer and the charge storage layer.

A conductive layer may be formed on the substrate 100 having the electrode-dielectric layer 140 to fill the empty regions 135a and 135s. The conductive layer outside of the empty regions 135a and 135s may be removed to form electrodes GSE, CEa, CEd, and PEd in the empty regions 135a and 135s, respectively. Thus, electrode structures ES may be formed. In other words, the sacrificial patterns 105a and 105d in the mold patterns 115a of FIGS. 4A through 4C may be replaced with the electrodes GSE, CEa, CEd, and PEd. The conductive layer outside the empty regions 135a and 135s may be removed by an isotropic etching process. For example, the conductive layer may include at least one of semiconductor doped with dopants (e.g. silicon doped with dopants), metal (e.g. tungsten, aluminum, copper), a conductive metal nitride (e.g. titanium nitride, tantalum nitride), transition metal (e.g. titanium, tantalum), and a metal-semiconductor compound (e.g. metal silicide).

As illustrated in FIG. 6A, the electrode structures ES may extend in the second direction. As illustrated in FIG. 5C, each of the electrode structures ES may include the electrodes GSE, CEa, CEd, and PEd and the insulating patterns 110a and 110d which are alternately and repeatedly stacked. At this time, at least uppermost electrode PEd among the stacked electrodes GSE, CEa, CEd, and PEd in each of the electrode structures ES may be divided into a plurality of segments PEs. The segments PEs of the uppermost electrode PEd may be arranged in the second direction (i.e. a longitudinal direction of the electrode structure ES). The segments PEs of the uppermost electrode PEd may be disposed at the same height from the top surface of the substrate 100. The cutting region 120a may be defined between the segments PEs of the uppermost electrode PEd, and the capping dielectric pattern 125a may fill the cutting region 120a. The segments PEs of the uppermost electrode PEd may be disposed in the sub-cell regions, respectively.

The stacked electrodes GSE, CEa, CEd, and PEd in each of the electrode structures ES may include a plurality of cell electrodes CEa and CEd that are stacked. In some embodiments, the stacked cell electrodes CEa and CEd may include at least one divided cell electrode CEd. The divided cell electrode CEd may be divided into a plurality of segments CEs being arranged in the second direction. The segments CEs of the divided cell electrode CEd may be disposed at the same level from the top surface of the substrate 100. The cutting region 120a may also be defined between the segments CEs of the divided cell electrode CEd. The segments CEs of the divided cell electrode CEd may be disposed in the sub-cell regions, respectively. The divided sacrificial patterns 105d in each of the mold patterns 115a illustrated in FIG. 4C may be replaced with the uppermost electrode PEd and the divided cell electrodes CEd.

The segments CEs and PEs sequentially stacked in each of the sub-cell regions may include extensions laterally extending into the buffer region. The extensions of the stacked segments CEs and PEs may constitute a stepped structure.

In some embodiments, at least lowermost electrode GSE of the stacked electrodes GSE, CEa, CEd, and PEd in each of the electrode structures ES may not be divided into segments by the cutting region. That is, the lowermost electrode GSE may be continuously disposed in the sub-cell regions and the buffer regions without cutting. The lowermost electrode GSE may be a ground selection electrode. In some embodiments, each of the electrode structures ES may include at least one undivided cell electrode CEa. The undivided cell electrode may also be continuously disposed in the sub-cell regions and buffer regions without cutting. The undivided cell electrode CEa may be disposed at a higher level than that of the lowermost electrode GSE and may be disposed at a lower level than that of the divided cell electrode CEd. The lowermost bottom surface of the cutting region 120a may be disposed at a higher level than that of a top surface of the undivided cell electrode CEa. The undivided sacrificial patterns 105a in each of the mold patterns 115a illustrated in FIG. 4C may be replaced with the lowermost electrode GSE and the undivided cell electrodes CEa.

In some embodiments, the stacked cell electrodes CEa and CEd in each of the electrode structures ES may include at least one undivided cell electrode CEa. The undivided cell electrode CEa may not divided into segments.

A device isolation pattern 145 may be formed to fill each of the trenches 130 between the electrode structures ES. The device isolation pattern 145 may be formed on the common source region CSR. The device isolation pattern 145 may include oxide, nitride, and/or oxynitride.

As illustrated in FIG. 6A, the vertical active patterns VC penetrating the uppermost electrode PEd in each of the electrode structure ES may be classified into a plurality of the string groups.

Figure 7A:
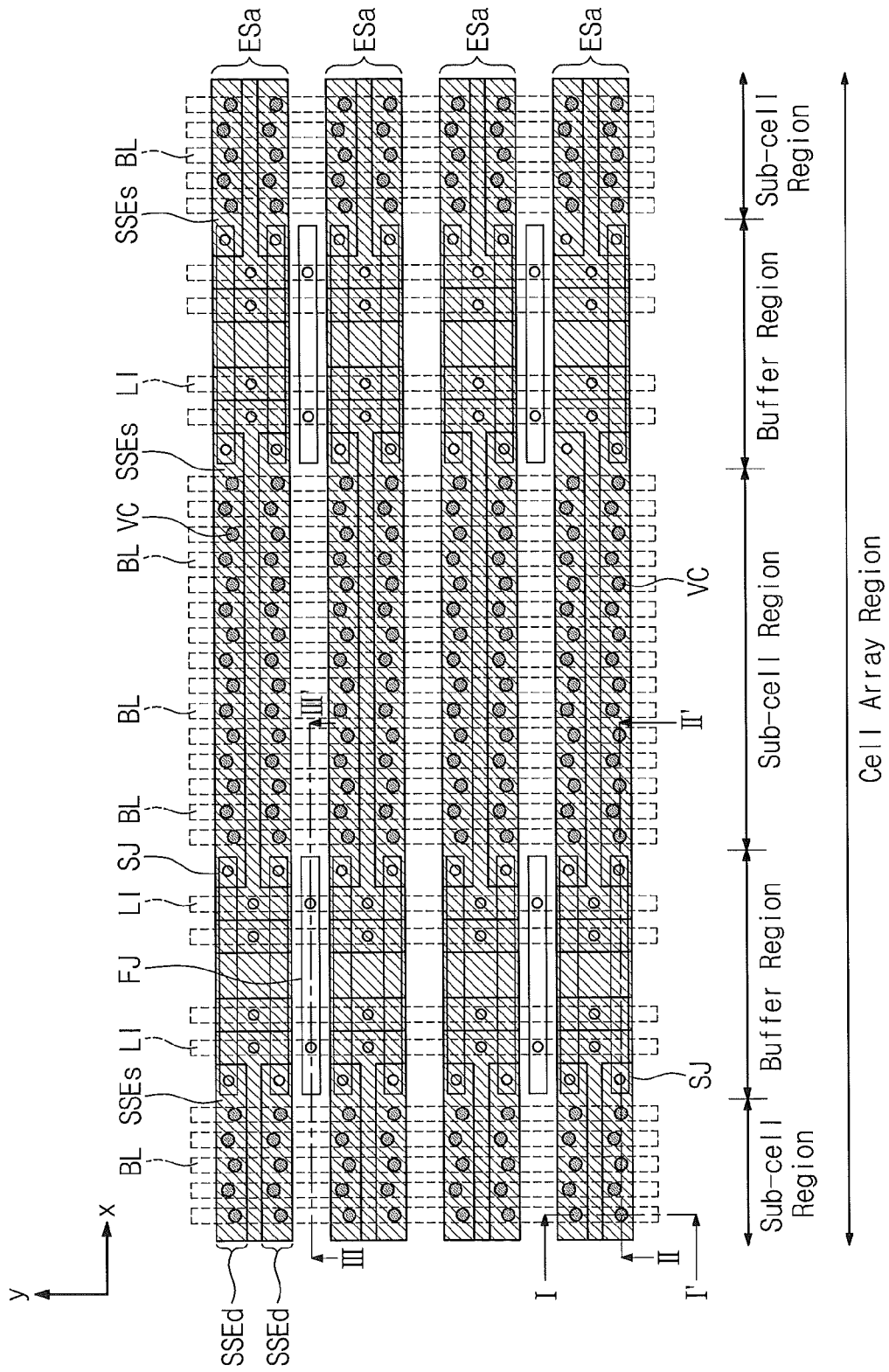
FIG. 7A is a plan view illustrating a three-dimensional semiconductor memory device according to some embodiments of the inventive concept.
Figure 7B:
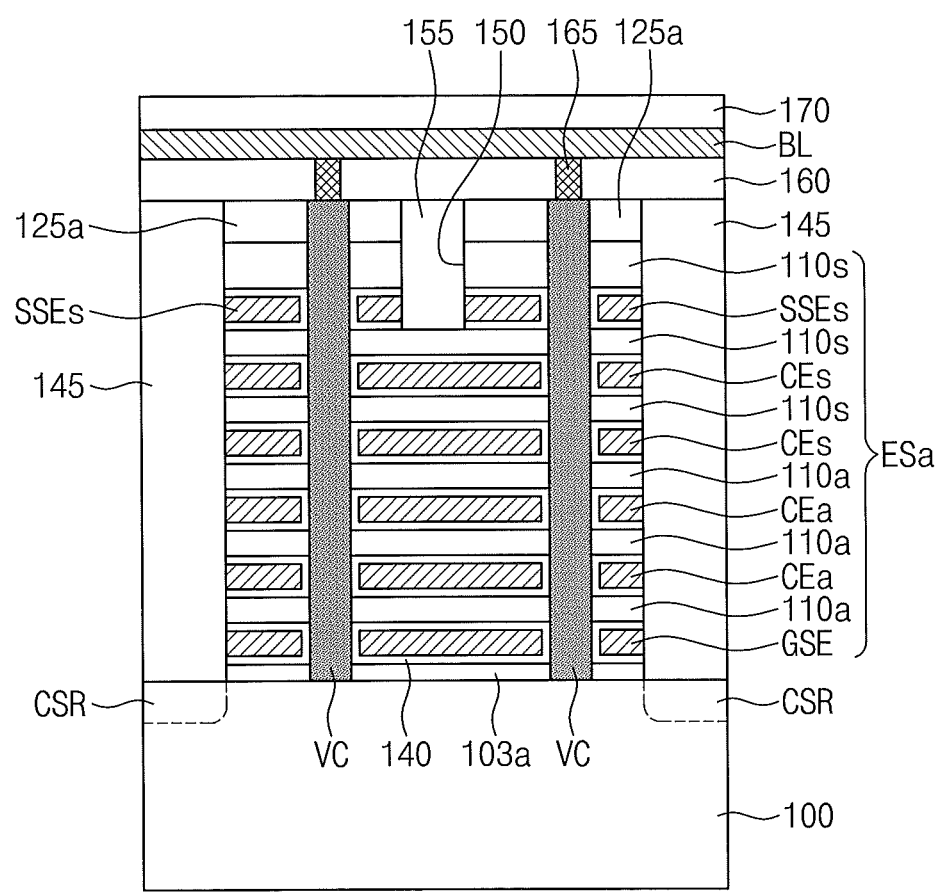
FIG. 7B is a cross sectional view taken along a line I-I' of FIG. 7A.
Figure 7C:
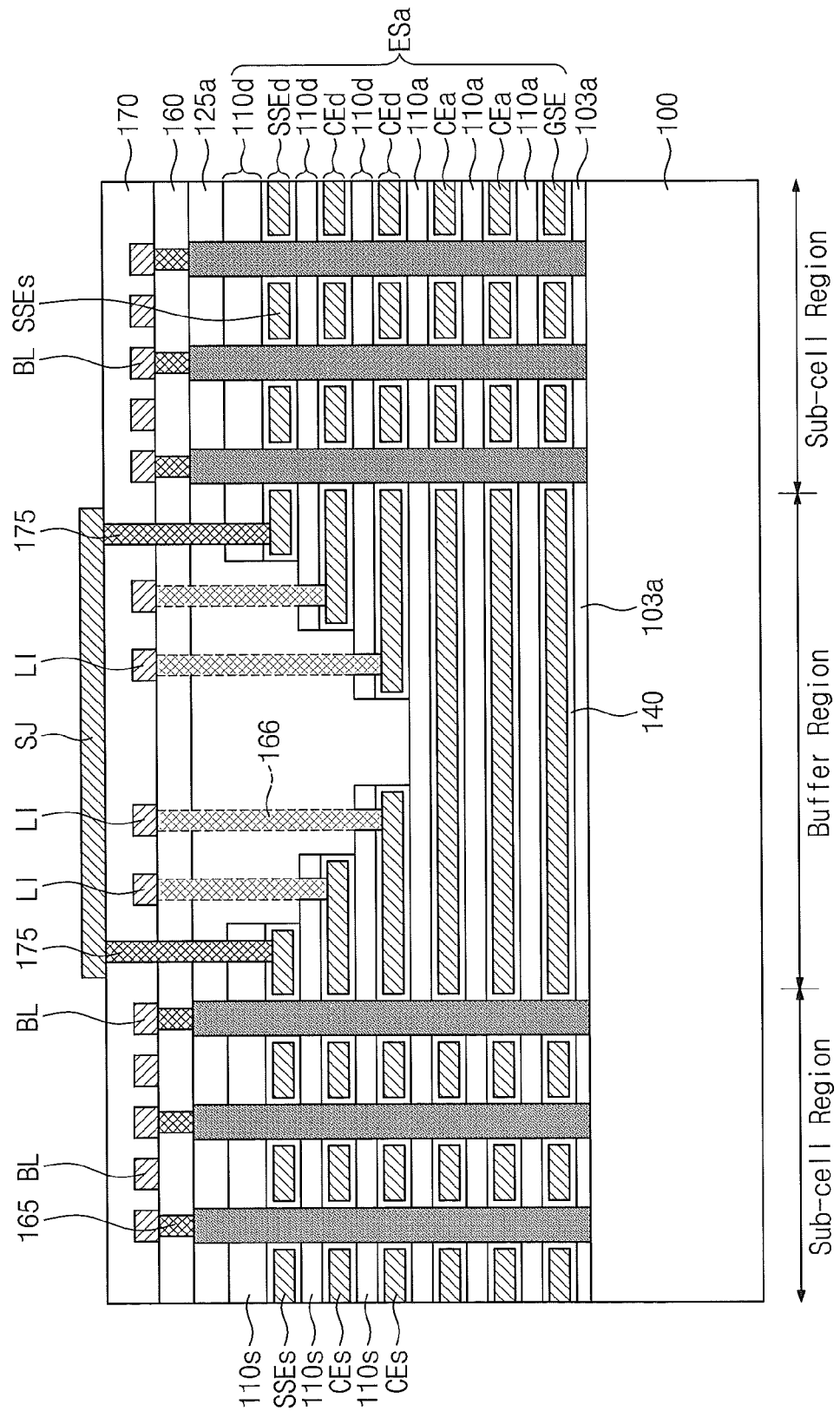
FIG. 7C is a cross sectional view taken along a line II-II' of FIG. 7A.

Subsequent processes will be described with reference to FIGS. 7A through 7D. FIG. 7A is a plan view illustrating a three-dimensional semiconductor memory device according to some embodiments of the inventive concept. FIG. 7B is a cross sectional view taken along a line I-I' of FIG. 7A, FIG. 7C is a cross sectional view taken along a line II-II' of FIG. 7A, and FIG. 7D is a cross sectional view taken along a line of FIG. 7A. FIGS. 7B, 7C and 7D are enlarged views.

Referring to FIGS. 7A through 7D, as described above, when the vertical active patterns VC of the plurality of the string groups penetrate the uppermost electrode PEd in each of the electrode structures ES, a groove 150 may be formed to penetrate the uppermost insulating pattern 105d and the uppermost electrode PEd in each of the electrode structures ES. The groove 150 may extend in the second direction. Due to the formation of the grooved 150, the uppermost electrode PEd may be divided into a plurality of string selection electrodes SSEd. The vertical active patterns VC in each of the string groups may penetrate each of the string selection electrodes SSEd. The plurality of the string selection electrodes SSEd may be spaced apart from each other in the first direction. Each of the string selection electrodes SSEd may be divided into a plurality of segments SSEs being arranged in the second direction. By the formation of the groove 150, an electrode structure ESa having the plurality of string selection electrodes SSEd may be formed. The string selection electrodes SSEd in each of the electrode structures ESa may be disposed at the same level from the top surface of the substrate 100. A dielectric pattern 155 filling the groove 150 may be formed.

Meanwhile, when the vertical active patterns VC penetrating the uppermost electrode PEd in each of the electrode structure ES illustrated in FIG. 6A constitute a single string group. The formation of the groove 150 may be omitted. In this case, the uppermost electrode PEd illustrated in FIG. 6A may be a string selection electrode.

Referring to FIGS. 7A through 7D, subsequently, a first interlayer dielectric layer 160 may be formed on an entire surface of the substrate 100. In some embodiments, the dielectric pattern 155 filling the groove 150 may be omitted, and the first interlayer dielectric layer 160 may fill the grove 150. Contact plugs 165 and 166 may be formed to penetrate the first interlayer dielectric layer 160, and bit lines BL may be formed on the first interlayer dielectric layer 160. Additionally, local interconnections LI may be formed on the first interlayer dielectric layer 160. Subsequently, a second interlayer dielectric layer 170 may be formed on the entire surface of the substrate 100, and contact plugs 175 may be formed to penetrate the second interlayer dielectric layer 170. String join interconnections SJ and floor-join interconnections FJ may be formed on the second interlayer dielectric layer 170. The segments SSEs of each of the string selection electrodes SSEd may be electrically connected to each other by the string—join interconnection SJ. The segments CEs of each of the divided cell electrodes CEd, which are disposed at the same level, may be electrically connected to each other by the floor-join interconnection FJ. The bit lines BL, the local interconnections LI and the join interconnections SJ and FJ will be described in more detail later. Thus, the three-dimensional semiconductor memory device illustrated in FIGS. 7A through 7D may be realized.

According to the method of fabricating a three-dimensional semiconductor memory device described above, after the cutting region 120 is formed to penetrate at least the uppermost insulating layer and the uppermost sacrificial layer of the mold layer 115, the vertical active patterns VC may be formed. Thus, it is possible to reduce a stress which is applied to the vertical active patterns VC due to the mold layer 115. In other words, since at least a portion of the mold layer 115 is divided by the cutting region 120, it is possible to reduce the stress of the mold layer 115 which is applied to the vertical active patterns VC. As a result, it is possible to reduce modification and/or misalignment of the vertical active patterns VC. Thus, a three-dimensional semiconductor memory device having improved reliability and high integration may be realized.

A three-dimensional semiconductor memory device according to the present embodiment will be described with reference to FIGS. 7A through 7D in more detail.

Referring still to FIGS. 7A, 7B, 7C, and 7D, bit lines BL may be disposed on the first interlayer dielectric layer 160 in the sub-cell region. The bit lines BL may extend in the first direction and cross over the electrode structures ESa. The bit lines BL may be disposed in the sub-cell regions. The bit lines BL may be electrically connected to the vertical active patterns VC penetrating each of the string selection electrodes SSEd, respectively. Each of the bit lines BL may be electrically connected to the vertical active patterns VC which are arranged in the first direction and penetrate the string selection electrodes SSEd of the electrode structures ESa, respectively. The bit lines BL may be electrically connected to the vertical active patterns via bit line contact plugs 165 penetrating the first interlayer dielectric layer 160.

The segments CEs of the divided cell electrode CEd in each of the electrode structures ESa may be electrically connected to each other by the floor-join interconnection FJ being disposed in the buffer region. In some embodiments, the segments CEs of the divided cell electrode CEd may be electrically connected to each other by the floor-join interconnection FJ and the local interconnections LI.

In more detail, a pair of the local interconnections LI may be disposed on the first interlayer dielectric layer 160 in the buffer region. In the buffer region, the pair of the local interconnections LI may be electrically connected to the extensions of the segments CEs of the divided cell electrode CEd via lower contact plugs 166, respectively. That is, one of the pair of the local interconnections LI may be electrically connected to the segment CEs in the sub-cell region located at one side of the buffer region, and the other of the pair of the local interconnections LI may be electrically connected to the segment CEs in the sub-cell region located at another side of the buffer region. The pair of the local interconnections LI may be segments CEs being disposed at the same level from the top surface of the substrate 100, respectively. The lower contact plugs 166 may successively penetrate the first interlayer dielectric layer 160 and the capping dielectric pattern 125a.

The pair of the local interconnections LI may extend in the first direction. Thus, one of the pair of the local interconnections LI may be electrically connected to segments CEs of the divided cell electrodes CEd in a plurality of the electrode structures ESa being disposed at one side of the buffer region. Here, the segments CEs connected to the one of the pair of the local interconnections LI may be disposed at the same level from the top surface of the substrate 100. The other of the pair of the local interconnections LI may be electrically connected to segments CEs of the divided cell electrodes CEd in a plurality of the electrode structures ESa being disposed at another side of the buffer region. Here, the segments CEs connected to the another of the pair of the local interconnections LI may also be disposed at the same level from the top surface of the substrate 100. As illustrated in FIG. 7D, the pair of the local interconnections LI may be electrically connected to each other by the floor-join interconnection FJ disposed on the second interlayer dielectric layer 170. The floor-join interconnection FJ may be electrically connected to the pair of the local interconnections LI via upper contact plugs 177 penetrating the second interlayer dielectric layer 170. As a result, due to the pair of the local interconnections LI and the floor-join interconnection FJ connecting those, the segments CEs of the divided cell electrodes CEd in the plurality of electrode structures ESa, which are disposed at the same level from the top surface of the substrate 100, may be electrically connected to each other. The pair of the local interconnections LI are defined as a local interconnection-pair.

As illustrated in FIGS. 7A and 7C, each of the electrode structures ESa may include a plurality of the divided cell electrodes CEd being sequentially stacked. In this case, a plurality of the floor-join interconnections FJ and a plurality of the local interconnection pairs may be disposed in the buffer region. The floor-join interconnections FJ may be electrically insulated from each other.

As illustrated in FIGS. 7C and 7D, the local interconnections LI may be disposed at the same level as the bit lines BL. However, the inventive concept is not limited thereto.

Referring to FIGS. 7A and 7C, the segments SSEs of the string selection electrode SSEd may be electrically connected to each other by the string join interconnection SJ. As described above, each of the electrode structures ESa may include the plurality of string selection electrodes SSEd being separated from each other in the first direction. In this case, the string selection electrodes SSEd in each of the electrode structures ESa are electrically insulated from each other. That is, the segments SSEs of one of the string selection electrodes SSEd in each of the electrode structures SEa may be insulated from the segments SSEs of others of the string selection electrodes SSEd in each of the electrode structures SEa. Thus, a plurality of the string join interconnections SJ may be provided over each of the electrode structures ESa. Each of the string-join interconnections SJ may connect segments SSEs of each of the string selection electrodes SSEd to each other. Each of string join interconnections SJ may be electrically connected to the segments SSEs of each of the string selection electrodes SSEd via string contact plugs 175. The string contact plugs 175 may successively penetrate the second interlayer dielectric layer 170, the first interlayer dielectric layer 160 and the capping dielectric pattern 125a.

In some embodiments, the string join interconnection SJ may be the same level as the floor-join interconnection FJ. However, the inventive concept is not limited thereto.

In some embodiments, the string-join interconnections SJ, the floor-join interconnections FJ, and the local interconnections LI may be confinedly disposed in the buffer region.

Next, modified embodiments of the three-dimensional semiconductor memory device according to the present embodiment will be described with reference to drawings.

The three-dimensional semiconductor memory device described above may include the local interconnections LI. Alternatively, the local interconnections LI may be omitted. This will be described with reference to drawings.

Figure 8A:
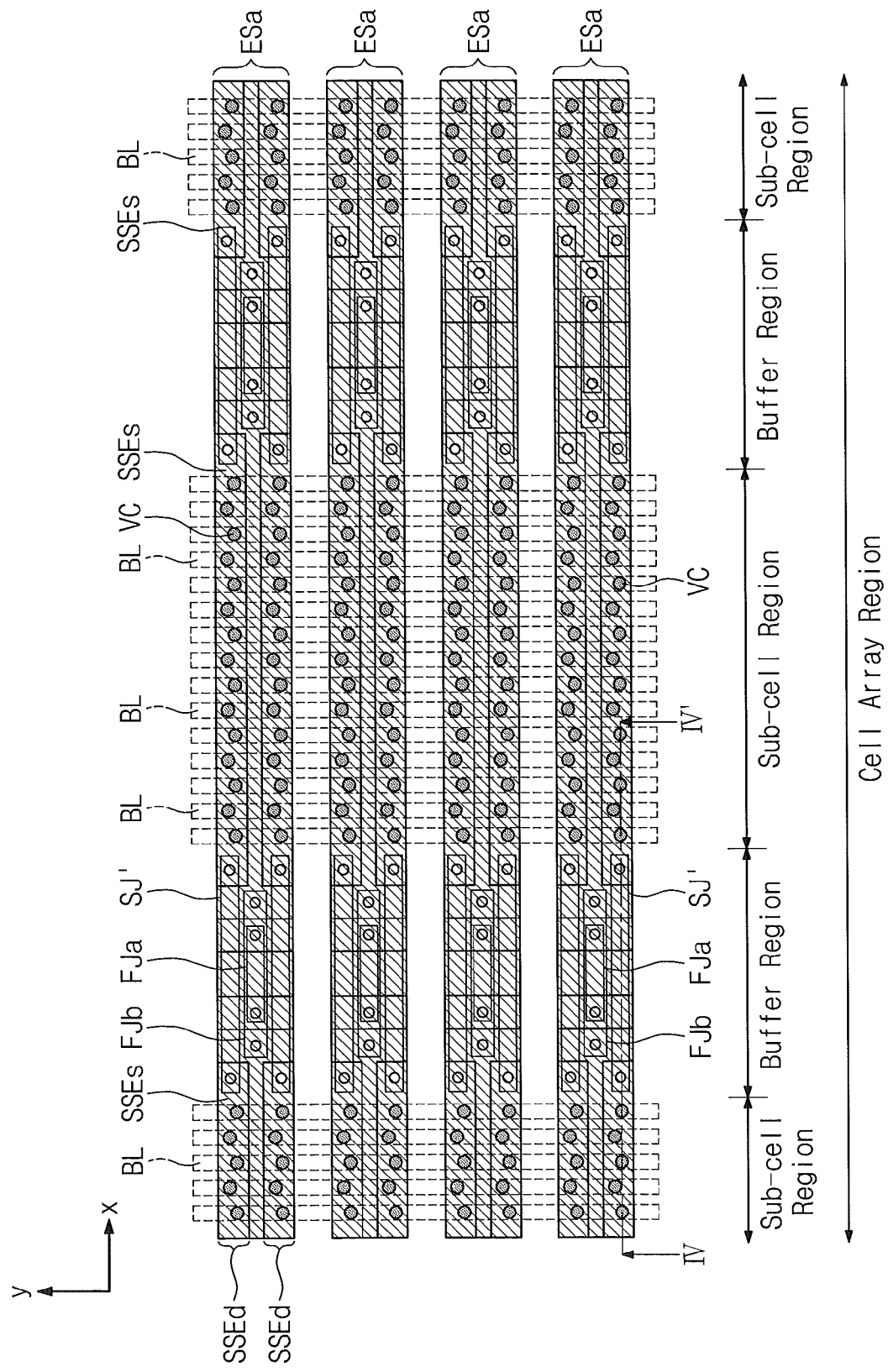
FIG. 8A is a plan view illustrating a modified embodiment of a three-dimensional semiconductor memory device according to some embodiments of the inventive concept.
Figure 8B:
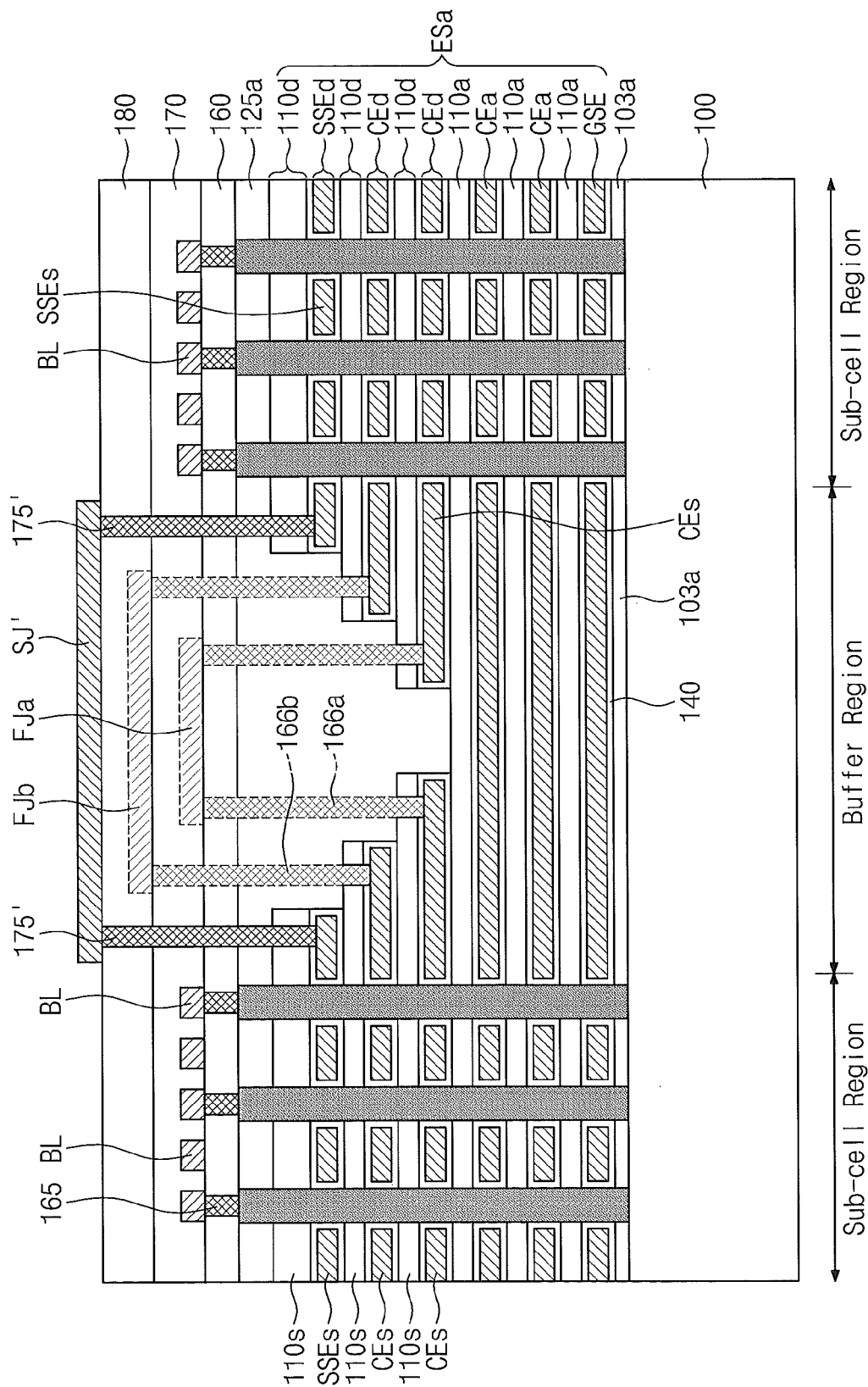
FIG. 8B is a cross sectional view taken along a line IV-IV' of FIG. 8A.

FIG. 8A is a plan view illustrating a modified embodiment of a three-dimensional semiconductor memory device according to some embodiments of the inventive concept, and FIG. 8B is a cross sectional view taken along a line IV-IV' of FIG. 8A.

Referring to FIGS. 8A and 8B, when each of the electrode structures ESa includes a plurality of the divided cell electrodes CEd being sequentially stacked, a plurality of the floor-join interconnections FJa and FJb may be disposed on each of the electrode structures ESa in the buffer region. Each of the floor-join interconnections FJa and FJb may be electrically connected to the segments CEs of each of the divided cell electrodes CEs being sequentially stacked. For example, the segments CEs connected to a first floor-join interconnection FJa may be disposed at the same level from the top surface of the substrate 100, and the segments CEs connected to a second floor-join interconnection FJb may also be disposed at the same level from the top surface of the substrate 100. Here, the segments CEs connected to the first floor-join interconnection FJa may be disposed a different level from the segments CES connected to the second floor-join interconnection FJb. The first floor-join interconnection FJa may be disposed at a different level from the second floor-join interconnection FJb with respect to the top surface of the substrate 100. In some embodiments, the segments CEs connected to the first floor-join interconnections FJa may be disposed at a lower level than the segments CEs connected to the second floor-join interconnections FJb. In this case, the first floor-join interconnection FJa may be disposed at a lower level than the second floor-join interconnection FJb. First contact plugs 166a may be disposed between the first floor-join interconnection FJa and the segments CEs connected to the first floor-join interconnection FJa. Second contact plugs 166b may be disposed between the second floor-join interconnection FJb and the segments CEs connected to the second floor-join interconnection FJb.

According to the present modified embodiment, a string-join interconnection SJ' may be disposed a higher level than the floor-join interconnections FJa and FJb. For example, a third interlayer dielectric layer 180 may be disposed on the second floor-join interconnection FJb and the second interlayer dielectric layer 170, and the string join interconnection SJ' may be disposed on the third dielectric layer 180. In this case, string contact plugs 175' may penetrate the third, second, and first interlayer dielectric layers 180, 170, and 160.

Figure 9:
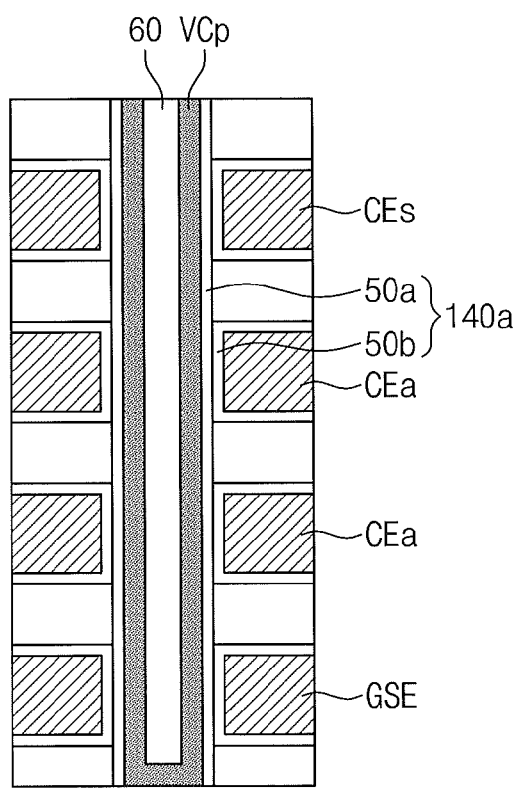
FIG. 9 is a cross sectional view illustrating another modified embodiment of a three-dimensional semiconductor memory device according to some embodiments of the inventive concept.

FIG. 9 is a cross sectional view illustrating another modified embodiment of a three-dimensional semiconductor memory device according to some embodiments of the inventive concept. FIG. 9 is enlarged view of a portion of a vertical active pattern.

Referring to FIG. 9, a vertical active pattern VCp may have a pipe shape or a macaroni shape. In this case, an inner space of the vertical active pattern VCp may be filled with a filling dielectric pattern 60. The filling dielectric pattern may include oxide, etc.

In some embodiments, an electrode-dielectric layer 140a may include a first portion 50a and a second portion 50b. The first portion 50a of the electrode-dielectric layer 140a may vertically extend to be disposed between insulating pattern and the sidewall of the vertical active pattern VCp. That is, the first portion 50a of the electrode-dielectric layer 140a may cover an entire sidewall of the vertical active pattern VCp. The second portion 50b of the electrode-dielectric layer 140a may horizontally extend to cover bottom and top surfaces of each of the electrodes GSE, CEa, CEs, and SSEs. As the electrode-dielectric layer 140 described with reference to FIGS. 6A through 6C, the electrode-dielectric layer 140a may also include a tunnel dielectric layer, a charge storage layer, and a blocking dielectric layer. Here, the first portion 50a of the electrode-dielectric layer 140a may include at least a portion of the tunnel dielectric layer, and the second portion 50b of the electrode-dielectric layer 140a may include at least a portion of the blocking dielectric layer. One of the first portion 50a and the second portion 50b of the electrode-dielectric layer 140a includes the charge storage layer. For example, the first portion 50a of the electrode-dielectric layer 140a may include the tunnel dielectric layer, the charge storage layer, and the barrier dielectric layer of the blocking dielectric layer, and the second portion 50b of the electrode-dielectric layer 140a may include the high-k dielectric layer of the blocking dielectric layer. However, the inventive concept is not limited thereto. The first portion 50a and the second portion 50b of the electrode-dielectric layer 140a may be embodied in different forms.

The first portion 50a of the electrode-dielectric layer 140a may be formed in a hole penetrating the mold layer before the vertical active pattern VCp is formed. The second portion 50b of the electrode-dielectric layer 140a may be formed after the empty regions 135a and 135s are formed and before a conductive layer filling the empty regions 135a and 135s is formed.

Figure 10:
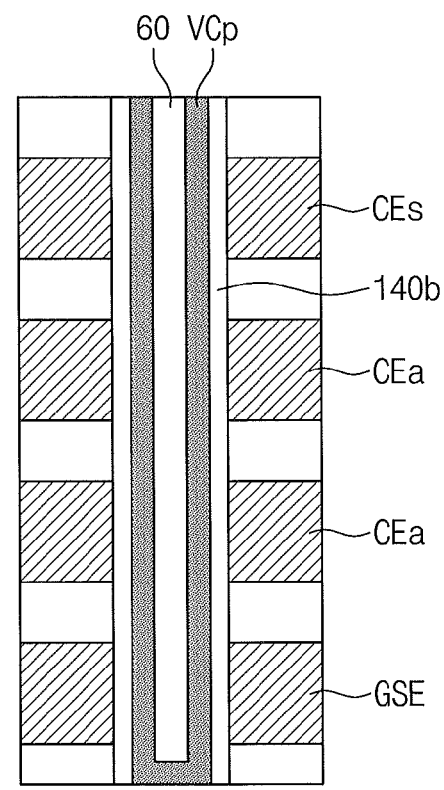
FIG. 10 is a cross sectional view illustrating still another modified embodiment of a three-dimensional semiconductor memory device according to some embodiments of the inventive concept.

FIG. 10 is a cross sectional view illustrating still another modified embodiment of a three-dimensional semiconductor memory device according to some embodiments of the inventive concept.

Referring to FIG. 10, an entire electrode-dielectric layer 1450b including the tunnel dielectric layer, the charge storage layer and the blocking dielectric layer may vertically extend to cover the entire sidewall of the vertical active pattern VCp. The electrode-dielectric layer 140b according to the present modified embodiment may be formed in a sidewall of a hole penetrating the mold layer before the vertical active pattern VCp is formed.

Second Embodiment

FIGS. 11A through 13A are plan views illustrating a method of fabricating a three-dimensional semiconductor memory device according to other embodiments of the inventive concept, and FIGS. 11B through 13B are cross sectional views taken along lines V-V' of FIGS. 11A through 13A, respectively.

Referring to FIGS. 11A and 11B, a substrate 200 may include a cell array region. As illustrated in FIGS. 11A, the cell array region may include a first edge region and a second edge region. Additionally, the cell array region may further include sub-cell regions disposed between the first and second edge regions, and a buffer region disposed between the sub-cell regions. The first and second edge regions, the sub-cell regions and the buffer region may extend in parallel along a first direction in a plan view. The first direction may correspond to a y-axis direction of FIG. 11A. The substrate 200 may be doped with dopants of a first conductivity type.

A buffer dielectric layer 203 and a mold layer 215 may be sequentially formed on the substrate 200. The mold layer 215 may include sacrificial layers 205 and insulating layers 210 which are alternately and repeatedly stacked. The buffer dielectric layer 203, the sacrificial layers 205, and the insulating layers 210 may be formed of the same materials as the buffer region 103, the sacrificial layers 105, and the insulating layers 210 in the first embodiment, respectively.

The mold layer 215 in the buffer region may be patterned to form a cutting region 220. The cutting region 220 may extend in the first direction. Both inner sidewalls of the cutting region 220 may be stepped shapes. In some embodiments, the cutting region 220 may penetrate all the insulating layers 210 and all the sacrificial layers 205 in the mold layer 215. However, the inventive concept is not limited thereto. In other embodiments, the cutting region 220 may penetrate some of the insulating layers 210 and some of the sacrificial layers 205 in the mold layer 215. The cutting region 220 may be formed by the same manners as the method of forming the cutting region 120 in the first embodiment.

The mold layer 215 in the first edge region may be patterned to form first sacrificial pads of a stepped structure. The first sacrificial pads may correspond to edge portions of the sacrificial layers 205 which are disposed in the first edge region. The mold layer 215 in the second edge region may be patterned to form second sacrificial pads of a stepped structure. The second sacrificial pads may correspond to edge portions of the sacrificial layers 205 which are disposed in the second edge region. The first and second sacrificial pads in the first and second edge regions and the cutting region 220 may be formed simultaneously.

Figure 12A:
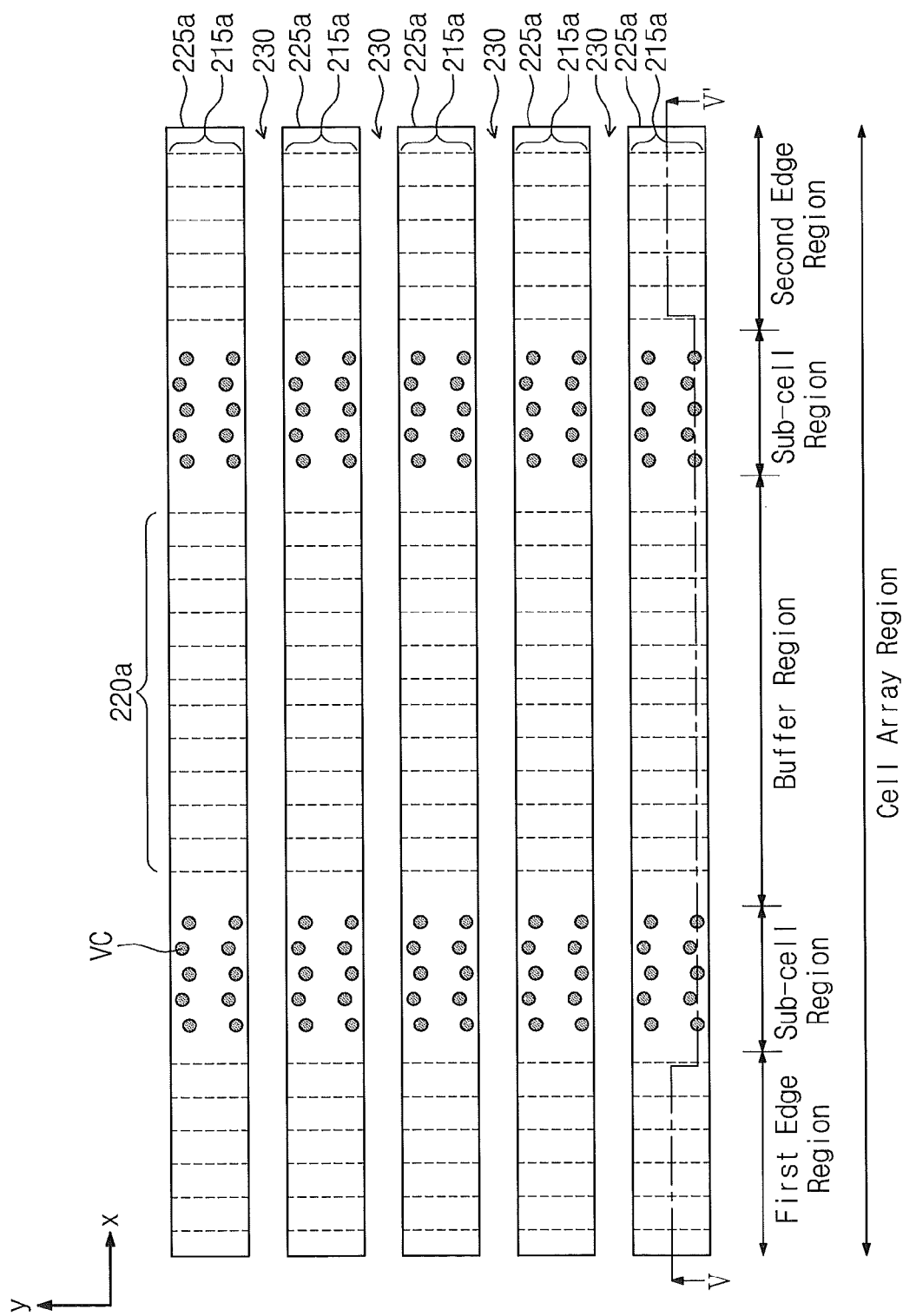
Figure 12B:
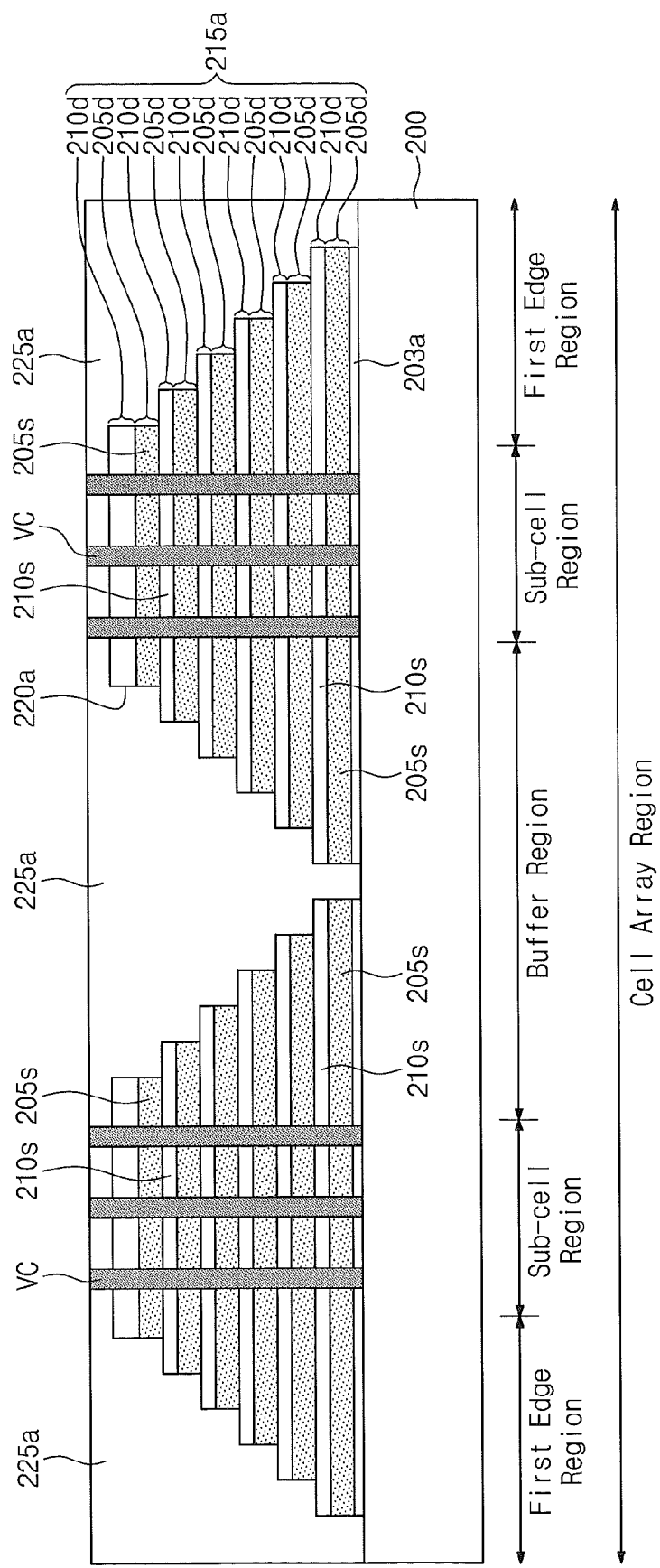

Referring to FIGS. 12A and 12B, a capping dielectric layer 225 may be formed to fill the cutting region 220. The capping dielectric layer 225 may be formed of the same material as the capping dielectric layer 125 in the first embodiment. Vertical active patterns VC may be formed to successively penetrate the capping dielectric layer 225, the mold layer 215 and the buffer dielectric layer 203. The vertical active patterns VC may be formed in the sub-cell regions.

The capping dielectric layer 225, the mold layer 215 and the buffer dielectric layer 203 may be successively patterned to form trenches 230. The trenches 230 may extend in a second direction to cross the first edge region, the sub-cell regions, the buffer region, and the second edge region. Mold patterns 215a may be formed by the formation of the trenches 230. The mold patterns 215a may also extend in the second direction. The second direction may correspond to an x-axis direction of FIG. 12A. The cutting region 230 may be divided by the formation of the trenches 230. Thus, cutting regions 220a of the mold patterns 215a may be spaced apart from each other. Additionally, the first and second sacrificial pads of the mold layer in the first and second edge regions may be divided. Thus, first sacrificial pads and second sacrificial pads of one of the mold patterns 215a may be laterally separated from first sacrificial pads and second sacrificial pads of others of the mold patterns 215a. A capping dielectric pattern 225a may fill the cutting region 220a of each of the mold patterns 215a. Also, the capping dielectric pattern 225a may cover the first sacrificial pads and the second sacrificial pads in each of the mold patterns 215a. Additionally, the capping dielectric pattern 225a may also be disposed on portions of each of the mold patterns 215a which are disposed in the sub-cell regions, respectively. A buffer dielectric pattern 203a may be formed under the mold pattern 215a by the formation of the trenches 230.

The vertical active patterns VC may be formed after the cutting region 220 of FIGS. 11A and 11B is formed. In some embodiments, after the vertical active patterns VC are formed, the trenches 230 may be formed. Alternatively, after the trenches are formed, the vertical active patterns VC may be formed.

Each of the mold patterns 215a may include sacrificial patterns 205d and insulating patterns 210d which are alternately and repeatedly stacked. Since the cutting region 220 of FIGS. 11A and 11B may penetrate an entire mold layer 215, each of the sacrificial patterns 205d in each of the mold patterns 215a may be divided into a plurality of sacrificial segments 205s being arranged in the second direction. The sacrificial segments 205s of each of the sacrificial pattern 205d may be disposed at the same level with respect to a top surface of the substrate 200. Additionally, each of the insulating patterns 210d in each of the mold patterns 215a may be divided into a plurality of insulating segments 210s being arranged in the second direction. The sacrificial segments 205s being sequentially stacked may include extensions having a stepped shape in the buffer region.

The sacrificial segments 205s, which are sequentially stacked in the sub-cell region adjacent to the first edge region, may include the first sacrificial pads of each of the mold patterns 215a. The sacrificial segments 205s, which are sequentially stacked in the sub-cell region adjacent to the second edge region, may include the second sacrificial pads of each of the mold patterns 215a.

As described above in the first embodiment, dopants of a second conductivity type may be injected into the substrate 200 under each of the trenches 230 to form a common source region. The common source region may extend in the second direction.

Figure 13A:
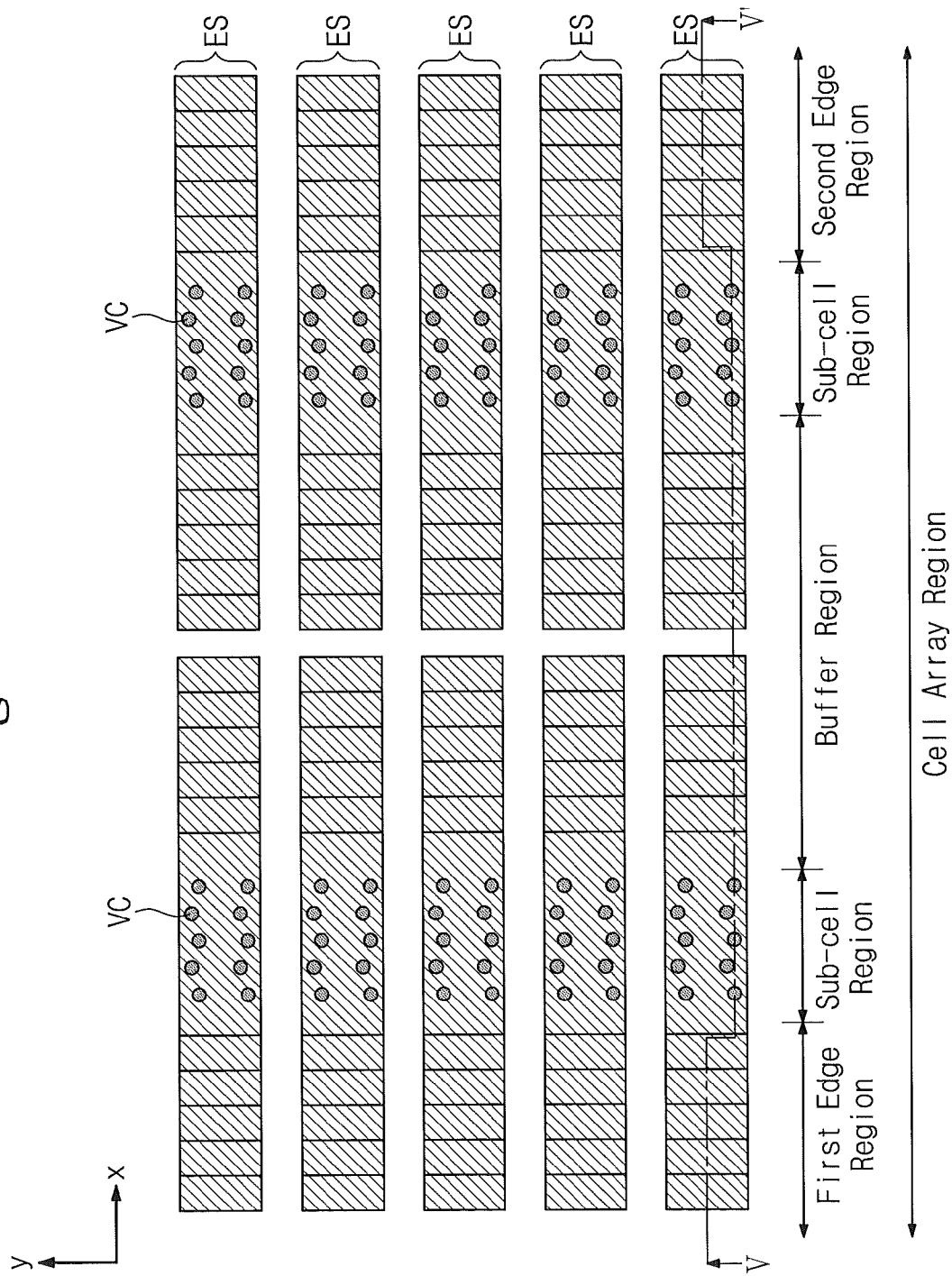
Figure 13B:
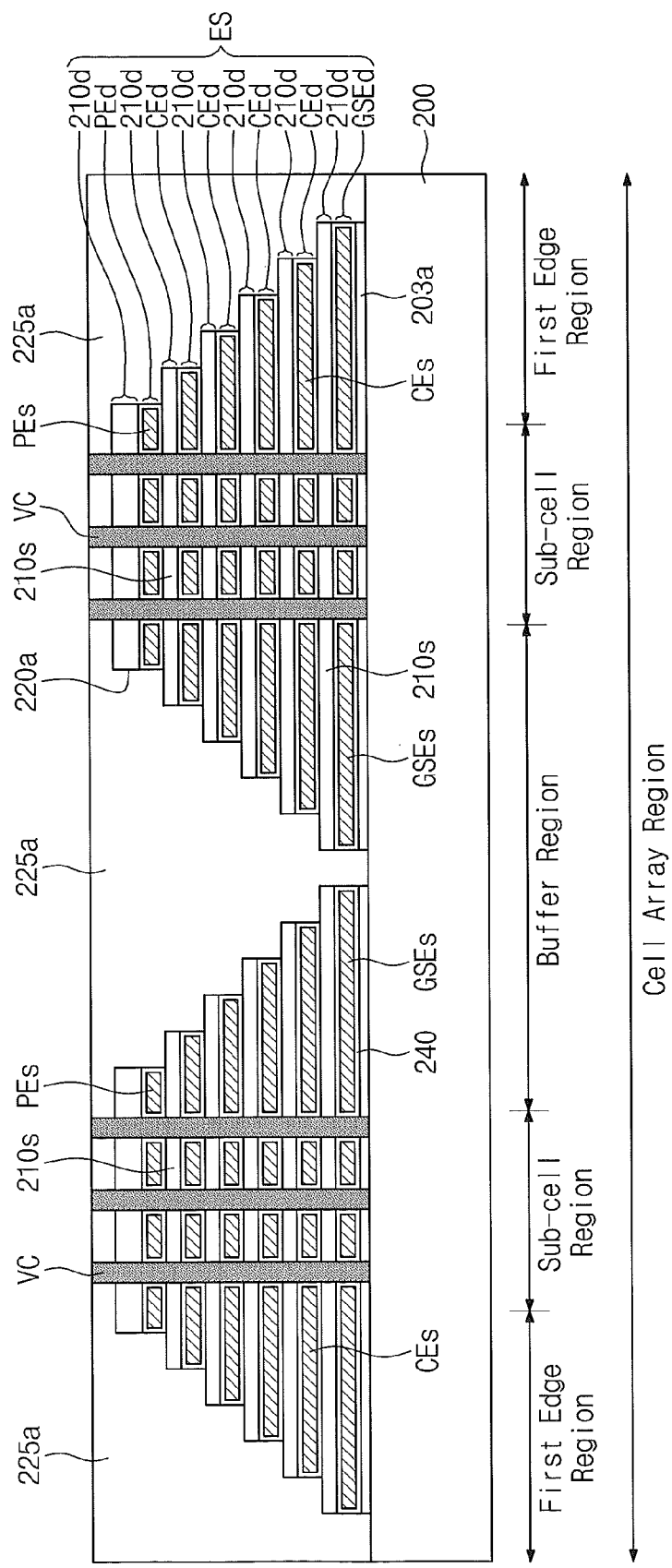

Referring to FIGS. 13A and 13B, the sacrificial patterns 205d of the mold patterns 215a may be replaced with electrodes GSEd, CEd, and PEd to form electrode structures ES. In more detail, the sacrificial patterns 205d may be removed to form empty regions, and a electrode-dielectric layer 240 may be conformally formed on the substrate 200 including the empty regions. Subsequently, a conductive layer may be formed to fill the empty regions, and the conductive layer outside the empty regions may be removed to form the electrodes GSEd, CEd, and PEd in the empty regions.

Each of the electrode structures ES may include the electrodes GSEd, CEd, and PEd and the insulating patterns 210d which are alternately and repeatedly stacked. A lowermost electrode of each of the electrode structures ES may correspond to a ground selection electrode GSEd. Each of the electrode structures ES may include an uppermost electrode PEd. Additionally, each of the electrode structures ES may include a plurality of cell electrodes CEd which are sequentially stacked between the ground selection electrode GSEd and the uppermost electrode PEd.

Due to the sacrificial patterns 205d, the uppermost electrode PEd of each of the electrode structures ES may be divided into a plurality of segments PEs arranged in the second direction. Additionally, each of the cell electrodes CEd in each of the electrode structures ES may also be divided into a plurality of segments CEs arranged in the second direction. Furthermore, the ground selection electrode GSEd of the electrode structure ES may also be divided into a plurality of segments GSEs arranged in the second direction. The cutting region 220a may be defined between the segments PEs of the uppermost electrode PEd, between the segments CEs of each of the cell electrodes CEd, and between the segments GSEs of the ground selection electrode GSEd.

Due to the sacrificial patterns 205d, each of the electrode structures ES may include first electrode pads of a stepped structure which are disposed in the first edge region. Additionally, each of the electrode structures ES may include second electrode pads of a stepped structure which are disposed in the second edge region.

As described in the first embodiment, after the electrode structures ES are formed, device isolation patterns may be formed to fill the trenches 230.

As described in the first embodiment, the vertical active patterns VC penetrating the uppermost electrode PEd in each of the electrode structures ES may be classified into a plurality of string groups.

Subsequent processes will be described with reference to FIGS. 14A and 14B.

Figure 14A:
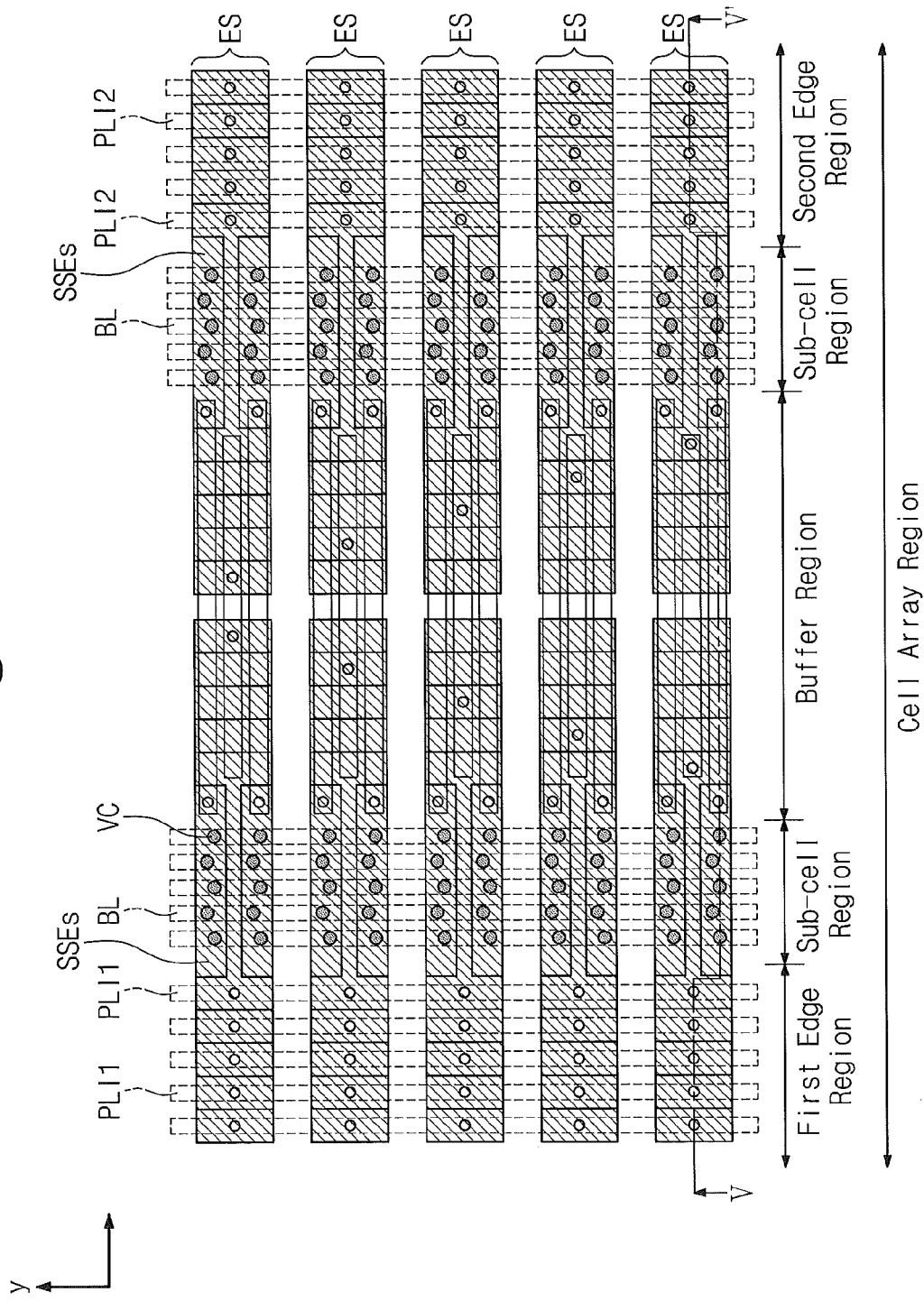
FIG. 14A is a plan view illustrating a three-dimensional semiconductor memory device according to other embodiments of the inventive concept.
Figure 14B:
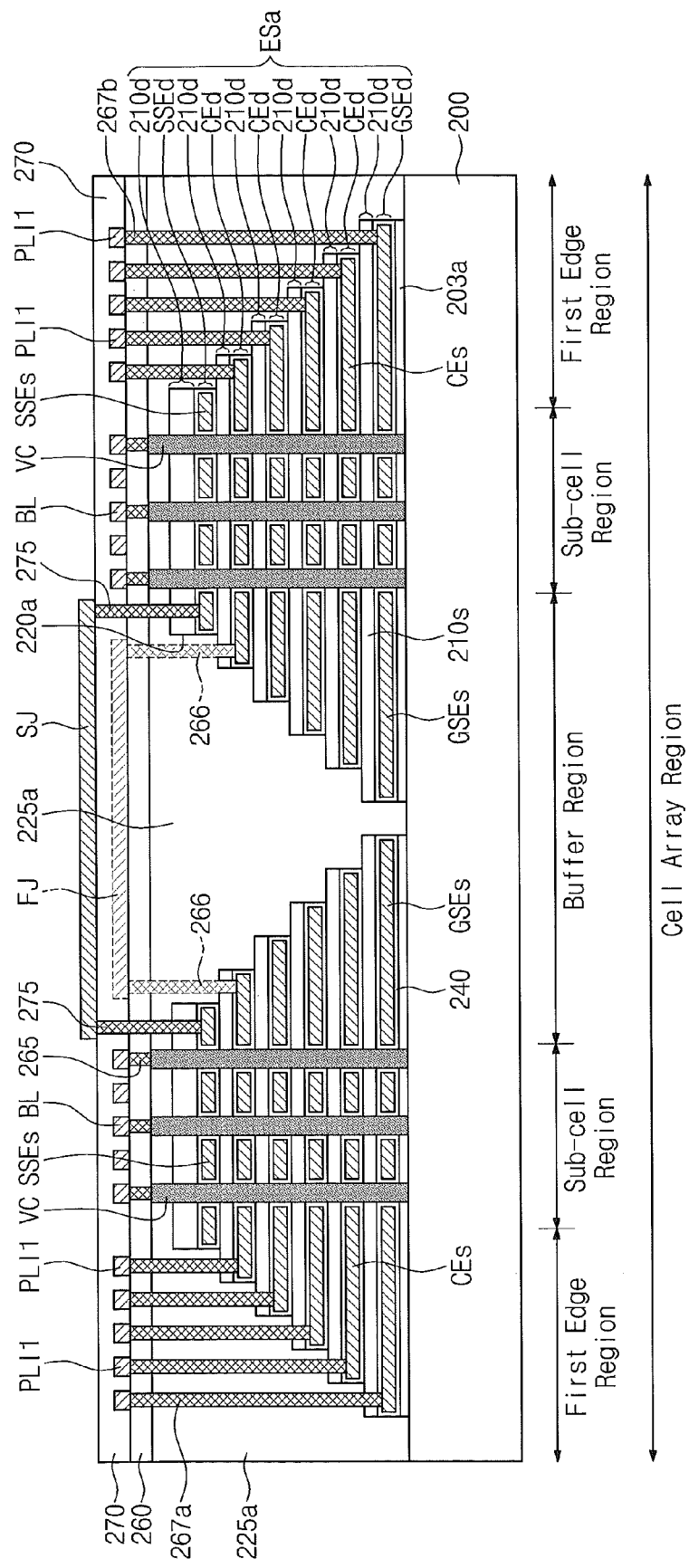
FIG. 14B is a cross sectional view taken along a line V-V' of FIG. 14A.

Referring to FIGS. 14A and 14B, the capping dielectric pattern 225a, an uppermost insulating pattern 210 and the uppermost electrode PEd may be patterned to form a groove extending in the second direction. Thus, as illustrated in FIG. 14A, electrode structures ESa may be formed. Each of the electrode structures ESa may include a plurality of string selection electrodes SSEd. Each of the string selection electrodes SSEd may be divided into a plurality of segments SSEs arranged in the second direction. The string selection electrodes SSEd in each of the electrode structures ESa may be disposed at the same level with respect to the top surface of the substrate 200. The vertical active patterns VC included in one string group may penetrate each of the string selection electrodes SSEd.

Subsequently, a first interlayer dielectric layer 260 may be formed on the substrate 200. The first interlayer dielectric layer 260 may fill the groove separating the string selection electrodes SSEd from each other. Alternatively, before the first interlayer dielectric layer 260 is formed, a dielectric pattern may be formed to fill the groove.

Subsequently, contact plugs 265, 266, 267a, and 267b may be formed to penetrate the first interlayer dielectric layer 260. Pad local interconnections PLI1 and PLI2, bit lines BL, and floor-join interconnections FJ may be formed on the first interlayer dielectric layer 260. Next, a second interlayer dielectric layer 270 may be formed on the substrate 200, and contact plugs 275 may be formed to penetrate the second interlayer dielectric layer 270. Subsequently, string-join interconnections SJ may be formed on the second interlayer dielectric layer 270. The pad local interconnections PLI1 and PLI2, the floor-join interconnections FJ and the string join interconnections SJ will be described in more detail later.

In the method of fabricating the three-dimensional semiconductor memory device according to the present embodiment, before the vertical active patterns VC are formed, the cutting region 220 of FIGS. 11A and 11B may be formed. Thus, it is possible to minimize a stress caused by the mold layer 215. As a result, the three-dimensional semiconductor memory device with improved reliability and high integration may be realized.

Next, the three-dimensional semiconductor memory device according to the present embodiment will be described with reference to FIGS. 14A and 14B in more detail.

FIG. 14A is a plan view illustrating a three-dimensional semiconductor memory device according to other embodiments of the inventive concept, and FIG. 14B is a cross sectional view taken along a line V-V' of FIG. 14A. For the purpose of ease and convenience in explanation, the descriptions described above will be omitted or mentioned briefly.

Referring to FIGS. 14A and 14B, first pad local interconnections PLI1 may be disposed on the first interlayer dielectric layer 260 in the first edge region. The number of the first pad local interconnections PLI1 in the first edge region may be equal to the number of the ground selection electrode GSEd and the cell electrodes CEd being sequentially stacked in each of the electrode structures ESa. The first pad local interconnections PLI1 may extend in parallel in the first direction. Each of the first local interconnections PLI1 may be electrically connected to the first electrode pads which are disposed in the first edge region and are disposed at the same level from the top surface of the substrate 200. The first electrode pads connected to each of the first pad local interconnections PLI1 may be included in the plurality of the electrode structures ESa, respectively. The first electrode pads connected to one of the first pad local interconnections PLI1 are disposed at a different level from the first electrode pads connected to others of the first pad local interconnections PLI1. The first pad local interconnections PLI1 are insulated from each other. The first pad local interconnections PLI1 may be connected to the first electrode pads via first pad contact plugs 267a successively penetrating the first interlayer dielectric layer 260 and the capping dielectric pattern 225a.

Second pad local interconnections PLI2 may be disposed on the first interlayer dielectric layer 260 in the second edge region. The number of the second pad local interconnections PLI2 may be equal to the number of the ground selection electrode GSEd and the cell electrodes CEd being sequentially stacked in each of the electrode structures ESa. The number of the second local interconnections PLI2 is equal to the number of the first local interconnections PLI1. The second pad local interconnections PLI2 may also extend in parallel in the first direction. Each of the second local interconnections PLI2 may be electrically connected to the second electrode pads which are disposed in the second edge region and are disposed at the same level from the top surface of the substrate 200. The second electrode pads connected to each of the second pad local interconnections PLI2 may be included in the plurality of the electrode structures ESa, respectively. The second electrode pads connected to one of the second pad local interconnections PLI2 are disposed at a different level from the second electrode pads connected to others of the second pad local interconnections PLI2. The second pad local interconnections PLI2 are insulated from each other. The second pad local interconnections PLI2 may be connected to the second electrode pads via second pad contact plugs 267b successively penetrating the first interlayer dielectric layer 260 and the capping dielectric pattern 225a.

A plurality of the floor-join interconnections FJ may be disposed on the first interlayer dielectric layer 260 in the buffer region. In some embodiment, the plurality of the floor-join interconnections FJ may be disposed over the plurality of the electrode structures ESa, respectively. Each of the floor-join interconnections FJ may be electrically connected to the segments CEs or GSEs of one of the cell electrodes CEd and the ground selection electrode GSEd in the electrode structure ESa thereunder. Here, the electrode CEd or GSEd connected to one of the floor-join interconnections FJ may be disposed at a different level from the electrodes CEd and/or GSEd connected to others of the floor-join interconnections FJ.

As described above, the segments CEs or GSEs, which are disposed at the same level in the sub-cell region adjacent to the first edge region, may be connected to each other by each of the first pad local interconnections PLI1. Additionally, the segments CEs or GSEs, which are disposed at the same level in the sub-cell region adjacent to the second edge region, may be connected to each other by each of the second pad local interconnections PLI2. Here, since each of the floor-join interconnections FJ connects the segments CEs or GSEs being disposed at the same level in the buffer region, the segments GSEs of the ground selection electrodes GSEd or the segments CEs of the cell electrodes CEd, which are disposed at the same level in the cell array region, may be electrically connected to each other.

As a result, even though the cell electrode CEd and the ground selection electrode GSEd in each of the electrode structures ESa is divided, the divided segments CEs or GSEs may be electrically connected to each other.

The bit lines BL may be disposed on the first interlayer dielectric layer 260 in the sub-cell region. The bit lines BL may extend in the first direction. The bit lines BL may be electrically connected to the vertical active patterns VC via bit line contact plugs 265 penetrating the first interlayer dielectric layer 260. The bit lines BL may be disposed at the same level as the pad local interconnections PLI1 and PLI2 and/or the floor-join interconnections FJ. However, the inventive concept is not limited thereto.

The second interlayer dielectric layer 270 may be disposed on the bit lines BL, the pad local interconnections PLI1 and PLI2, and the floor-join interconnections FJ. The string-join interconnections SJ may be disposed on the second interlayer dielectric layer 270 in the buffer region. Each of the string join interconnections SJ may electrically connect the segments SSEs of each of the string selection electrode SSEd to each other.

In some embodiments, the local interconnections LI and the floor-join interconnections described with reference to FIGS. 7A through 7D of the first embodiment may be applied to the three-dimensional semiconductor memory device of FIGS. 14A and 14B.

The modified embodiments of the first embodiment may be applied to the three-dimensional semiconductor memory device of FIGS. 14A and 14B.

Third Embodiment

FIGS. 15A through 17A are plan views illustrating a method of fabricating a three-dimensional semiconductor memory device according to still other embodiments of the inventive concept, FIGS. 15B through 17B are merged cross sectional views taken along lines VI-VI' and VII-VII' of FIGS. 15A through 17A, respectively, and FIGS. 15C through 17C are cross sectional views taken along lines VIII-VIII' of FIGS. 15A through 17A, respectively.

Figure 15A:
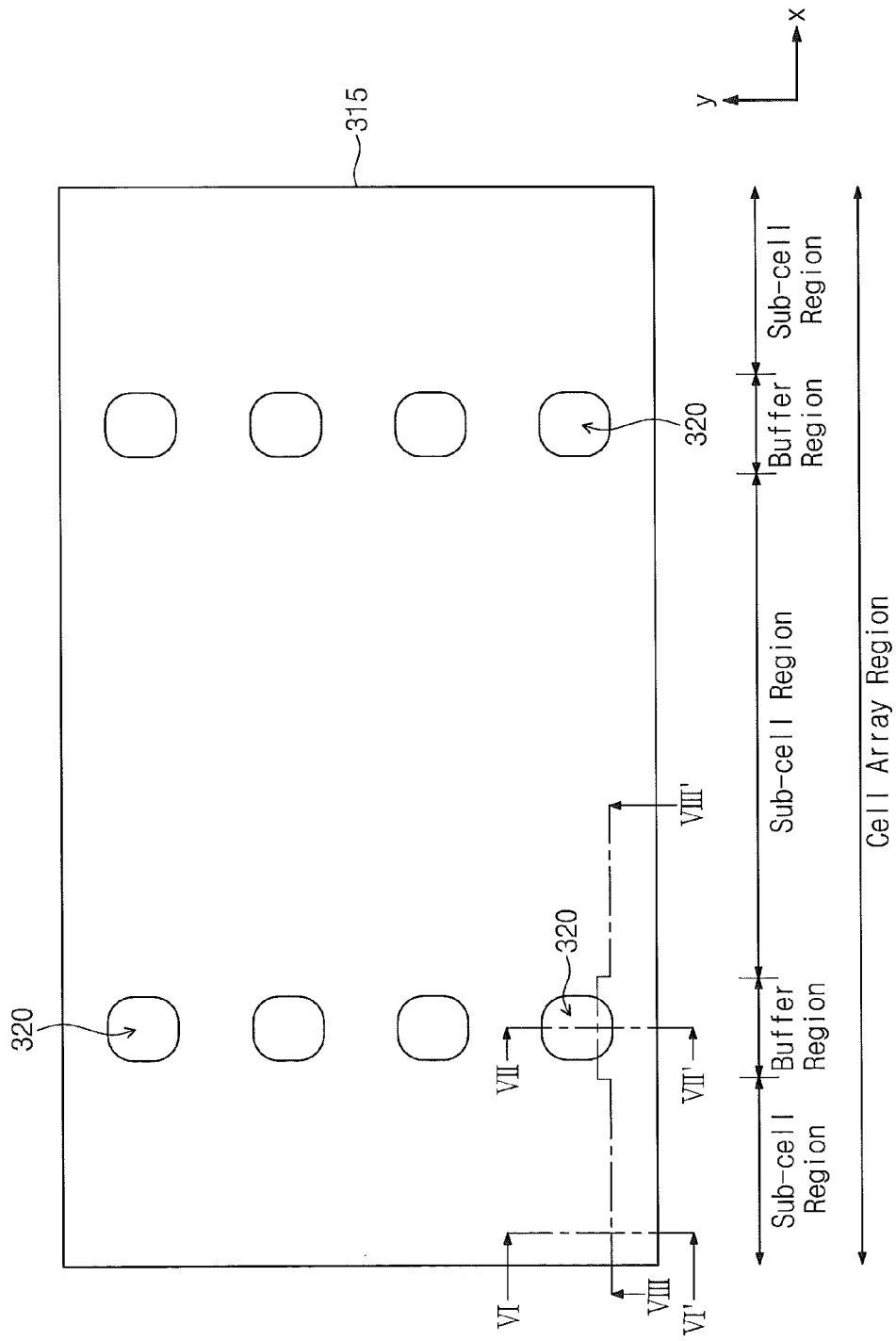
Figure 15B:
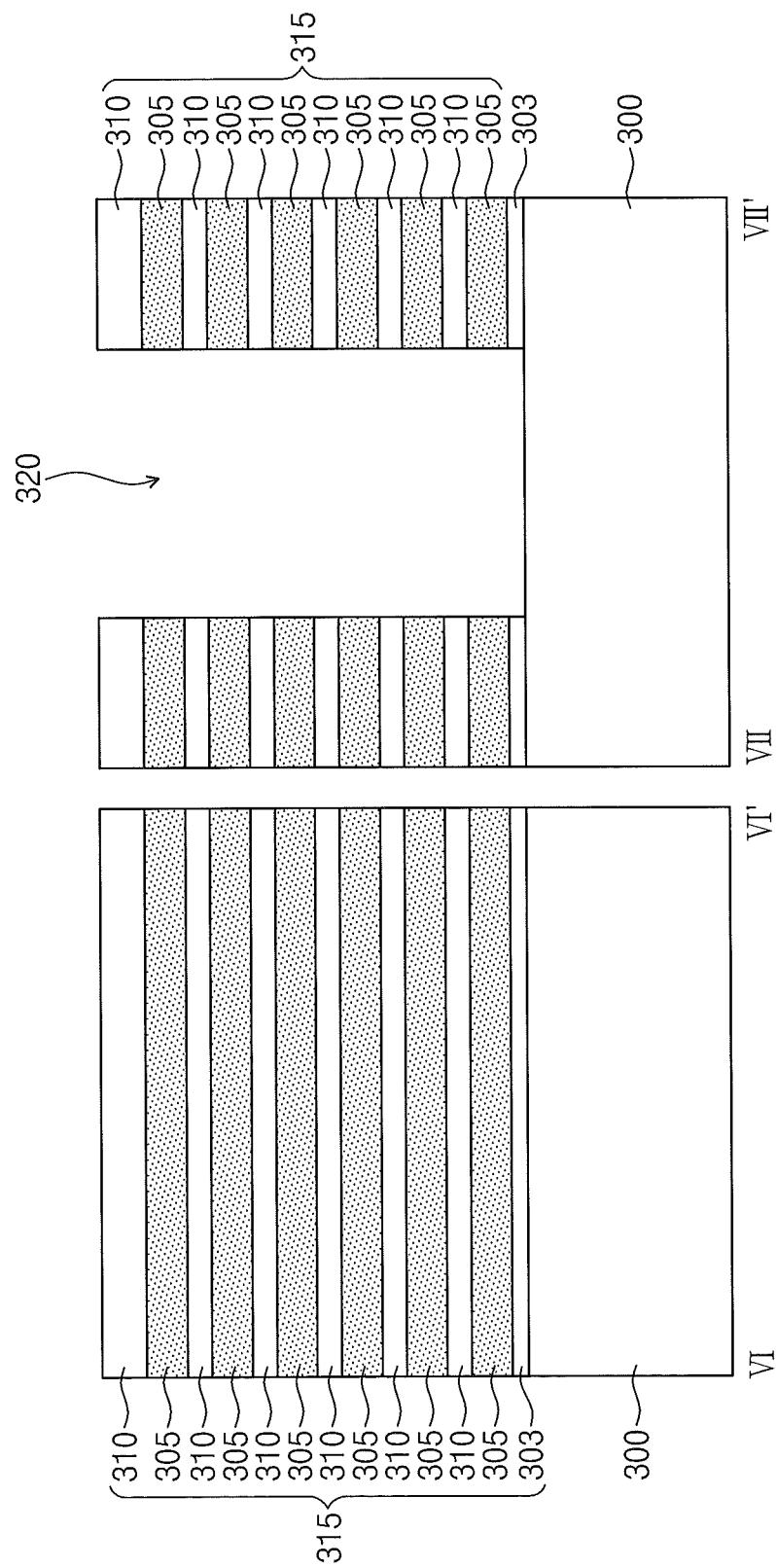
Figure 15C:
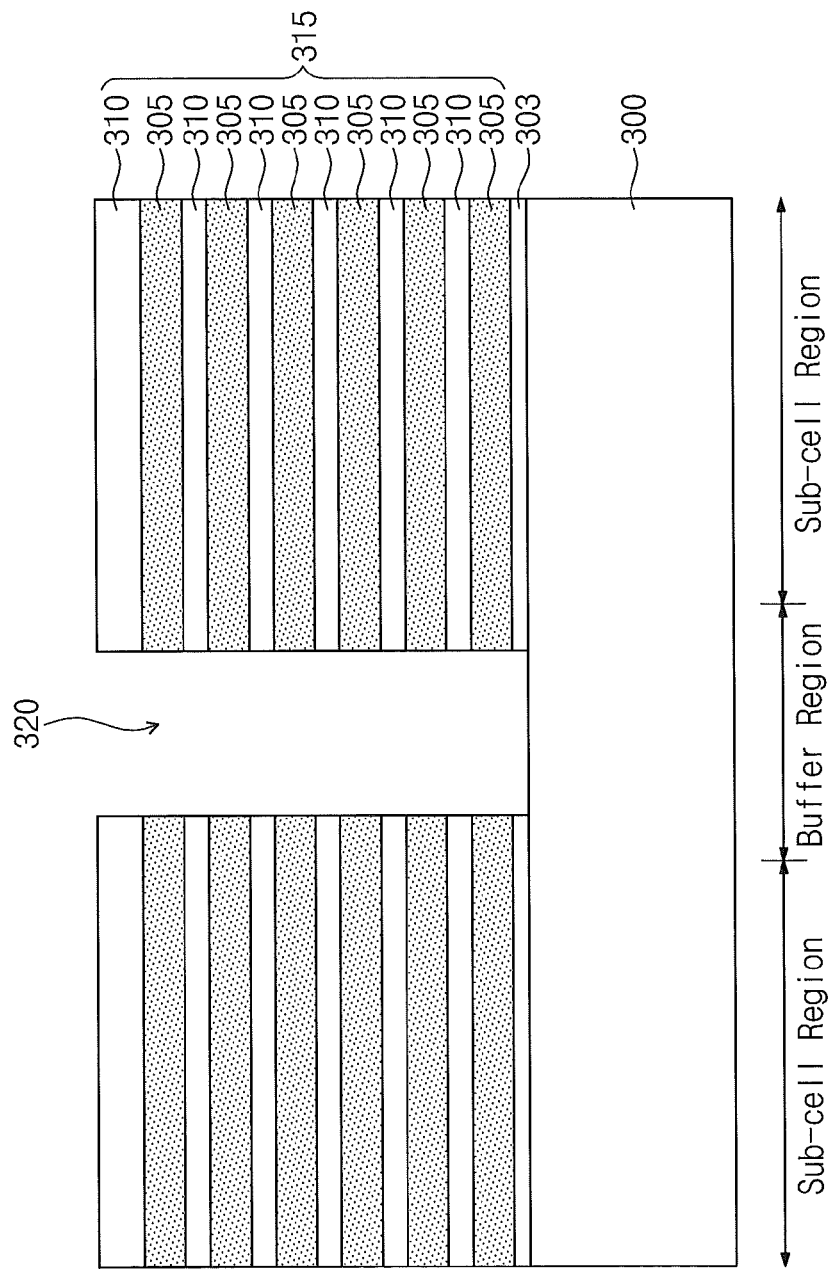

Referring to FIGS. 15A, 15B, and 15C, a substrate 300 may include a cell array region. The cell array region may include sub-cell regions, and a buffer region between the sub-cell regions. As illustrated in FIG. 15A, the cell array region may include a plurality of the buffer regions.

A buffer dielectric layer 303 and the mold layer 315 may be sequentially formed on the substrate 300. The mold layer 315 may include sacrificial layers 305 and insulating layers 310 which are alternately and repeatedly stacked. The buffer dielectric layer 303, the sacrificial layers 305, and the insulating layers 310 may be formed of the same materials as the buffer region 103, the sacrificial layers 105, and the insulating layers 210 in the first embodiment, respectively.

The mold layer 315 may be patterned to form a plurality of buffer holes 320 in each of the buffer regions. The buffer holes 320 in each of the buffer regions may be arranged in a first direction. The buffer holes 320 in each of the buffer regions may be spaced apart from each other. The first direction may correspond to a y-axis direction of FIG. 15A. In some embodiments, as illustrated in FIGS. 15B and 15C, the buffer holes 320 may successively penetrate the mold layer 315 and the buffer dielectric layer 303. However, the inventive concept is not limited thereto. In other embodiments, the buffer holes 320 may penetrate some of the insulating layers 310 and some of the sacrificial layers 305. In this case, bottom surfaces of the buffer holes 320 may be disposed at a higher level than a top surface of a lowermost sacrificial layer 305 in the mold layer 315.

Figure 16A:
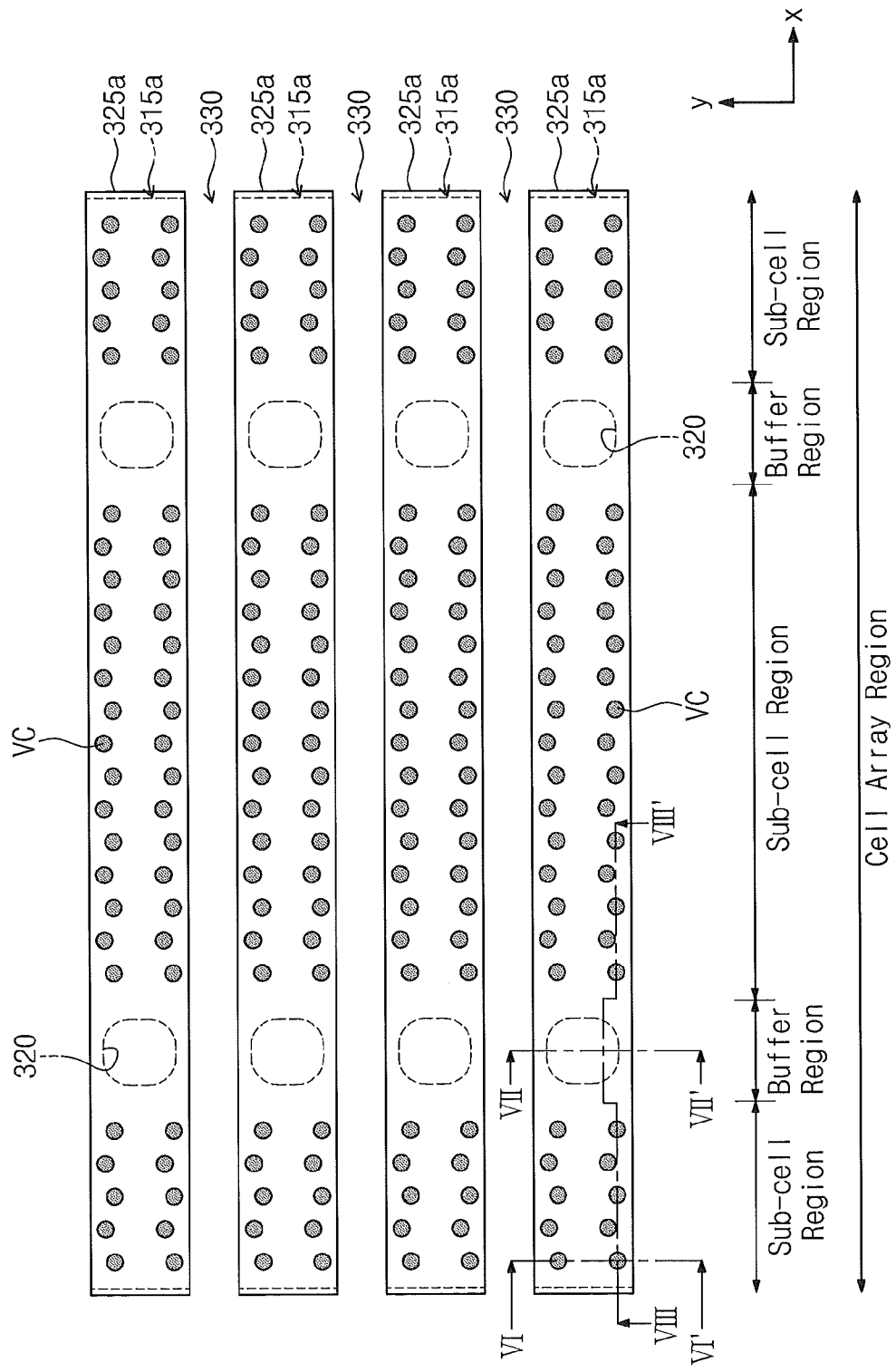

Referring to FIGS. 16A, 16B, and 16C, a capping dielectric layer may be formed on the substrate 300 to fill the buffer holes 320. A portion of the capping dielectric layer, which fills each of the buffer holes 320, is defined as a filling portion 325f. Vertical active patterns VC may be formed to successively penetrate the capping dielectric layer, the mold layer 315 and the buffer dielectric layer 303. The capping dielectric layer, the mold layer 315 and the buffer dielectric layer 303 may be successively patterned to form trenches 330. The trenches 330 may extend in a second direction when viewed from a top view. The second direction may correspond to an x-axis direction of FIG. 16A. A buffer dielectric pattern 303a, a mold pattern 315a, and a capping dielectric pattern 325a may be formed between a pair of the trenches 330 adjacent to each other. A plurality of the mold patterns 315a may be formed on the substrate 300, and the mold patterns 315a may extend in parallel along the second direction.

Each of the mold patterns 315a may include sacrificial patterns 305a and insulating patterns 310a which are alternately and repeatedly stacked. Each of the trenches 330 may pass between a pair of the buffer holes 320 adjacent to each other. Thus, each of the mold patterns 315a may include the buffer hole 320 and the filling portion 325f filling the buffer hole 320. The buffer hole 320 may penetrate the insulating patterns 310a and the sacrificial patterns 305a in the buffer region, and the insulating patterns 310a and the sacrificial patterns 305a in the buffer region may surround a sidewall of the filling portion 325f. The capping dielectric pattern 325a including the filling portion 325f may be formed of the same material as the capping dielectric pattern 125a described in the first embodiment. Common source regions CSR may be formed in the substrate 300 under the trenches 330, respectively.

The vertical active patterns VC may penetrate the mold patterns 315a. After the buffer holes 320 are formed, the vertical active patterns VC are formed. The vertical active patterns VC may be formed before or after the mold patterns 315a are formed.

Figure 17B:
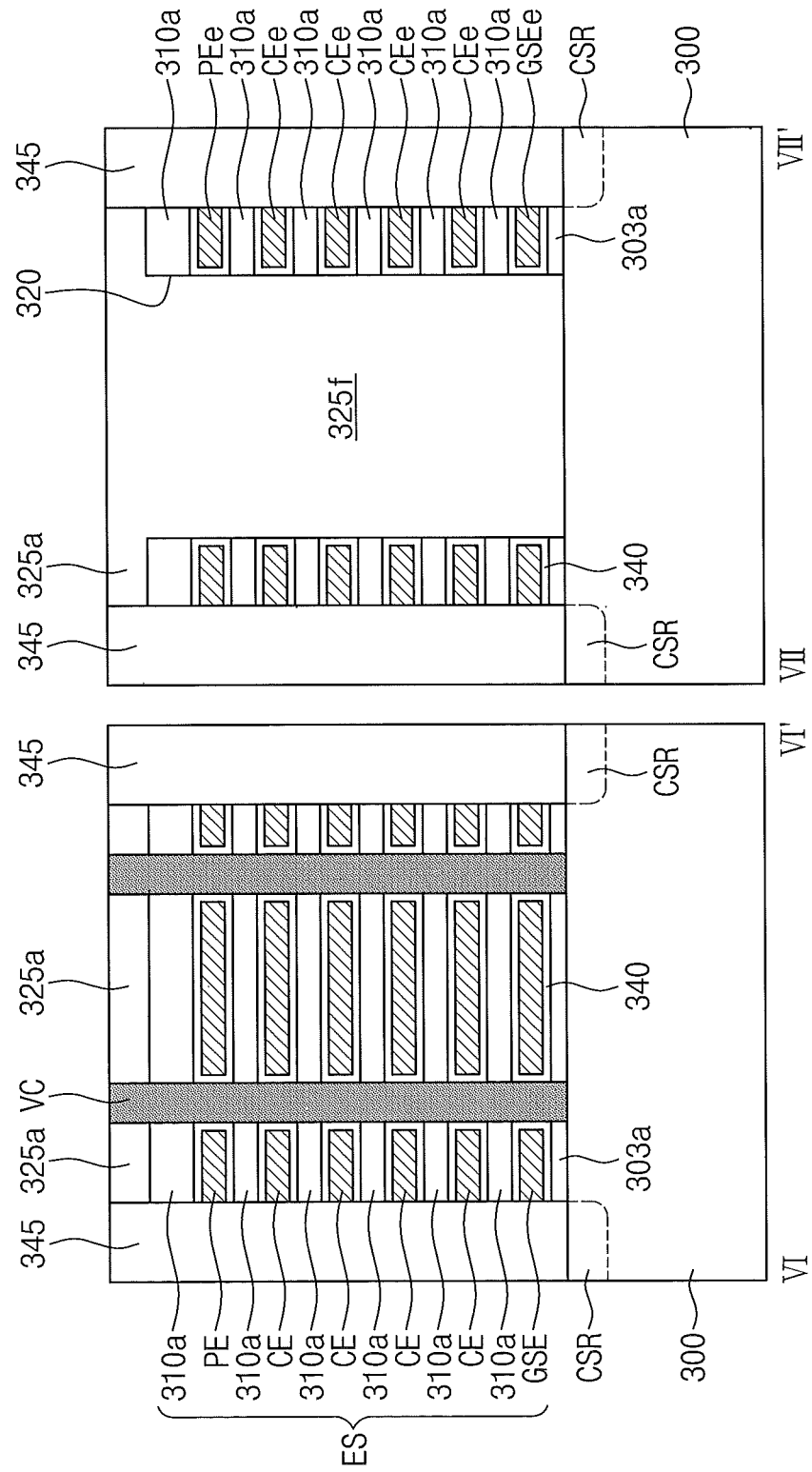
Figure 17C:
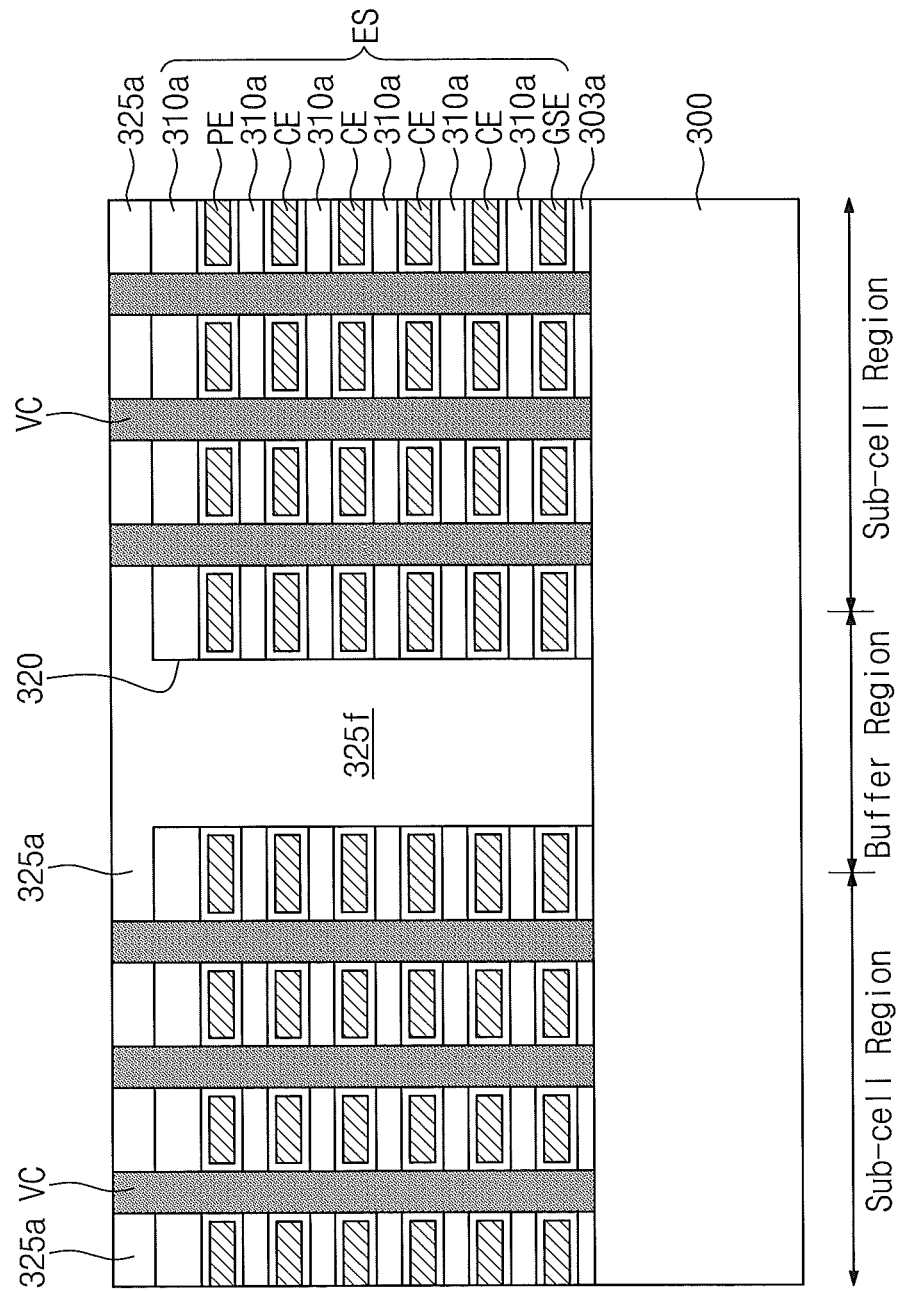

Referring to FIGS. 17A, 17B, and 17C, the sacrificial patterns 310a may be replaced with electrodes GSE, CE, and PE. For example, the sacrificial patterns 310a may be removed to form empty regions. An electrode-dielectric layer 340 may be conformally formed on the substrate 300 including the empty regions. Subsequently, a conductive layer may be formed to fill the empty regions, and the conductive layer outside the empty regions may be removed to form the electrodes GSE, CE, and PE. Thus, electrode structures. ES including the electrodes GSE, CE, and PE may be formed.

Each of the electrode structures ES may include the electrodes GSE, CE, and PE and the insulating patterns 310a which are alternately and repeatedly stacked. The filling portion 325f may fill the buffer hole 320 penetrating the electrode structure ES in the buffer region. The electrodes GSE, CE, and PE in each of the electrode structures ES may include a ground selection electrode GSE, cell electrodes CE, and an uppermost electrode PE. The electrodes GSE, CE, and PE in each of the electrode structures ES may include connection portions GSEe, CEe, and PEe disposed at both sides of the filling portion 325f in the buffer region, respectively.

Device isolation patterns 345 may be formed to fill the trenches 330, respectively. Subsequent processes will be described with reference to FIGS. 18A, 18B, and 18C.

Figure 18A:
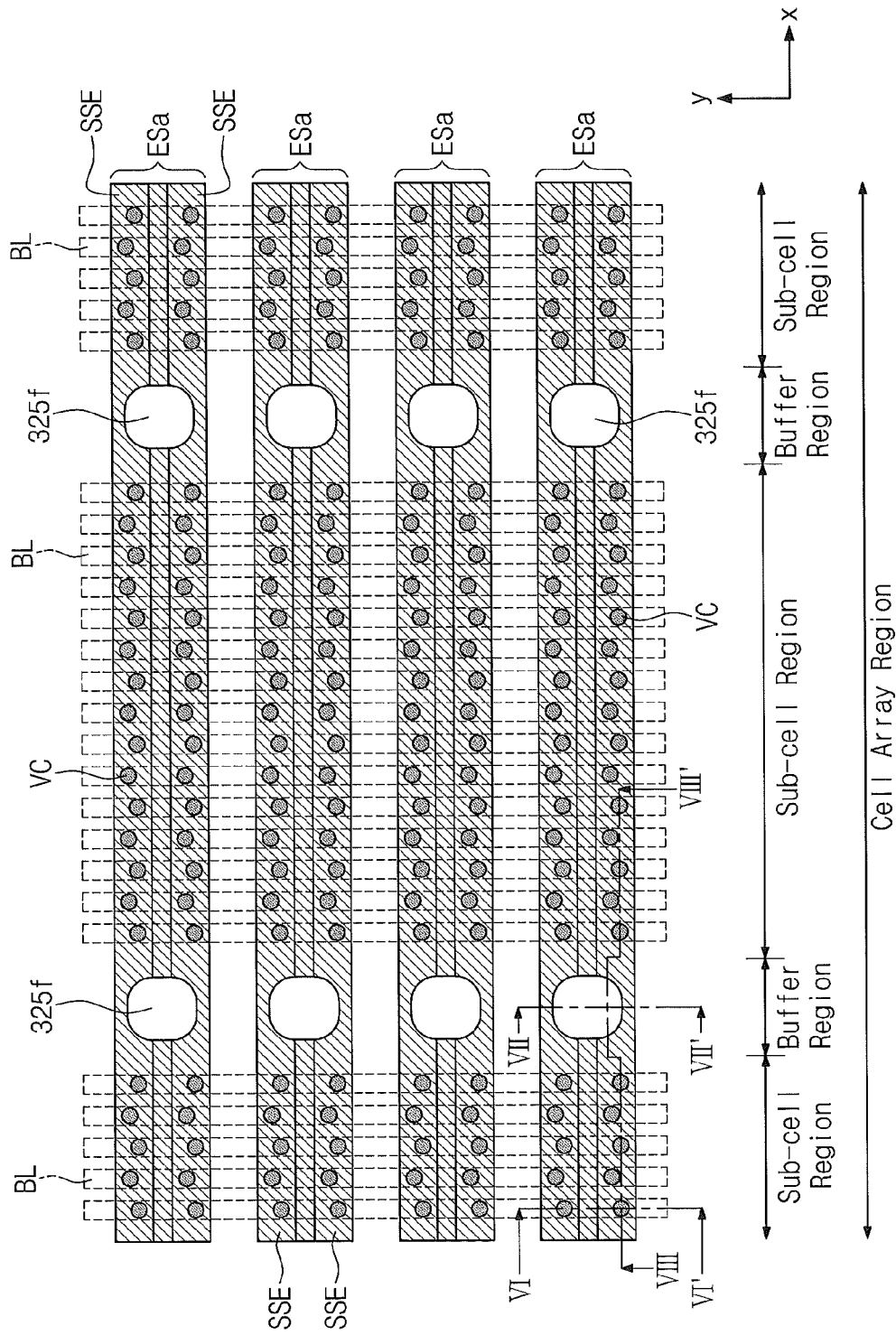
FIG. 18A is a plan view illustrating a three-dimensional semiconductor memory device according to still other embodiments of the inventive concept.
Figure 18B:
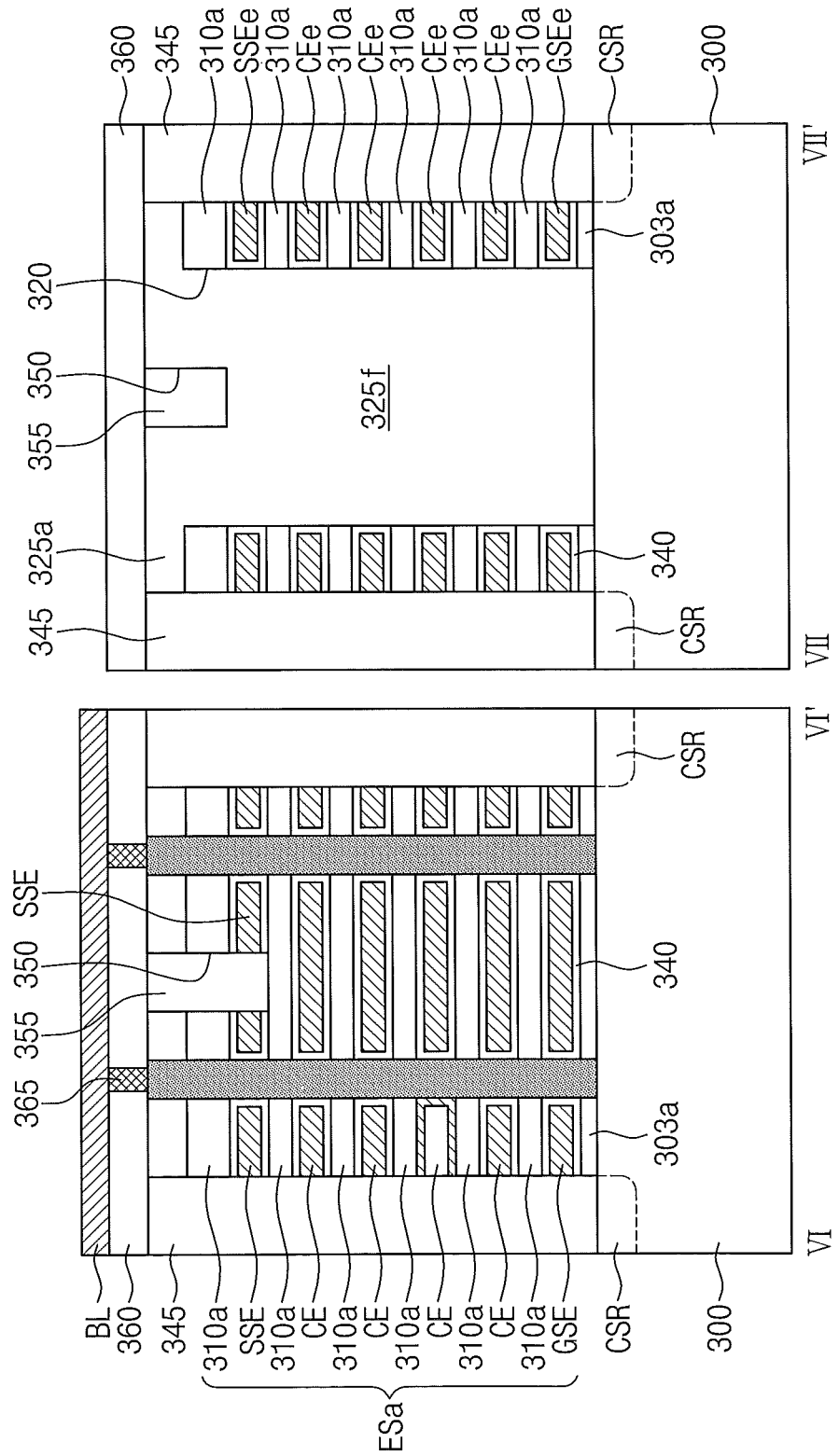
FIG. 18B is a merged cross sectional view taken along lines VI-VI' and VII-VII' of FIG. 18A.

Referring to FIGS. 18A, 18B, and 18C, when the vertical active patterns VC penetrating each of the electrode structures ES are classified into a plurality of string groups, the capping dielectric pattern 325a, an uppermost insulating pattern 310a and the uppermost electrode PE may be successively patterned to form a groove 350. Thus, the uppermost electrode PE may be divided into a plurality of string selection electrodes SSE. As a result, electrode structures ESa may be formed. Each of the electrode structures ESa may include the plurality of string selection electrodes SSE. The groove 350 may extend in the second direction in a plan view. A dielectric pattern 355 may be formed to fill the groove 350. Subsequently, an interlayer dielectric layer 360 may be formed on the substrate 300. In some embodiments, the dielectric pattern 355 filling the groove 350 may be omitted, and the interlayer dielectric layer 360 may fill the groove 350.

Contact plugs 365 may be formed to penetrate the interlayer dielectric layer 360. The contact plugs 365 may be connected to top ends of the vertical active patterns VC, respectively. Bit lines BL may be formed on the interlayer dielectric layer 360. The bit lines BL may extend in the first direction. The bit lines BL may be electrically connected to the vertical active patterns VC via the contact plugs 365.

According to the method of fabricating the three-dimensional semiconductor memory device described above, before the vertical active patterns VC are formed, the mold layer 315 may be patterned to the buffer holes 320. The buffer holes 320 may buffer a stress of the mold layer 315. Thus, the stress of the mold layer 315 may be minimized, so that the three-dimensional semiconductor memory device with improved reliability and high integration may be realized.

Next, the three-dimensional semiconductor memory device according to the present embodiment will be described with reference to FIGS. 18A through 18C in more detail.

FIG. 18A is a plan view illustrating a three-dimensional semiconductor memory device according to still other embodiments of the inventive concept, FIG. 18B is a merged cross sectional view taken along lines VI-VI' and VII-VII' of FIG. 18A, and FIG. 18C is a cross sectional view taken along a line VIII-VIII' of FIG. 18A. For the purpose of ease and convenience in explanation, the descriptions described above will be omitted or mentioned briefly.

Referring to FIGS. 18A, 18B, and 18C, the electrode structures ESa may extend in parallel on the substrate 300. The electrode structures ESa may cross over the sub-cell regions and the buffer regions. The filling portion 325f may penetrate each of the electrode structures ESa in the buffer region. Thus, the stacked electrodes GSE, CE, and SSE in each of the electrode structures ESa may include connection portions GSEe, CEe, and SSEe being disposed in the buffer region, respectively.

The ground selection electrode GSE may include a pair of connection portions GSEe passing both sides of the filling portion 325f. The connection portions of the ground selection electrode GSE may connect portions of the ground selection electrode GSE, which are respectively disposed in the sub-cell regions at both sides of the buffer region, to each other. Similarly, each of the cell electrodes CE may include a pair of connection portions CEe passing both sides of the filling portions 325f. The connection portions CEe of each of the cell electrodes CE may connect portions of each of the cell electrodes CE, which are respectively disposed in the sub-cell regions at both sides of the buffer region, to each other. The string selection electrode SSE may include a connection portion SSEe passing a side of the filling portion 325f. The connection portion SSEe of the string selection electrode SSE may connect portions of the string selection electrode SSE, which are respectively disposed in the sub-cell regions at both sides of the buffer region, to each other.

As a result, even though the buffer hole 320 penetrating the electrode structure ESa in the buffer region is defined, the electrodes GSE, CE, and SSE in each of the electrode structures ESa may be continuously disposed on the sub-cell regions and the buffer regions by the connection portions GSEe, CE, and SSEe without cutting.

Components of the first, second, and third embodiments described above may be combined in various forms under a non-contradictable condition.

The three-dimensional semiconductor memory devices described above may be encapsulated using various packaging techniques. For example, the three-dimensional semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

According to the method of fabricating the three-dimensional semiconductor memory device described above, since the cutting region is formed, it is possible to minimize a stress applied to the vertical active patterns by the mold layer. Thus, the three-dimensional semiconductor memory device with improved reliability and high integration may be realized.

While the inventive concept has been described with reference to example embodiments, it will be apparent to those skilled in the art that various changes and modifications may be made without departing from the spirit and scope of the inventive concept. Therefore; it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A three-dimensional semiconductor memory device, comprising:
   an electrode structure extending in a first direction and including electrodes and insulating patterns which are alternately and repeatedly stacked on a substrate, at least an uppermost electrode of the electrodes being divided into a plurality of physically isolated segments arranged in the first direction;
   vertical active patterns that penetrate the electrode structure; and
   an electrode-dielectric layer disposed between each of the vertical, active patterns and each of the electrodes,
   wherein the segments of the uppermost electrode are electrically connected to each other.

2. The device of claim 1, wherein a lowermost electrode of the electrodes in the electrode structure is not divided into segments.

3. The device of claim 1, wherein the substrate includes a plurality of sub-cell regions and a buffer region disposed between the sub-cell regions, and the electrode structure crosses over the sub-cell regions and the buffer region;
   wherein the segments of the uppermost electrode are disposed in the sub-cell regions, respectively;
   wherein the segments of the uppermost electrode include extensions extending into the buffer region, respectively; and
   wherein a cutting region is provided in the buffer region between the segments of the uppermost electrode.

4. The device of claim 3, further comprising:
   a capping dielectric pattern in the cutting region, wherein the capping dielectric pattern provides the physical isolation between the segments of the uppermost electrode.

5. The device of claim 3, wherein the uppermost electrode comprises a string selection electrode;
   wherein the electrodes include cell electrodes which are stacked and are disposed under the string selection electrode;
   wherein at least uppermost cell electrode of the cell electrodes is divided into a plurality of segments arranged in the one direction; and
   wherein the cutting region extends downwardly between the segments of the uppermost cell electrode.

6. The device of claim 5, wherein the cutting region includes an inner sidewall having a stepped shape.

7. The device of claim 5, further comprising:
   a string-join interconnection disposed in the buffer region and electrically connecting the segments of the string selection electrode to each other; and
   a floor-join interconnection disposed in the buffer region and electrically connecting the segments of the uppermost cell electrode to each other.

8. The device of claim 7, wherein each of a plurality of cell electrodes is divided into physically isolated segments arranged in the one direction;
   wherein the floor-join interconnection comprises a plurality of floor-join interconnections, a number of the floor-join interconnections corresponding to a number of the divided cell electrodes; and
   wherein the plurality of the floor-join interconnections are disposed on the electrode structure and are respectively disposed different levels from each other with respect to a top surface of the substrate.

9. The device of claim 7, wherein the electrode structure is provided in a plural number to extend in parallel to each other;
   wherein each of a plurality of cell electrodes that is stacked in each of the electrode structures is divided into segments arranged in the first direction;
   wherein the floor-join interconnection comprises a plurality of floor-join interconnections disposed on the electrode structures, respectively;
   wherein each of the floor-join interconnections electrically connects segments of one of the divided cell electrodes in the electrode structure under each of the floor interconnections to each other; and
   wherein the segments connected to one of the floor-join interconnections are disposed at a different level from the segments connected to others of the floor-join interconnections.

10. The device of claim 9, wherein the substrate further includes a first edge region and a second edge region, and the sub-cell regions and the buffer region are disposed between the first edge region and the second edge region;
    wherein the cell electrodes being stacked in each of the electrode structures include first electrode pads having a stepped structure and being disposed in the first edge region, and second electrode pads having a stepped structure and being disposed in the second edge region;
    wherein the first electrode pads of the cell electrodes, which are respectively included in the plurality of the electrode structures and are disposed at the same level, are electrically connected to each other; and
    wherein the second electrode pads of the cell electrodes, which are respectively included in the plurality of the electrode structures and are disposed at the same level, are electrically connected to each other.

11. A three-dimensional semiconductor memory device, comprising:
    a substrate;
    an electrode structure on the substrate, the electrode structure extending in a horizontal direction and including a plurality of electrode layers and a plurality of insulating pattern layers that are stacked in an alternating manner on the substrate in a vertical direction, wherein at least an uppermost electrode layer of the electrode structure is divided into first and second horizontal segments arranged in the horizontal direction, wherein at least a lowermost electrode layer of the electrode structure extends from a region below the first horizontal segment toward another region below the second horizontal segment;

a plurality of vertical active patterns that extend through the electrode structure in the vertical direction; and a plurality of dielectric layers between the vertical active patterns and respective ones of the electrode layers;

wherein the first and second horizontal segments of the uppermost electrode are electrically connected to each other.

12. The device of claim 1, wherein the vertical active patterns include a first vertical active pattern that penetrates a first one of the plurality of physically isolated segments of the uppermost electrode and a second vertical active pattern that penetrates a second one of the plurality of physically isolated segments of the uppermost electrode.

13. The device of claim 11, wherein the plurality of vertical active patterns includes a first vertical active pattern that penetrates the first horizontal segment of the uppermost electrode and a second vertical active pattern that penetrates the second horizontal segment of the uppermost electrode.

14. A three-dimensional semiconductor memory device, comprising:

a substrate;

an electrode structure on the substrate, the electrode structure including a plurality of electrode layers and a plurality of insulating pattern layers that are stacked in an alternating manner on the substrate in a vertical direction, wherein at least an uppermost electrode layer of the electrode structure is divided into first and second horizontal segments and wherein a lowermost electrode layer is not divided into horizontal segments;

a plurality of vertical active patterns that extend through the electrode structure in the vertical direction including a first vertical active pattern that penetrates the first horizontal segment of the uppermost electrode and a second vertical active pattern that penetrates the second horizontal segment of the uppermost electrode;

a plurality of dielectric layers separating the vertical active patterns and respective ones of the electrode layers; and a plurality of bit lines coupled to respective ones of the plurality of vertical active patterns;

wherein the first and second horizontal segments of the uppermost electrode are electrically connected to each other.

15. The device of claim 1, further comprising bit lines extending in a second direction intersecting the first direction and arranged in the first direction, wherein each of the vertical active patterns penetrates one of the plurality of physically isolated segments and is connected to one of the bit lines.

* * * * *